US012211930B2

(12) United States Patent
Chen et al.

(10) Patent No.: US 12,211,930 B2
(45) Date of Patent: Jan. 28, 2025

(54) SEMICONDUCTOR DEVICE

(71) Applicant: TAIWAN SEMICONDUCTOR MANUFACTURING CO., LTD., Hsinchu (TW)

(72) Inventors: Tse-An Chen, Taoyuan (TW); Lain-Jong Li, Hsinchu (TW); Wen-Hao Chang, Hsinchu (TW); Chien-Chih Tseng, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 156 days.

(21) Appl. No.: 17/403,347

(22) Filed: Aug. 16, 2021

(65) Prior Publication Data
US 2021/0376134 A1 Dec. 2, 2021

Related U.S. Application Data

(62) Division of application No. 16/389,659, filed on Apr. 19, 2019, now Pat. No. 11,094,811.

(51) Int. Cl.
| H01L 29/76 | (2006.01) |
| H01L 21/02 | (2006.01) |
| H01L 21/78 | (2006.01) |
| H01L 27/12 | (2006.01) |
| H01L 29/24 | (2006.01) |
| H01L 29/66 | (2006.01) |

(52) U.S. Cl.
CPC .... H01L 29/7606 (2013.01); H01L 21/02458 (2013.01); H01L 21/02488 (2013.01); H01L 21/7806 (2013.01); H01L 27/1266 (2013.01); H01L 29/24 (2013.01); H01L 29/66969 (2013.01)

(58) Field of Classification Search
CPC ......... H01L 29/66969; H01L 29/78681; H01L 29/778; H01L 29/7606; H01L 29/7838
See application file for complete search history.

(56) References Cited

U.S. PATENT DOCUMENTS

| 4,307,411 A | * | 12/1981 | Carnes | H01L 29/792 257/326 |
| 4,505,024 A | * | 3/1985 | Kawate | H01L 29/78 257/E21.583 |
| 4,605,946 A | * | 8/1986 | Robinson, Jr. | H01J 49/28 250/370.06 |
| 5,254,490 A | * | 10/1993 | Kondo | H01L 29/6659 438/297 |
| 5,408,116 A | * | 4/1995 | Tanaka | H01L 29/78 257/306 |
| 5,739,541 A | * | 4/1998 | Kahilainen | G01T 1/26 250/374 |
| 8,802,504 B1 | | 8/2014 | Hou et al. | |

(Continued)

*Primary Examiner* — Vincent Wall
(74) *Attorney, Agent, or Firm* — Maschoff Brennan

(57) ABSTRACT

A semiconductor device includes a substrate, a channel layer, an insulating layer, source/drain contacts, a gate dielectric layer, and a gate electrode. The channel layer over the substrate and includes two dimensional (2D) material. The insulating layer is on the channel layer. The source/drain contacts are over the channel layer. The gate dielectric layer is over the insulating layer and the channel layer. The gate electrode is over the gate dielectric layer and between the source/drain contacts.

20 Claims, 51 Drawing Sheets

(56) References Cited

U.S. PATENT DOCUMENTS

| | | |
|---|---|---|
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 9,608,101 B2 * | 3/2017 | Kis ............... H01L 29/6684 |
| 9,660,100 B2 * | 5/2017 | Okazaki ......... H01L 29/7869 |
| 10,026,751 B2 * | 7/2018 | Rakshit ............ H01L 29/45 |
| 2007/0045628 A1 * | 3/2007 | Kim ............... H01L 29/42384 |
| | | 257/66 |
| 2013/0207080 A1 * | 8/2013 | Dimitrakopoulos ................ |
| | | H01L 21/02661 |
| | | 257/E21.409 |
| 2014/0197459 A1 * | 7/2014 | Kis ............... H01L 29/40111 |
| | | 257/194 |
| 2015/0061019 A1 | 3/2015 | Rudin et al. |
| 2015/0108431 A1 * | 4/2015 | Kim ............... H01L 31/0324 |
| | | 257/21 |
| 2015/0109606 A1 * | 4/2015 | Peale ............... H01L 31/02327 |
| | | 250/206 |
| 2015/0122315 A1 | 5/2015 | Shin et al. |
| 2015/0221678 A1 * | 8/2015 | Yamazaki ......... H01L 29/78603 |
| | | 257/43 |
| 2015/0279747 A1 * | 10/2015 | Kondo ............. H01L 21/76897 |
| | | 438/606 |
| 2016/0049384 A1 | 2/2016 | Lu et al. |
| 2017/0073809 A1 * | 3/2017 | Choi ............... C23C 14/0021 |
| 2017/0194248 A1 | 7/2017 | Das |
| 2017/0294462 A1 | 10/2017 | Yamazaki et al. |
| 2017/0345944 A1 * | 11/2017 | Lin ............... H01L 29/267 |
| 2018/0151751 A1 * | 5/2018 | Yeh ............... H01L 29/1606 |
| 2018/0226248 A1 * | 8/2018 | Jahangir ......... H01L 29/66742 |
| 2020/0091274 A1 * | 3/2020 | Sharma ............ H01L 29/4908 |
| 2020/0098880 A1 * | 3/2020 | Sharma ............ H10B 12/30 |
| 2023/0123274 A1 * | 4/2023 | Song ............... H01L 29/0665 |
| | | 257/29 |

\* cited by examiner

M80

M100

M120

M160

SEMICONDUCTOR DEVICE

PRIORITY CLAIM AND CROSS-REFERENCE

This application is a Divisional application of the U.S. application Ser. No. 16/389,659, filed on Apr. 19, 2019, now U.S. Pat. No. 11,094,811, issued Aug. 17, 2021, which is herein incorporated by reference.

BACKGROUND

Integrated circuits may be formed from a variety of active and passive devices on a semiconductor substrate. These active and passive devices may include, for example, transistors, resistors, capacitors, inductors, or the like. Additionally, the integrated circuits may also have a plurality of interleaved conductive layers and insulating layers in order to interconnect the various active and passive devices into the desired functional circuitry. This functional circuitry may be connected to external devices using, for example, contact pads or other types of connection to provide power, ground and signal connections to the various active and passive devices.

In the race to further miniaturize the integrated circuits, and in particular to further miniaturize the active and passive devices within the integrated circuits, problems have arisen with the various materials that have historically been used to form the active and passive devices. As such, new fabrication processes are investigated as potential replacement processes for various aspects of the active and passive devices in an effort to make the active and passive devices not only smaller and more efficient.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
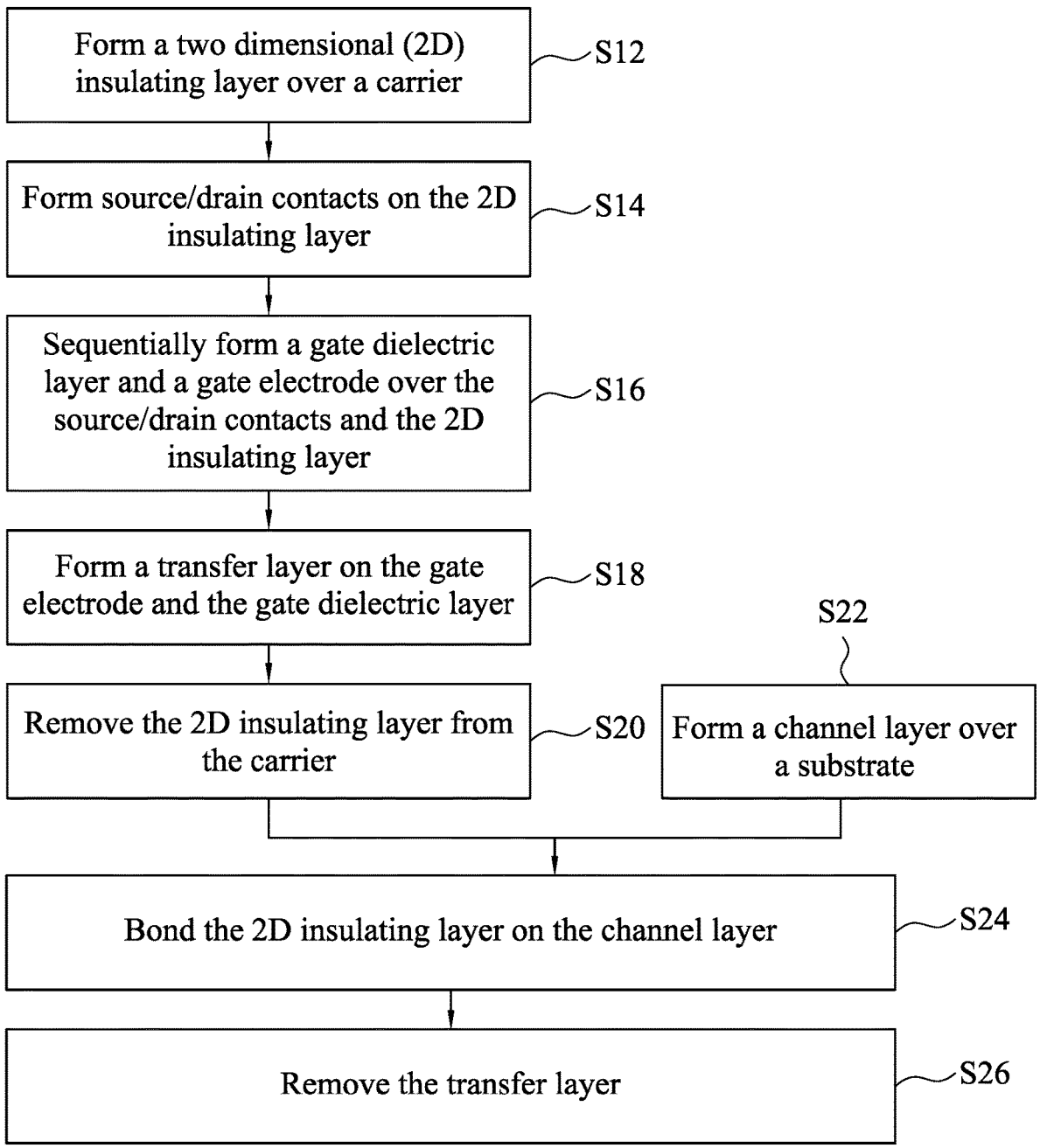
FIG. 1 is a flowchart of a method for making a semiconductor device according to aspects of the present disclosure in various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

This disclosure relates to integrated device fabrications and more specifically to integrated circuit devices by using a two dimensional insulating layer as a bonding layer. Because of the two dimensional insulating layer, an integrated circuit device with good performance channels can be formed. Furthermore, the separated fabrications of the source/drain contacts and the channel layer prevent the channel layer from being damaged, improving the performance of the resulting semiconductor device.

Figure 2A:
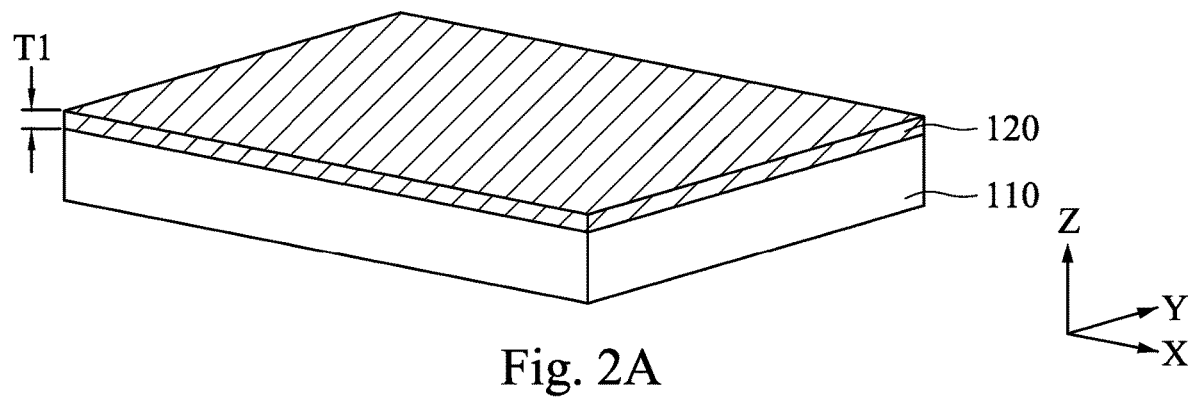
FIGS. 2A-2H illustrate cross-sectional view of a semiconductor device at various stages of the method of FIG. 1 in accordance with some embodiments of the present disclosure.

FIG. 1 is a flowchart of a method M10 for making a semiconductor device according to aspects of the present disclosure in various embodiments. Various operations of the method M10 are discussed in association with perspective diagrams FIGS. 2A-2H. Throughout the various views and illustrative embodiments, like reference numbers are used to designate like elements. In operation S12 of method M10, a two dimensional (2D) insulating layer 120 is formed over a carrier 110, as shown in FIG. 2A. The carrier 110 may function to provide mechanical and/or structure support for features or structures of the semiconductor device. The carrier 110 may be a semiconductor substrate. For example, the carrier 110 may include sapphire (e.g. crystalline $Al_2O_3$), e.g. a large grain or a single crystalline layer of sapphire or a coating of sapphire. As another example, the carrier 110 may be a sapphire substrate, e.g. a transparent sapphire substrate including, as an example, $\alpha$-$Al_2O_3$. As yet another example, the carrier 110 may include an elementary semiconductor (e.g. including silicon and/or germanium in crystal), a compound semiconductor (e.g. including at least one of oxide, silicon nitride, silicon carbide, gallium arsenic, gallium phosphide, indium phosphide, indium arsenide, or indium antimonide), an alloy semiconductor (e.g. including at least one of Cu, Al, AlCu, W, Ti, SiGe, GaAsP, AlInAs, AlGaAs, GaInAs, GaInP, or GaInAsP), or combinations thereof.

The 2D insulating layer 120 is formed on the carrier 110. The 2D insulating layer 120 may be formed directly on the carrier 110 such that the 2D insulating layer 120 and the carrier 110 are in contact (e.g. physical contact) with each other. In some embodiments, the 2D insulating layer 120 may be mechanically transferred and placed over the carrier 110, and the 2D insulating layer 120 is adhered to the carrier 110 through Van der Waals force. The 2D insulating layer 120 is configured to be a bonding layer to bond a structure formed thereon to another semiconductor structure (the channel layer 190 of FIG. 2F in this case).

It is noted that the term of "insulating" in the 2D insulating layer 120 represents the electrically insulation in a lateral direction (i.e., in the x direction and in the y direction) but not represents the electrically insulation in a vertical direction (i.e., in the z direction). That is, the 2D insulating layer 120 is electrically insulating in the lateral direction since it has large energy band gap, but may be electrically conductive (through electron tunneling) in the vertical direction. The energy band gap of the 2D insulating layer 120 may be greater than about 5.5 eV. If the energy ban gap of the 2D insulating layer 120 is lower than about 5.0 eV, the 2D insulating layer 120 may cause a current leakage problem in the channel layer 190 (see FIG. 2F). In some embodiments, the 2D insulating layer 120 is made of hexagonal boron nitride (h-BN), which is a stable crystalline form and has an energy band gap of about 6 eV. The h-BN has a layered structure similar to graphite. Within each layer, boron and nitrogen atoms are bound by strong covalent bonds, whereas the layers are held together by weak Van der Waals forces.

The 2D insulating layer 120 is a 2D material which are crystalline materials consisting of a single layer (monolayer) of atoms. If the 2D material includes few monolayers, the monolayers of the 2D material held together by Van der Waals forces. Monolayers may be stacked upon each other to form the 2D material layer including individual monolayers. For example, individual monolayers of h-BN may be stacked. In some embodiments, the 2D insulating layer 120 may be a monolayer to reduce the whole size of the semiconductor device; in some other embodiments, however, the 2D insulating layer 120 may include few layers. In some embodiments, the 2D insulating layer 120 has a thickness T1 of about 3.0 (including interlayer distance) angstroms to about 50 angstroms. The lower limit (about 3.0 angstroms) is the thickness of monolayer 2D insulating layer 120, and if the thickness T1 is greater than about 50 angstroms, the electrical conductivity of the 2D insulating layer 120 in the vertical direction (which will be described in detail in FIG. 2H) is suppressed.

Figure 2B:
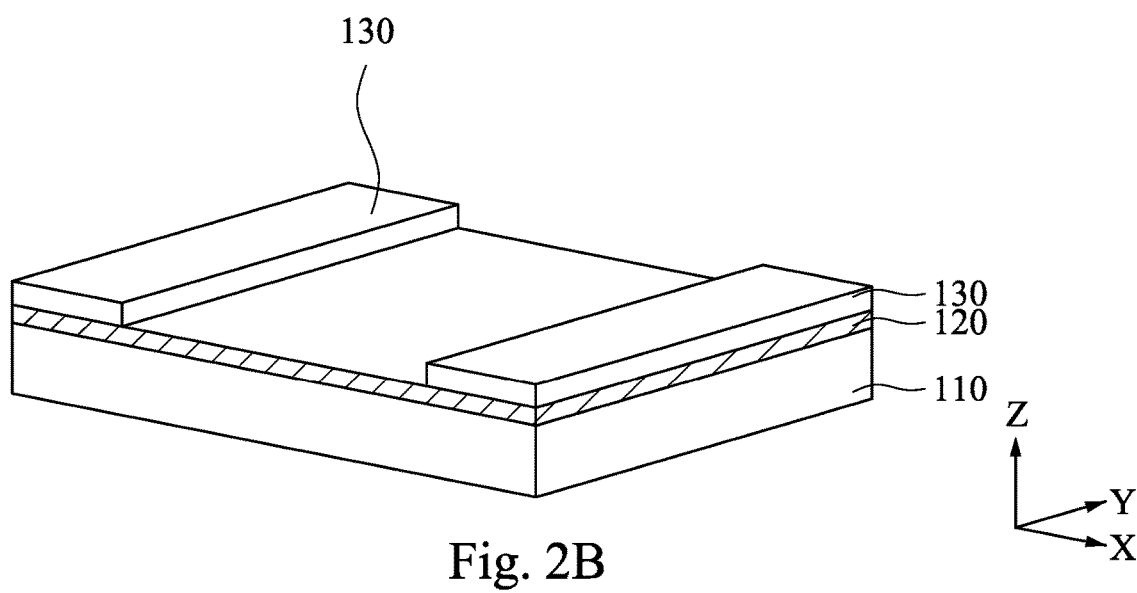

In operation S14 of method M10, source/drain contacts 130 are formed on the 2D insulating layer 120, as shown in FIG. 2B. The source/drain contacts 130 may be formed directly on the 2D insulating layer 120 such that the source/drain contacts 130 and the 2D insulating layer 120 are in contact (e.g. physical contact) with each other. In some embodiments, the source/drain contacts 130 may be formed of a conductive material such as nickel, platinum, palladium, combinations of these, or the like. In some embodiments, a blanket conductive layer may be formed on the 2D insulating layer 120 in advance by a deposition process such as CVD, PVD, ALD, combinations of these, or the like, and then a patterning process is performed to pattern the blanket conductive layer to form the source/drain contacts 130 separated from each other.

Figure 2C:
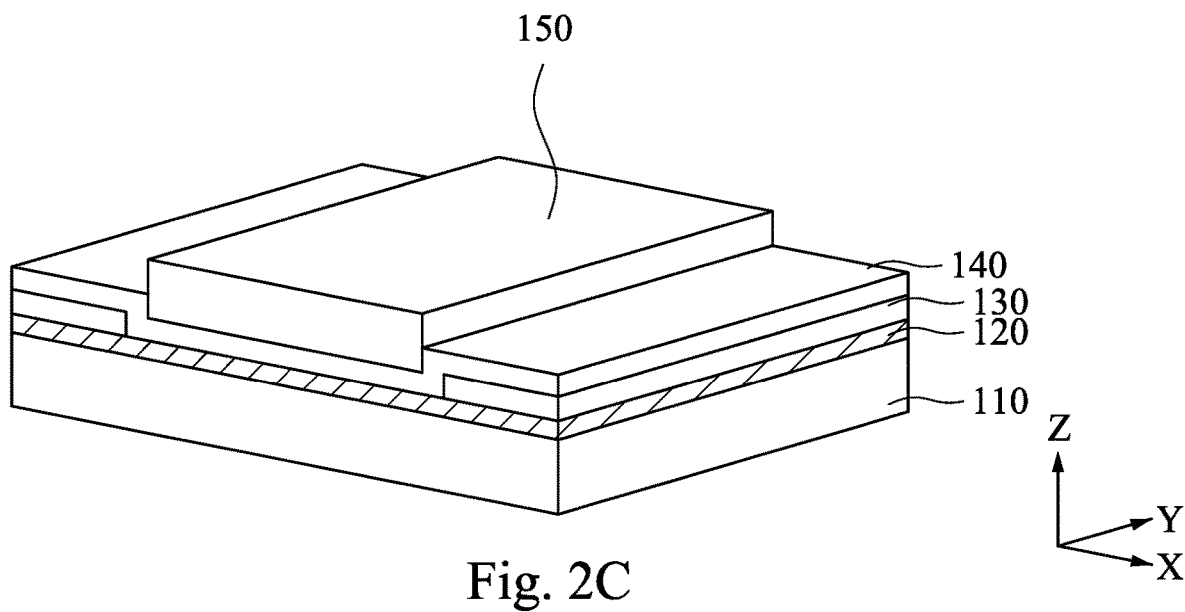

In operation S16 of method M10, a gate dielectric layer 140 and a gate electrode 150 are sequentially formed over the source/drain contacts 130 and the 2D insulating layer 120, as shown in FIG. 2C. In some embodiments, the gate dielectric layer 140 is conformally deposited on the source/drain contacts 130 and the 2D insulating layer 120. In some examples, the gate dielectric layer 140 includes silicon oxide, silicon nitride, gallium oxide, aluminum oxide, scandium oxide, zirconium oxide, lanthanum oxide, hafnium oxide, or other suitable materials. In some embodiments, the gate dielectric layer 140 is formed by an atomic layer deposition (ALD) method. In some other embodiments, the gate dielectric layer 140 is formed by a plasma enhanced chemical vapor deposition (PECVD) or a low pressure chemical vapor deposition (LPCVD).

The gate electrode 150 is formed on the gate dielectric layer 140. Lithography and etching processes are performed on a blanket conductive layer to define the gate electrode 150. In some embodiments, the blanket conductive layer may be formed on the gate dielectric layer 140 in advance by a deposition process such as CVD, PVD, ALD, combinations thereof, or the like, and then a patterning process is performed to pattern the blanket conductive layer to form the gate electrode 150 between the source/drain contacts 130. In some embodiments, the gate electrode 150 includes a conductive material layer that includes a refractory metal or its compounds, e.g., titanium (Ti), titanium nitride (TiN), titanium tungsten (TiW), tungsten (W), or other suitable materials. In some other embodiments, the gate electrode 150 includes nickel (Ni), gold (Au) or copper (Cu).

Figure 2D:
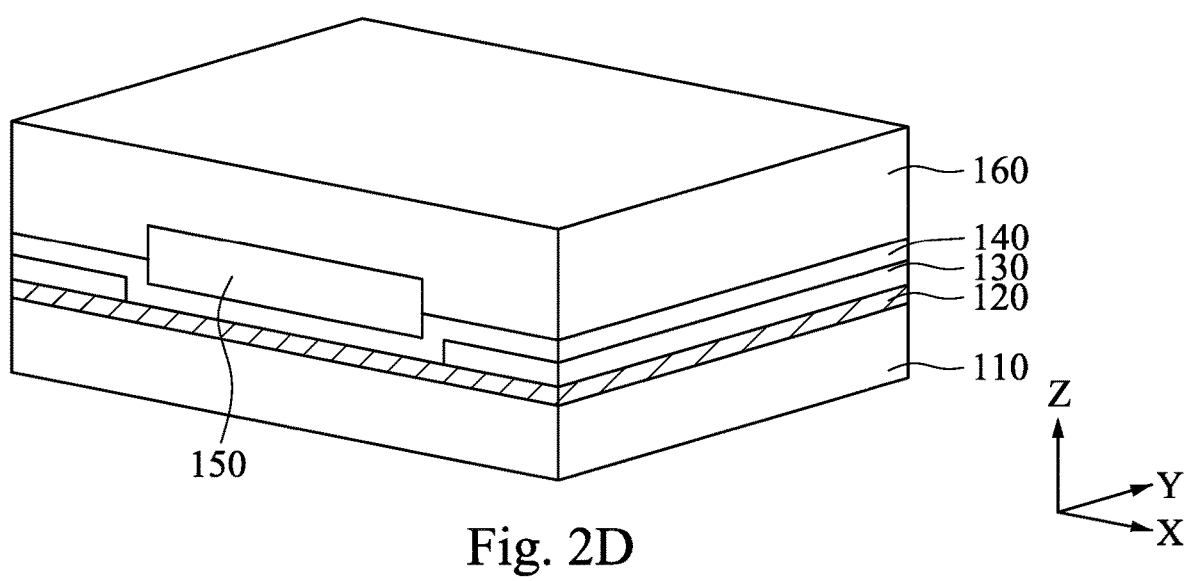

In operation S18 of method M10, as shown in FIG. 2D, a transfer layer 160 is formed on the gate electrode 150 and the gate dielectric layer 140 in order to begin the process of transferring the gate electrode 150, the source/drain contacts 130, and the 2D insulating layer 120 to a substrate 170 (not illustrated in FIG. 2D but illustrated and discussed further below with respect to FIG. 2G). In some embodiments, the transfer layer 160 may be a material that may be used to hold and protect the elements underneath during the removal of the carrier 110 from the 2D insulating layer 120, while also allowing for an easy removal of the transfer layer 160 once the structures underneath has been transferred. For example, the transfer layer 160 may be polymer material such as polymethyl-methacrylate (PMMA), methyacrylic resin, or Novolac resin, or the like. In some other embodiments, the transfer layer 160 may be a dielectric layer such as an oxide layer or a nitride layer, or the like.

In some embodiments in which the transfer layer 160 is polymer material, the transfer layer 160 may be placed on the gate electrode 150 using, e.g., a spin-coating process, although any other suitable deposition process may also be utilized. Once in place, the polymer material may be cured and solidified. This solidified polymer material both protects the structure underneath and also allows for the movement and control of the 2D insulating layer 120 through the transfer layer 160. In some embodiments in which the transfer layer 160 is dielectric layer, the transfer layer 160 may be deposited on the gate electrodes 150 using, e.g., PVD, CVD, ALD, or other suitable processes.

Figure 2E:
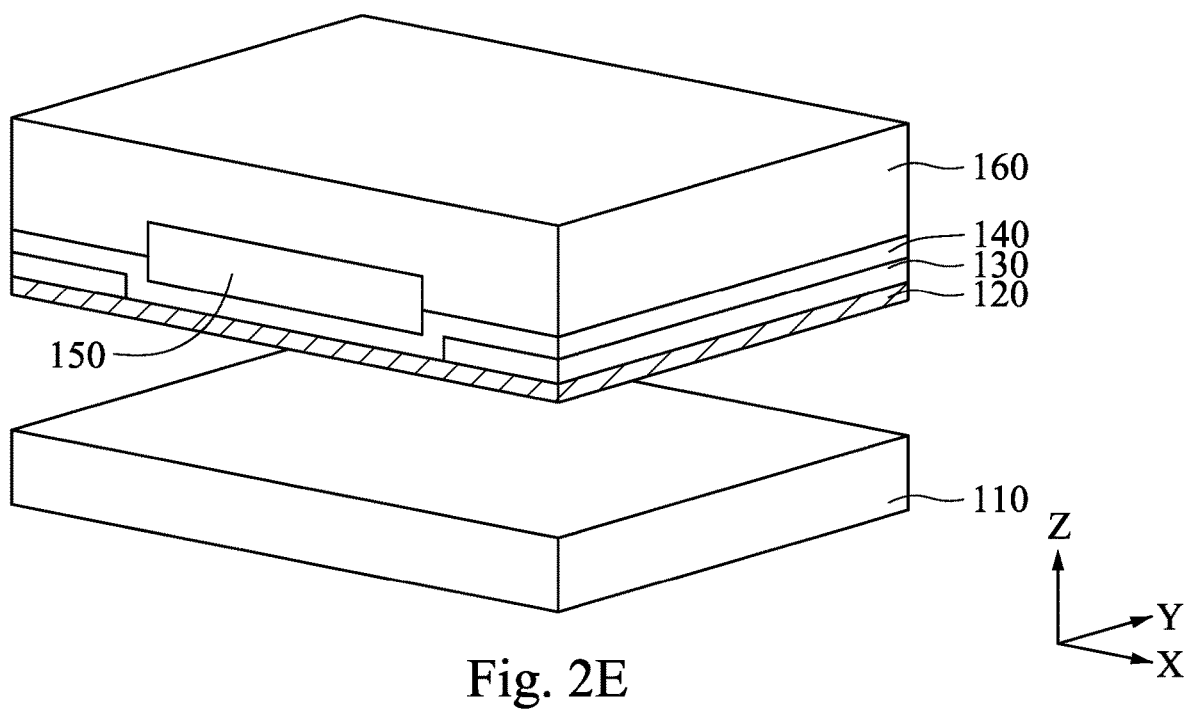

In operation S20 of method M10, the 2D insulating layer 120 is removed from the carrier 110, as shown in FIG. 2E. Specifically, once the transfer layer 160 is in place over the gate electrodes 150 and the gate dielectric layer 140, the carrier 110 may be removed in order to expose a back side of the 2D insulating layer 120. As mentioned above, since the 2D insulating layer 120 is adhered to the carrier 110 through Van der Waals force, the delamination force of the 2D insulating layer 120 is not so strong, such that the structures formed over the 2D insulating layer 120 is not easy to be damaged.

Figure 2F:
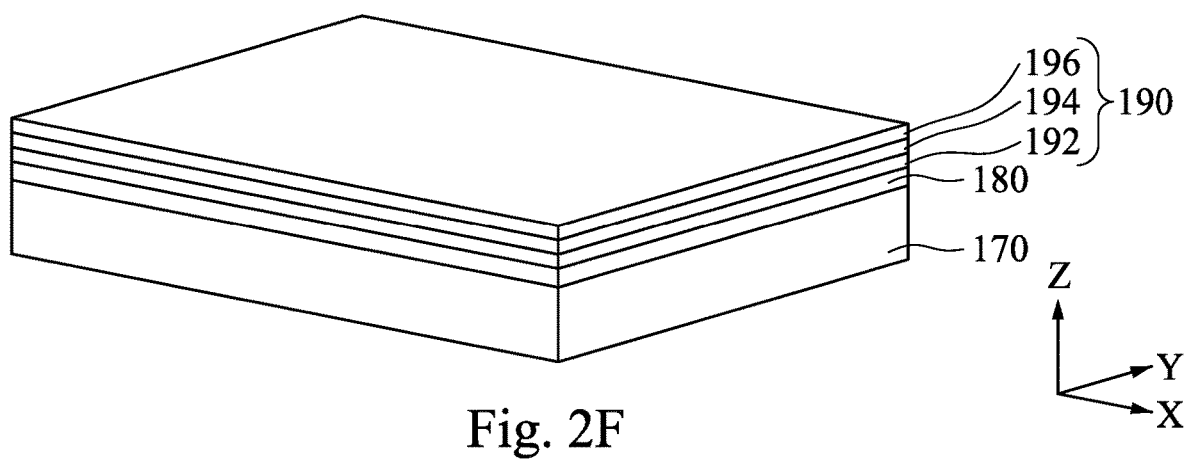

FIG. 2F illustrates a substrate 170 onto which the structure in FIG. 2E may be transferred (the transfer is not illustrated in FIG. 2F but is illustrated and discussed below with respect to FIG. 2G). In operation S22 of method M10, a channel layer 190 is formed over a substrate 170, as shown in FIG. 2F. The substrate 170 may be a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. The substrate 170 may be doped with a p-type dopant, such as boron, aluminum, gallium, or the like, although the substrate may alternatively be doped with an n-type dopant, as is known in the art. In some embodiments, the substrate 170 may be made of a conductive material, which may be a back gate of the resulting semiconductor device (see FIG. 2H).

A buffer layer 180 may be optionally formed on the substrate 170. The buffer layer 180 may be formed directly on the substrate 170 such that the buffer layer 180 and the substrate 170 are in contact (e.g. physical contact) with each other. In some embodiments, the buffer layer 180 may be made of boron nitride (BN), e.g., hexagonal boron nitride (h-BN) which may be mechanically transferred and placed over the substrate 170. In some embodiments, the buffer layer 180 may be a monolayer to reduce the whole size of the semiconductor device; in some other embodiments, however, the buffer layer 180 may include few layers. Since the h-BN has a flat top surface, the channel layer 190 formed thereon is flat. The flat channel layer 190 could reduce the electron scattering effect therein and make carrier mobility higher.

The channel layer 190 is then formed over the substrate 170. In some embodiments, when the buffer layer 180 is formed on the substrate 170, the channel layer 190 is formed directly on the buffer layer 180 such that the channel layer 190 and the buffer layer 180 are in contact (e.g. physical contact) with each other. In some other embodiments, when the buffer layer 180 is omitted, the channel layer 190 is formed directly on the substrate 170 such that the channel layer 190 and the substrate 170 are in contact (e.g. physical contact) with each other.

The channel layer 190 may be made of transition metal dichalcogenide (TMD) materials which include a class of materials that have the general chemical formula of $MX_2$, wherein M is a transition metal element, and X is a chalcogen. The exemplary materials of the transition metal M include Ti, V, Co, Ni, Zr, Mo, Tc, Rh, Pd, Hf, Ta, W, Re, Ir, In, Sn, or Pt. Element X may be S, Se, or Te. Exemplary TMD materials include $MoS_2$, $MoSe_2$, $WS_2$, $WSe_2$, $MoTe_2$, and $WTe_2$ in accordance with some exemplary embodiments. TMDs form a layered structure with the form X-M-X, wherein the chalcogen atoms X are distributed in two hexagonal planes separated by a plane of metal atoms M. Stated in another way, the channel layer 190 includes a first layer 192, a second layer 194 over the first layer 192, and a third layer 196 over the second layer 194. The first layer 192 and the third layer 196 include the chalcogen atoms X, and the second layer 194 includes the transition metal M. In some embodiments, the first layer 192, the second layer 194, and the third layer 196 are monolayers.

Figure 2G:
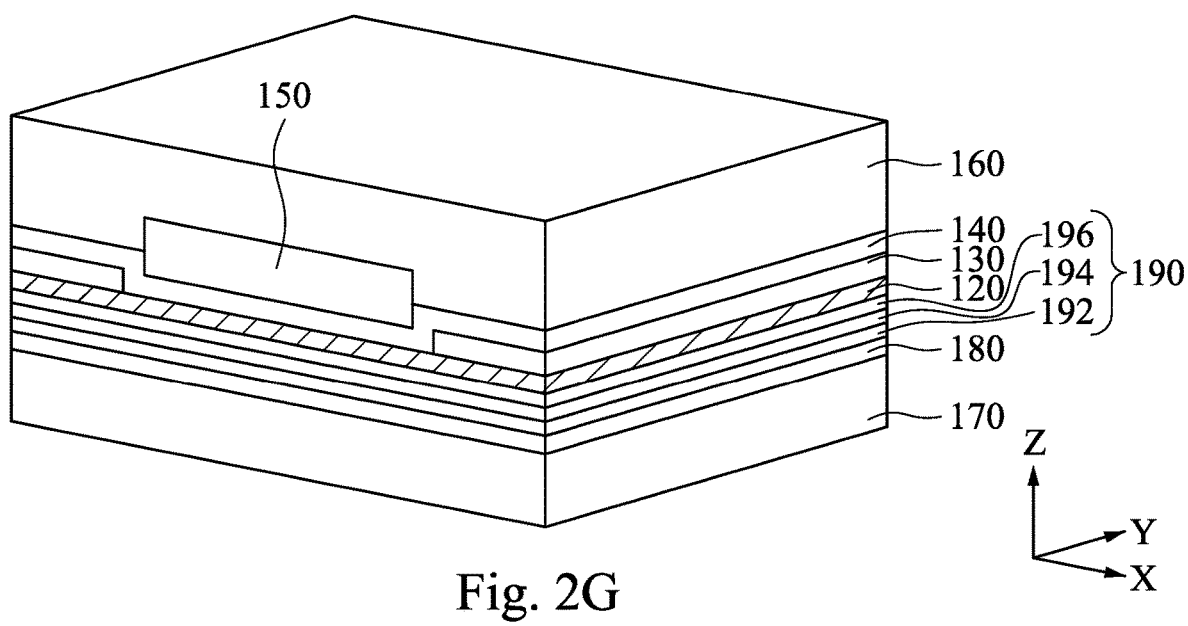

In operation S24 of method M10, the 2D insulating layer 120 is bonded on the channel layer 190, as shown in FIG. 2G. In some embodiment, a heating process is performed to bond the 2D insulating layer 120 on the channel layer 190 at a temperature lower than about 300° C., e.g., about 60° C. to about 200° C. If the temperature is lower than about 60° C., the 2D insulating layer 120 may not be bond on the channel layer 190 successfully; if the temperature is higher than about 300° C., the channel layer 190 may suffer unwanted damage. In some embodiments, the heating process is performed in a vacuum-environment, and a vacuum process may be added before the heating process. The vacuum environment helps reduce the heating temperature of the heating process, preventing the channel layer 190 from being damaged.

Figure 2H:
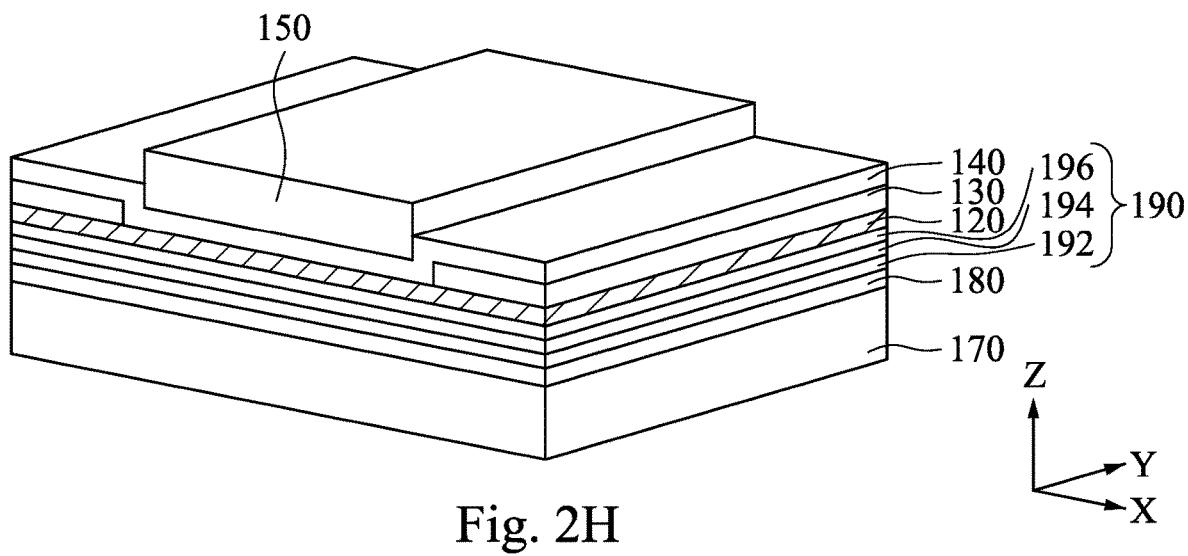

In operation S26 of method M10, the transfer layer 160 (see FIG. 2G) is removed, as shown in FIG. 2H. The transfer layer 160 may be removed using a stripping or etching process to remove the material of the transfer layer 160 form the gate electrode 150 and the gate dielectric layer 140. In some embodiments, the transfer layer 160 may be removed by applying acetone to the polymer if the transfer layer 160 is made of polymers such as PMMA. In some other embodiments, the transfer layer 160 may be removed by applying HCl, HNO$_3$, and/or liquid state FeCl$_3$ to the transfer layer 160 if the transfer layer 160 is made of metal such as Ni, Au, Cu, or other suitable materials.

In FIG. 2H, the semiconductor device includes the substrate 170, the channel layer 190, the 2D insulating layer 120, the source/drain contacts 130, the gate dielectric layer 140, and the gate electrode 150. The channel layer 190 is formed over the substrate 170. The 2D insulating layer 120 is formed over the channel layer 190. The source/drain contacts 130 are formed over the 2D insulating layer 120 and separated from the channel layer 190. That is, the 2D insulating layer 120 is formed between the source/drain contact 130 and the channel layer 190. The gate dielectric layer 140 is formed over the 2D insulating layer 120 and the source/drain contacts 130. The gate electrode 150 is formed over the gate dielectric layer 140 and between the source/drain contacts 130.

In FIG. 2H, the 2D insulating layer 120 is a good insulator in the lateral direction, such that the 2D insulating layer 120 provides good insulation between the two source/drain contacts 130. Also, the 2D insulating layer 120 is a good conductor in the vertical direction (through electron tunneling), so the 2D insulating layer 120 interconnects the source/drain contact 130 and the channel layer 190. With this configuration, the electrons can flow from one of the source/drain contacts 130 to another one of the source/drain contacts 130 through the channel layer 190 but not through the 2D insulating layer 120 in the lateral direction. Moreover, the channel layer 190 may be a 2D material which has electrical conductivity in the lateral direction. That is, the channel layer 190 has a lateral electrical conductivity higher than the 2D insulating layer 120 (and the buffer layer 180).

In some embodiments, the buffer layer 180 is formed between the channel layer 190 and the substrate 170. As such, the channel layer 190 is formed between the buffer layer 180 and the 2D insulating layer 120. The buffer layer 180 provides a flat interface for depositing the channel layer 190, and the 2D insulating layer 120 also provides another flat interface for the channel layer 190. Therefore, the channel layer 190 reduces the electron scattering effect therein and makes carrier mobility higher. Furthermore, the buffer layer 180 is also a good insulator in the lateral direction if the buffer layer 180 is made of h-BN. That is, the buffer layer 180 and the 2D insulating layer 120 both improve the current leakage problem in the channel layer 190.

As mentioned above, the formation of the source/drain contacts 130 may include depositing a blanket conductive layer and then performing the blanket conductive layer to form the source/drain contacts 130. The depositing of the blanket conductive layer may be a high temperature process, and the patterning of the blanket conductive layer may include a wet etching process. The high temperature process may worse the channel layer 190 and the wet etching process may induce the channel layer 190 stripped if the blanket conductive layer is formed on the channel layer 190. In the embodiments of the method M10, the blanket conductive layer and the channel layer 190 are separately formed, the high temperature during the depositing process of the blanket conductive layer does not affect the channel layer 190, and the etchants using in patterning the blanket conductive layer does not strip the channel layer 190. Also, since the blanket conductive layer is directly formed on the 2D insulating layer 120, instead of directly formed on the channel layer 190, the metal pinning on the channel layer 190 can be avoided, and the contact resistant can be improved. As such, the channel layer 190 in FIG. 2H has a good device performance.

Figure 3:
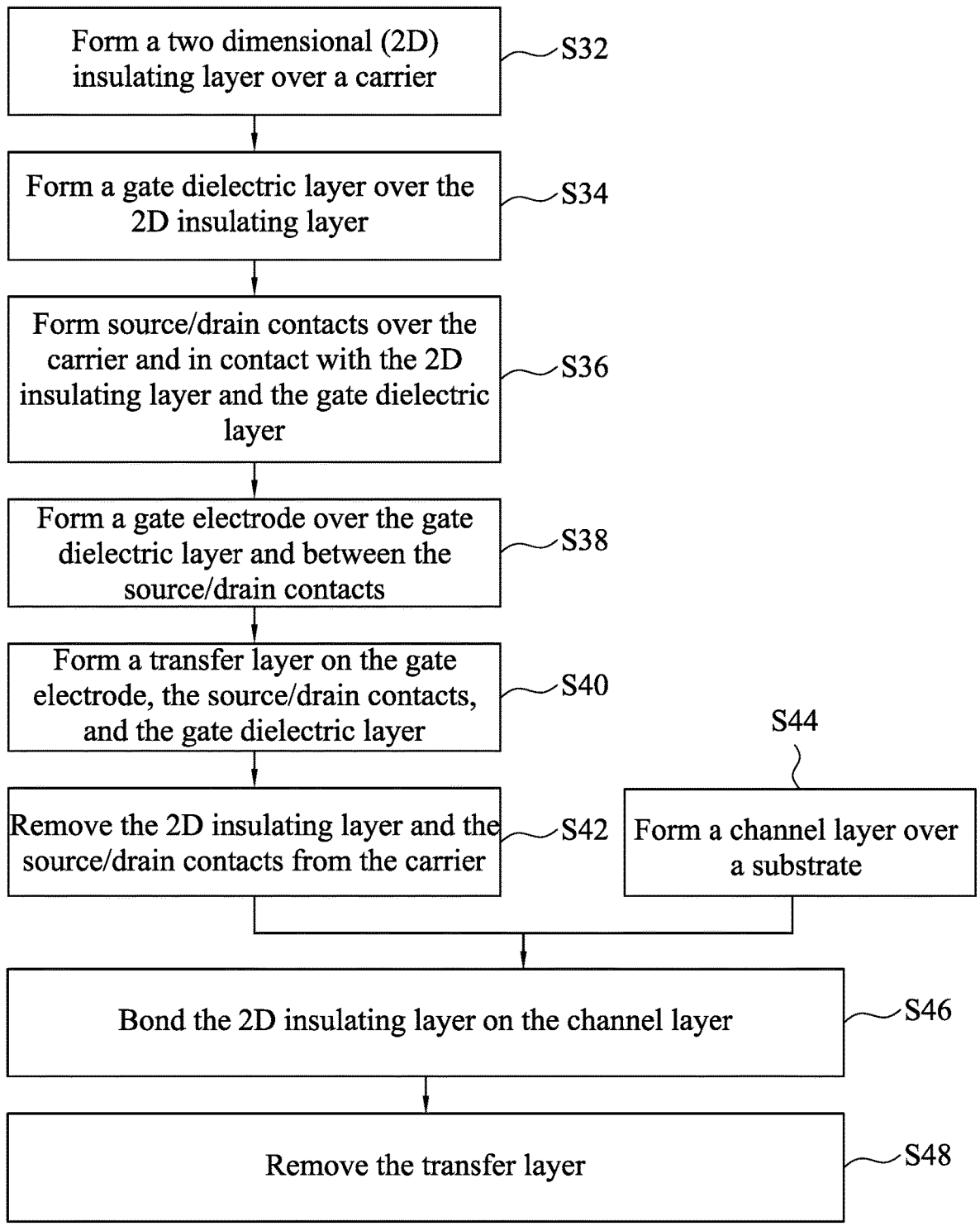
FIG. 3 is a flowchart of a method for making a semiconductor device according to aspects of the present disclosure in various embodiments.
Figure 4A:
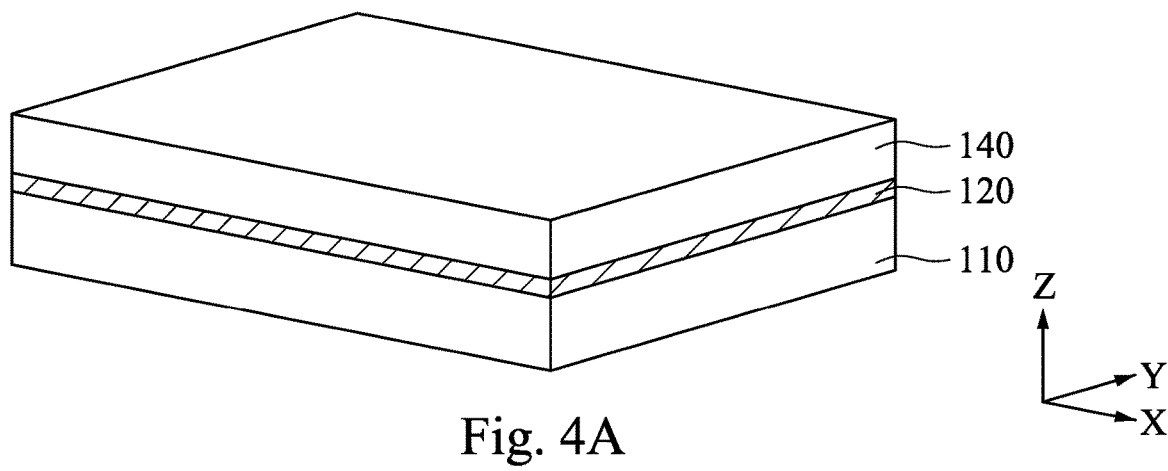
FIGS. 4A-4H illustrate cross-sectional view of a semiconductor device at various stages of the method of FIG. 3 in accordance with some embodiments of the present disclosure.

FIG. 3 is a flowchart of a method M30 for making a semiconductor device according to aspects of the present disclosure in various embodiments. Various operations of the method M30 are discussed in association with perspective diagrams FIGS. 4A-4H. Throughout the various views and illustrative embodiments, like reference numbers are used to designate like elements. The present embodiment may repeat reference numerals and/or letters used in FIGS. 2A-2H. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 4A-4H. In operation S32 of method M30, a 2D insulating layer 120 is formed over a carrier 110, as shown in FIG. 4A. In operation S34 of method M30, a gate dielectric layer 140 is formed over the 2D insulating layer 120, as shown in FIG. 4A. The gate dielectric layer 140 may be formed directly on the 2D insulating layer 120 such that the gate dielectric layer 140 and the 2D insulating layer 120 are in contact (e.g. physical contact) with each other.

Figure 4B:
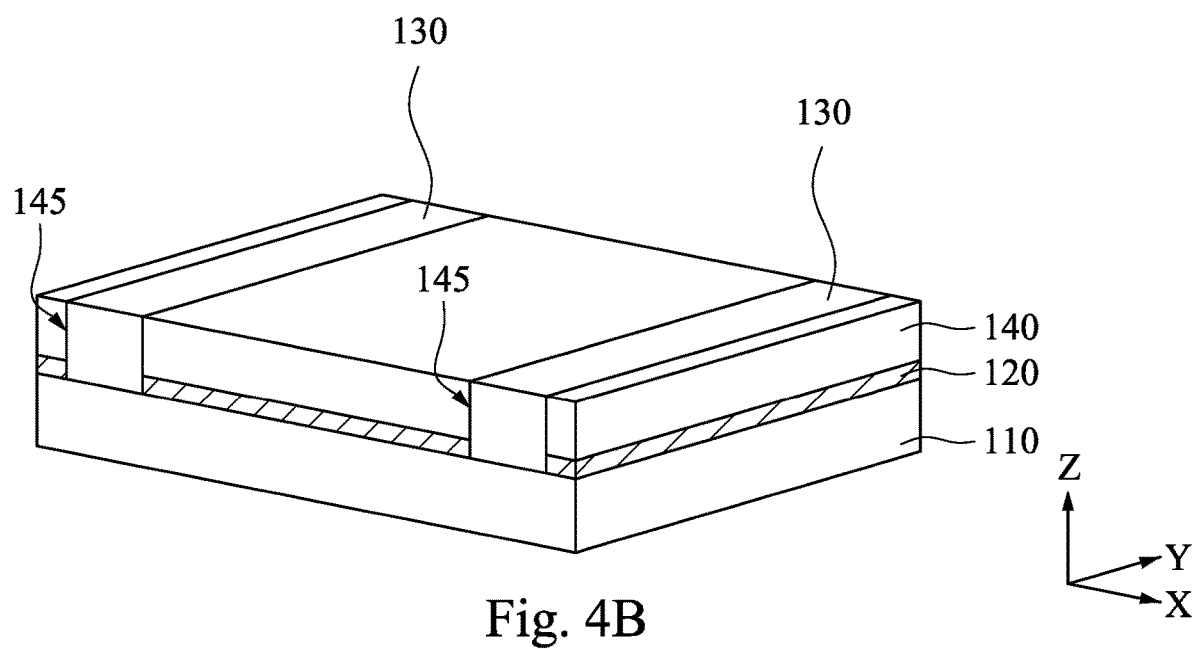

In operation S36 of method M30, source/drain contacts 130 are formed over the carrier 110 and in contact with the 2D insulating layer 120 and the gate dielectric layer 140, as shown in FIG. 4B. Specifically, openings 145 may be formed in the gate dielectric layer 140 and the 2D insulating layer 120 in advance by performing an etching process for example, such that the openings 145 expose the carrier 110. Then, conductive materials are filled in the openings 145 to form the source/drain contacts 130. Thus, the source/drain contacts 130 are in contact with the carrier 110, the 2D insulating layer 120, and the gate dielectric layer 140. In FIG. 4B, since the etching process is not performed over the channel layer 190 (see FIG. 4F), this process does not damage the channel layer 190.

Figure 4C:
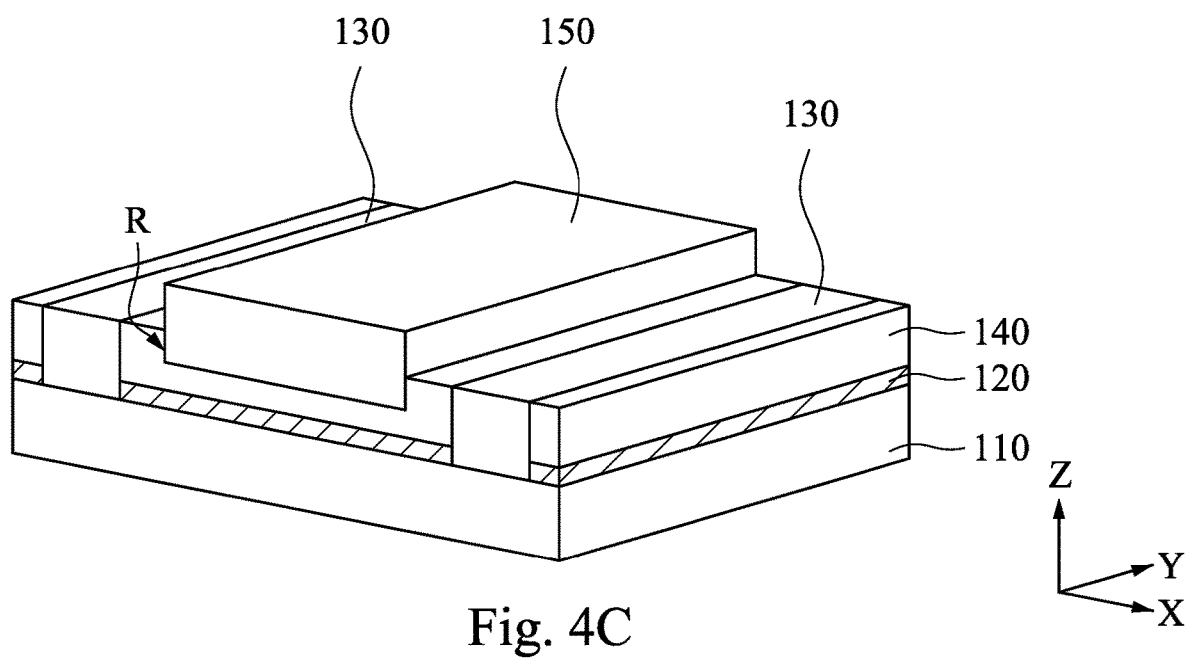

In operation S38 of method M30, a gate electrode 150 is formed over the gate dielectric layer 140 and between the source/drain contacts 130, as shown in FIG. 4C. For example, a mask (not shown) may be formed over the structure of FIG. 4C, and the mask exposes a portion of the gate dielectric layer 140 between the source/drain contacts 130. The portion of the gate dielectric layer 140 is then removed to form a recess R in the gate dielectric layer 140, and conductive materials are filled in the recess R to form the gate electrode 150.

Figure 4D:
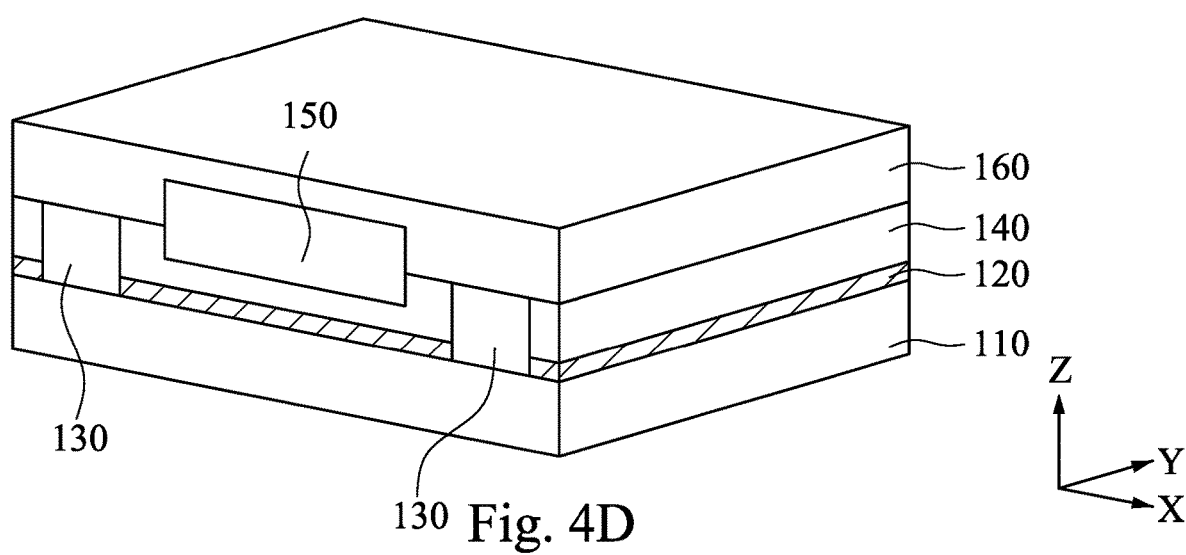

In operation S40 of method M30, as shown in FIG. 4D, a transfer layer 160 is formed on the gate electrode 150, the source/drain contacts 130, and the gate dielectric layer 140 in order to begin the process of transferring the gate electrode 150, the source/drain contacts 130, and the 2D insulating layer 120 to a substrate 170 (not illustrated in FIG. 4D but illustrated and discussed further below with respect to FIG. 4G).

Figure 4E:
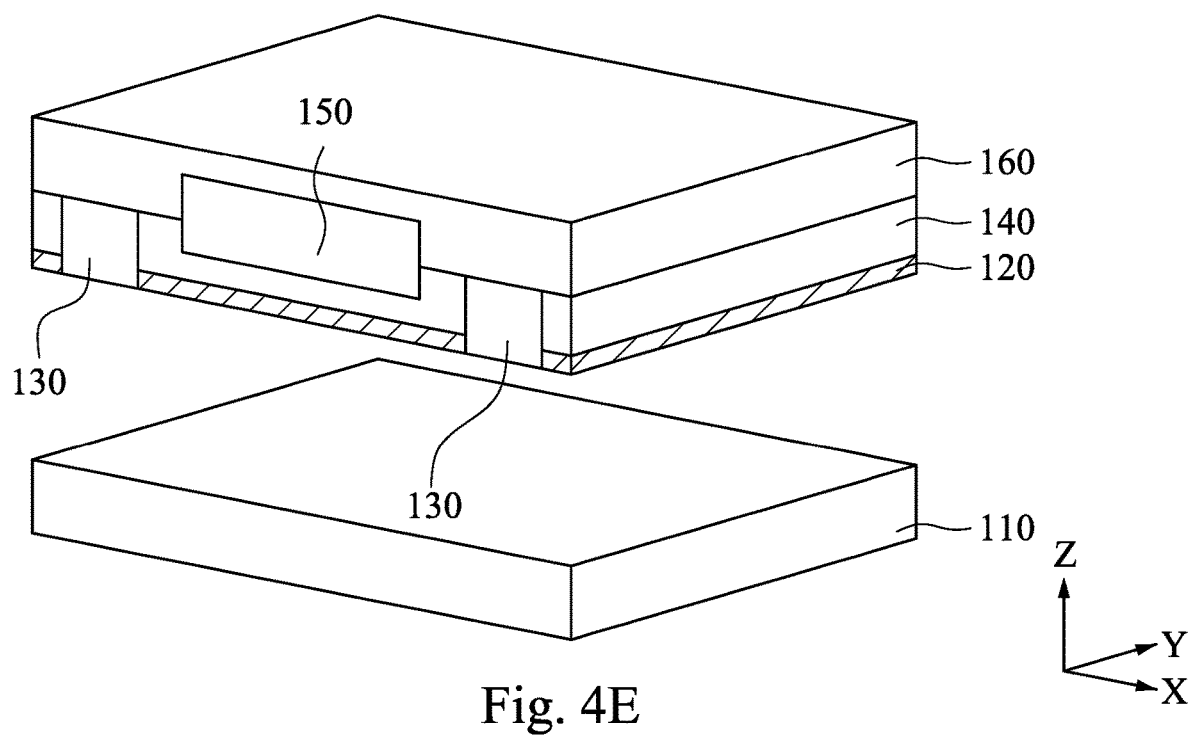

In operation S42 of method M30, the 2D insulating layer 120 and the source/drain contacts 130 are removed from the carrier 110, as shown in FIG. 4E. Specifically, once the transfer layer 160 is in place over the gate electrodes 150, the gate dielectric layer 140, and the source/drain contacts 130, the carrier 110 may be removed in order to expose a back side of the 2D insulating layer 120 and back sides of the source/drain contacts 130. As mentioned above, since the 2D insulating layer 120 is adhered to the carrier 110 through Van der Waals force, the delamination force of the 2D insulating layer 120 is not so strong, and the source/drain contacts 130 are easier to be removed from the carrier 110, such that the structures formed over the 2D insulating layer 120 is not easy to be damaged.

Figure 4F:
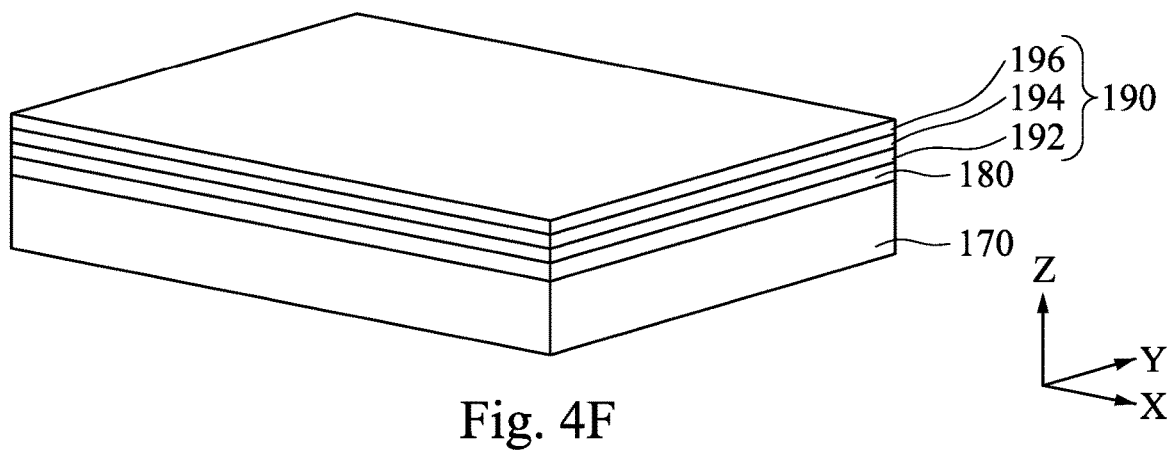

FIG. 4F illustrates a substrate 170 onto which the structure in FIG. 4E may be transferred (the transfer is not illustrated in FIG. 4F but is illustrated and discussed below with respect to FIG. 4G). In operation S44 of method M30, a channel layer 190 is formed over a substrate 170, as shown in FIG. 4F. In some embodiments, a buffer layer 180 may be optionally formed on the substrate 170. The channel layer 190 is then formed on the substrate 170 (or on the buffer layer 180).

Figure 4G:
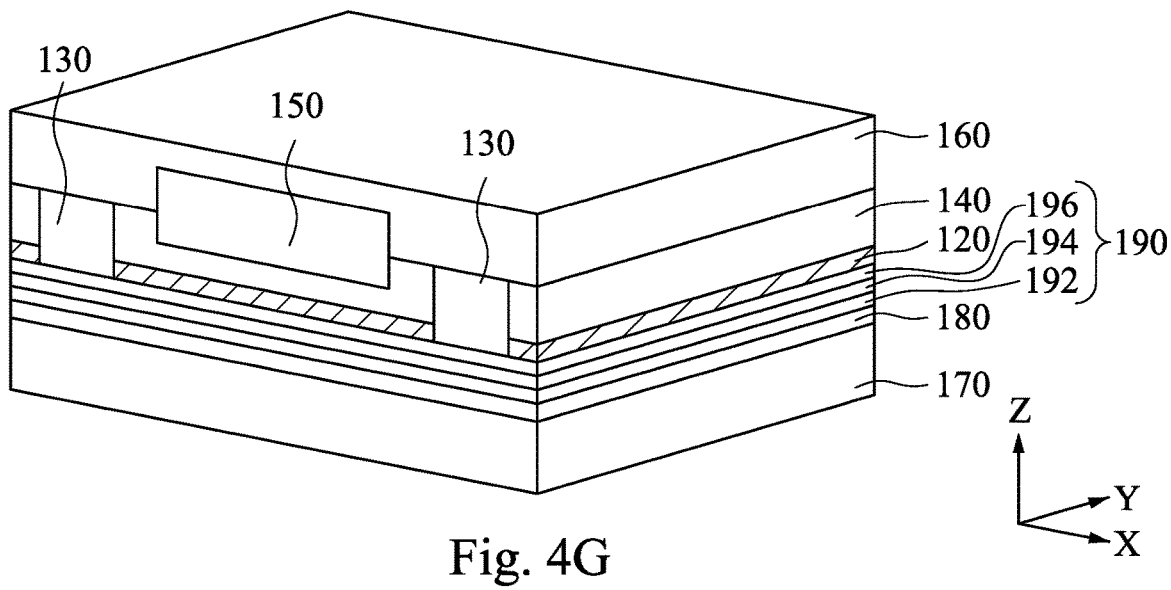

In operation S46 of method M30, the 2D insulating layer 120 is bonded on the channel layer 190, as shown in FIG. 4G. In some embodiment, a heating process is performed to bond the 2D insulating layer 120 on the channel layer 190 at a temperature lower than about 300° C., e.g., about 60° C. to about 200° C. If the temperature is lower than about 60° C., the 2D insulating layer 120 may not be bond on the channel layer 190 successfully; if the temperature is higher than about 300° C., the channel layer 190 may suffer unwanted damage. In some embodiments, the heating process is performed in a vacuum-environment, and a vacuum process may be added before the heating process. The vacuum environment helps reducing the heating temperature of the heating process.

Figure 4H:
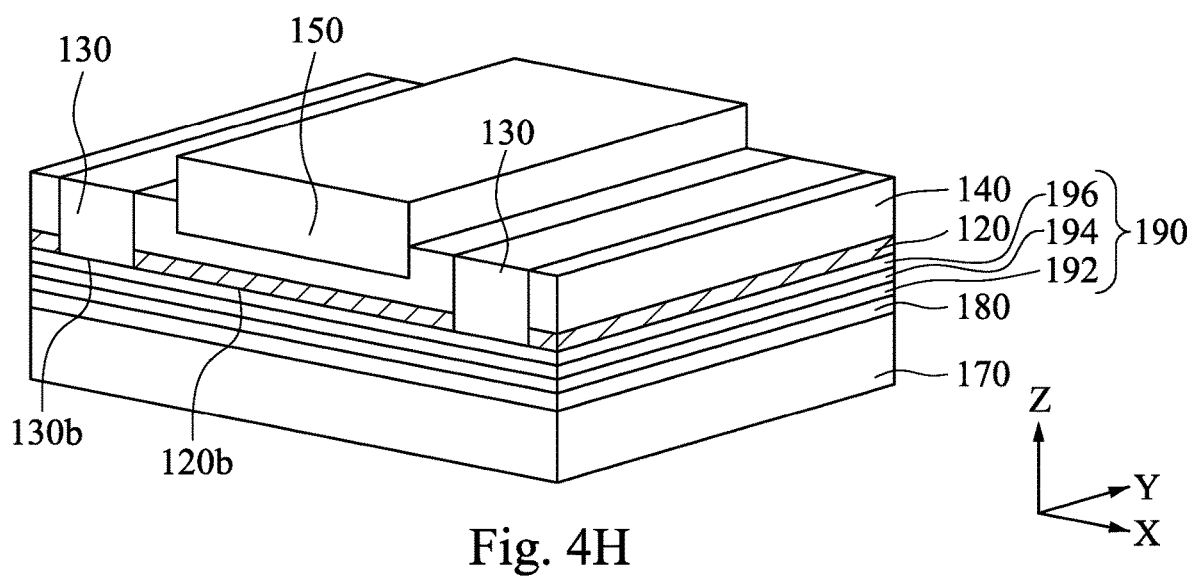

In operation S48 of method M30, the transfer layer 160 is removed, as shown in FIG. 4H. In FIG. 4H, the semiconductor device includes the substrate 170, the channel layer 190, the 2D insulating layer 120, the source/drain contacts 130, the gate dielectric layer 140, and the gate electrode 150. The channel layer 190 is formed over the substrate 170. The 2D insulating layer 120 is formed over the channel layer 190. The source/drain contacts 130 are formed over the channel layer 190, and the source/drain contacts 130 are in contact with the channel layer 190, the 2D insulating layer 120, and the gate dielectric layer 140. That is, a bottom surface 130b of the source/drain contacts 130 and a bottom surface 120b of the 2D insulating layer 120 are substantially coplanar. The gate dielectric layer 140 is formed over the 2D insulating layer 120 and the source/drain contacts 130. The gate electrode 150 is formed over the gate dielectric layer 140 and between the source/drain contacts 130.

In FIG. 4H, the 2D insulating layer 120 is a good insulator along the lateral direction, such that the 2D insulating layer 120 provides good insulation between the two source/drain contacts 130. With this configuration, the electrons can flow from one of the source/drain contacts 130 to another one of the source/drain contacts 130 through the channel layer 190 but not through the 2D insulating layer 120 in the lateral direction. Moreover, the channel layer 190 may be a 2D material which has electrical conductivity in the lateral direction. That is, the channel layer 190 has a lateral electrical conductivity higher than the 2D insulating layer 120 (and the buffer layer 180).

In some embodiments, the buffer layer 180 is formed between the channel layer 190 and the substrate 170. As such, the channel layer 190 is formed between the buffer layer 180 and the 2D insulating layer 120. The buffer layer 180 provides a flat interface for depositing the channel layer 190, and the 2D insulating layer 120 also provides another flat interface for the channel layer 190. Therefore, the channel layer 190 reduces the electron scattering effect therein and makes carrier mobility higher. Furthermore, the buffer layer 180 is also a good insulator in the lateral direction if the buffer layer 180 is made of h-BN.

The formation of the source/drain contacts 130 may include depositing conductive materials in the source/drain openings 145 to form the source/drain contacts 130. The depositing of the conductive materials may be a high temperature process. The high temperature process may worse the channel layer 190. In the embodiments of the method M30, however, the source/drain openings 145 and the channel layer 190 are separately formed, the high temperature during the depositing process of the blanket conductive layer does not affect the channel layer 190. Also, since the source/drain openings 145 is formed on the carrier 110, instead of directly formed on the channel layer 190, the metal pinning on the channel layer 190 can be avoided, where the metal pinning may raise the threshold voltage of the gate of the formed semiconductor device. As such, the channel layer 190 in FIG. 4H has a good device performance.

Figure 5:
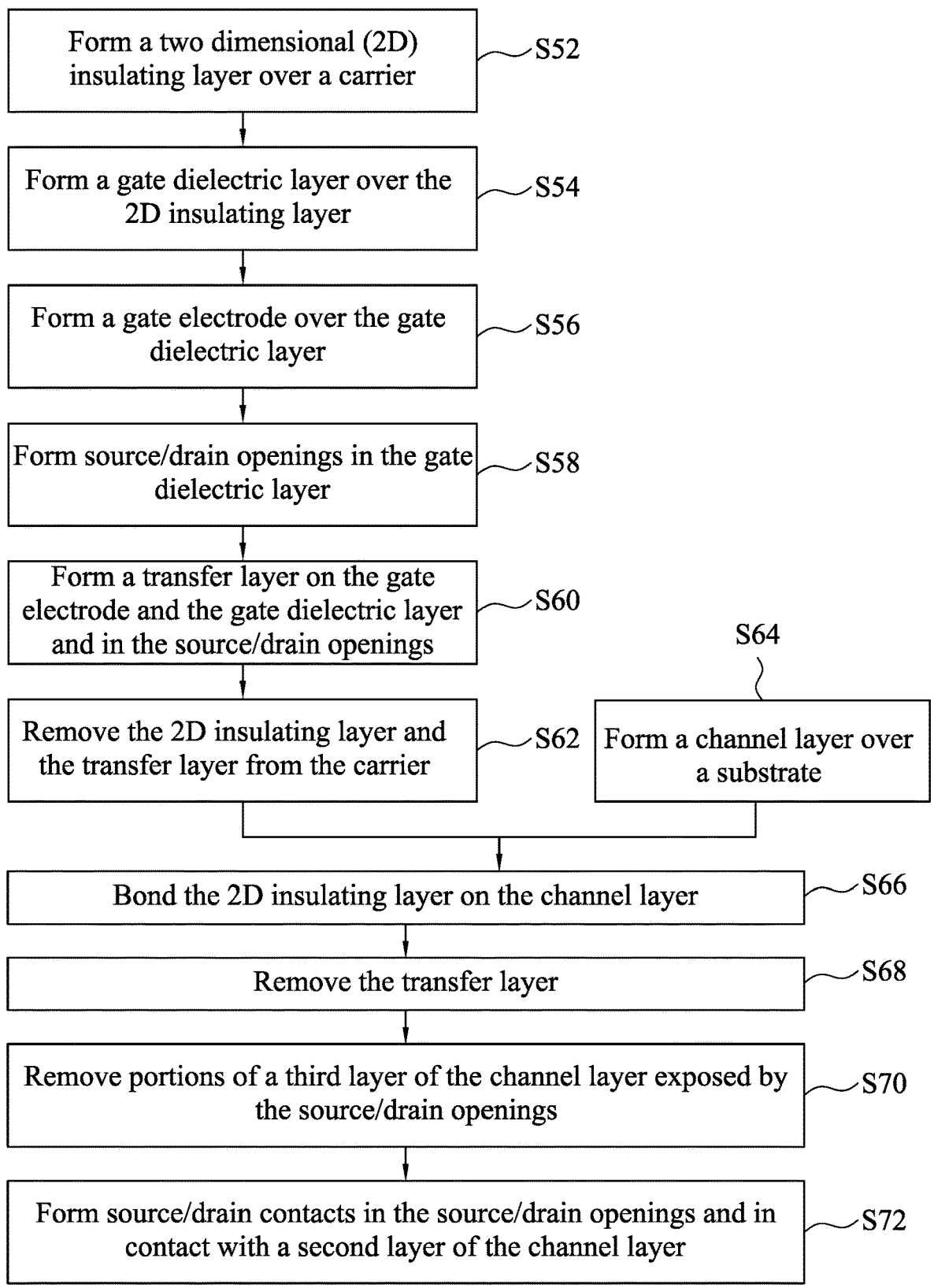
FIG. 5 is a flowchart of a method for making a semiconductor device according to aspects of the present disclosure in various embodiments.
Figure 6A:
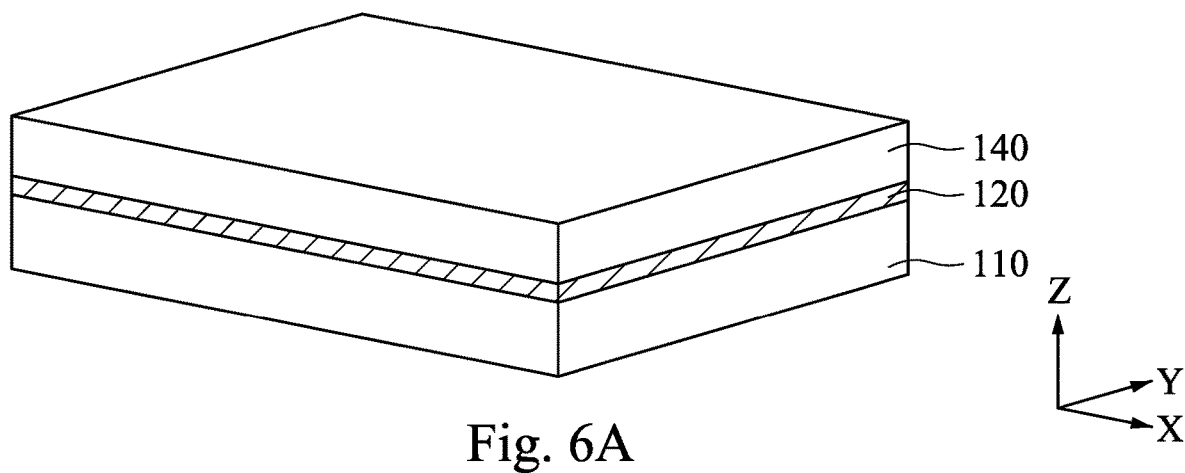
FIGS. 6A-6J illustrate cross-sectional view of a semiconductor device at various stages of the method of FIG. 5 in accordance with some embodiments of the present disclosure.

FIG. 5 is a flowchart of a method M50 for making a semiconductor device according to aspects of the present disclosure in various embodiments. Various operations of the method M50 are discussed in association with perspective diagrams FIGS. 6A-6J. Throughout the various views and illustrative embodiments, like reference numbers are used to designate like elements. The present embodiment may repeat reference numerals and/or letters used in FIGS. 2A-2H. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 6A-6J. In operation S52 of method M50, a 2D insulating layer 120 is formed over a carrier 110, as shown in FIG. 6A. In operation S54 of method M50, a gate dielectric layer 140 is formed over the 2D insulating layer 120, as shown in FIG. 6A. The gate dielectric layer 140 may be formed directly on the 2D insulating layer 120 such that the gate dielectric layer 140 and the 2D insulating layer 120 are in contact (e.g. physical contact) with each other.

Figure 6B:
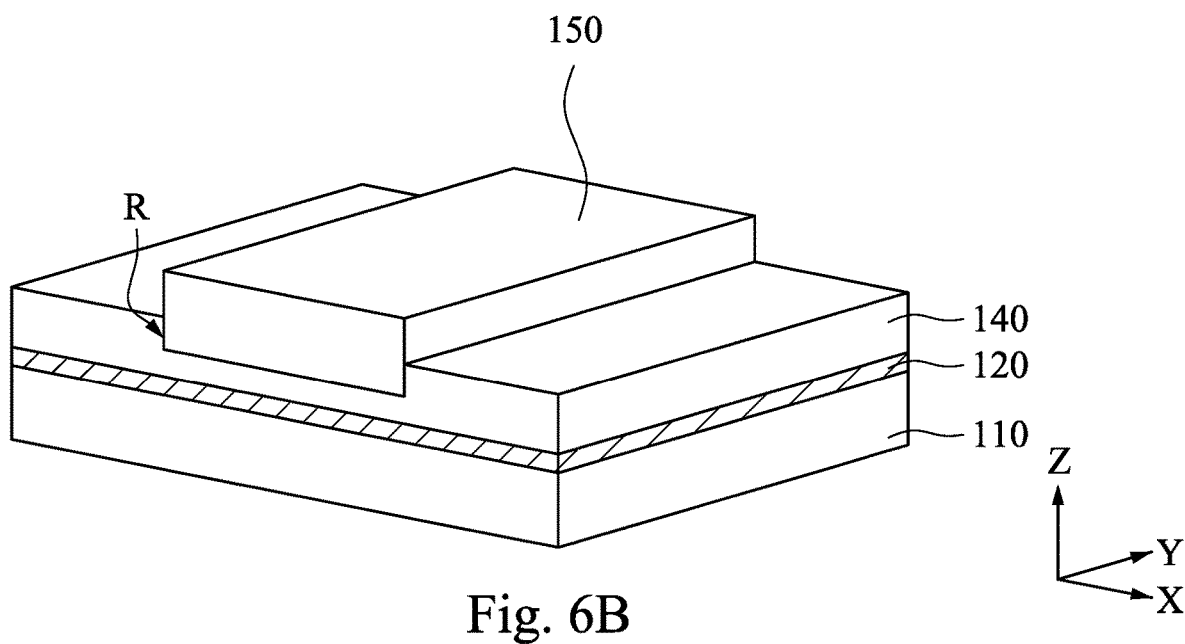

In operation S56 of method M50, a gate electrode 150 is formed over the gate dielectric layer 140, as shown in FIG. 6B. For example, a mask (not shown) may be formed over the structure of FIG. 6A, and the mask exposes a portion of the gate dielectric layer 140. The portion of the gate dielectric layer 140 is then removed to form a recess R in the gate dielectric layer 140, and conductive materials are filled in the recess R to form the gate electrode 150.

Figure 6C:
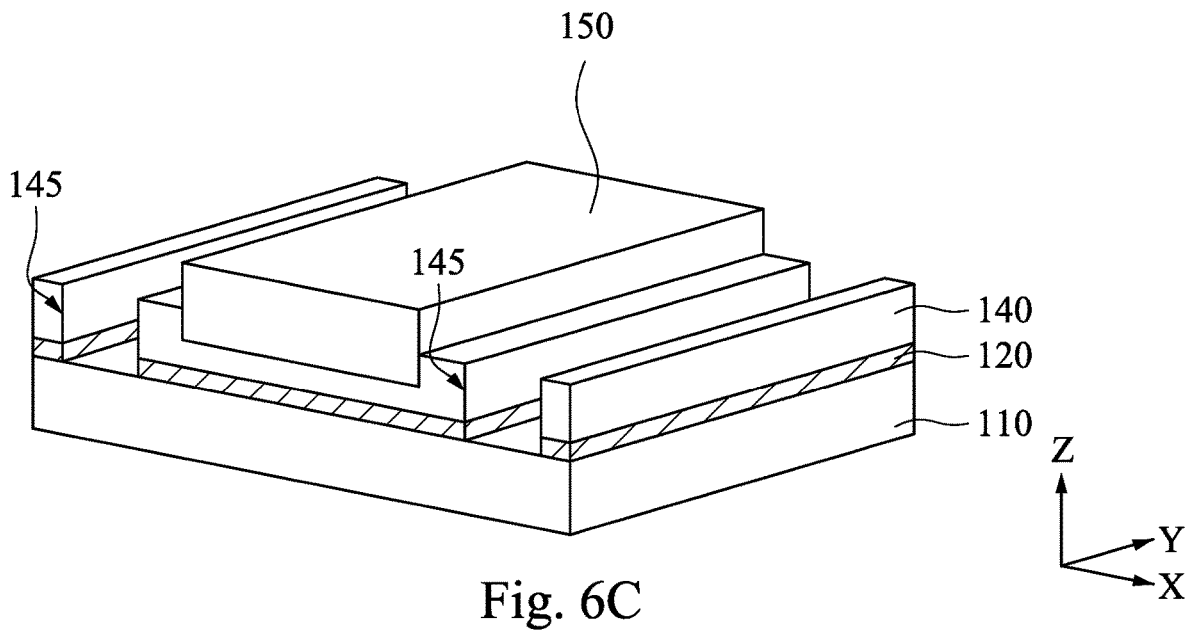

In operation S58 of method M50, source/drain openings 145 are formed in the gate dielectric layer 140, as shown in FIG. 6C. Specifically, the openings 145 may be formed in the gate dielectric layer 140 and the 2D insulating layer 120 by performing an etching process for example, such that the source/drain openings 145 expose the carrier 110.

Figure 6D:
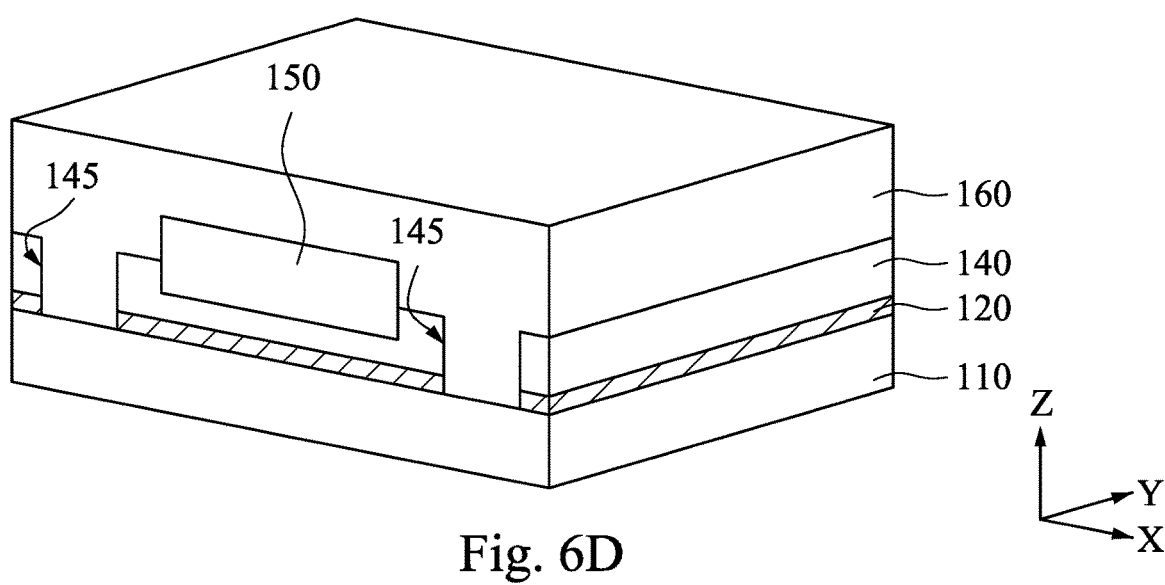

In operation S60 of method M50, a transfer layer 160 is formed on the gate electrodes 150 and the gate dielectric layer 140 and in the source/drain openings 145, as shown in FIG. 6D. Specifically, the transfer layer 160 may be deposited on the structure of FIG. 6C in order to begin the process of transferring the gate electrode 150 and the 2D insulating layer 120 to a substrate 170 (not illustrated in FIG. 6D but illustrated and discussed further below with respect to FIG. 6G).

Figure 6E:
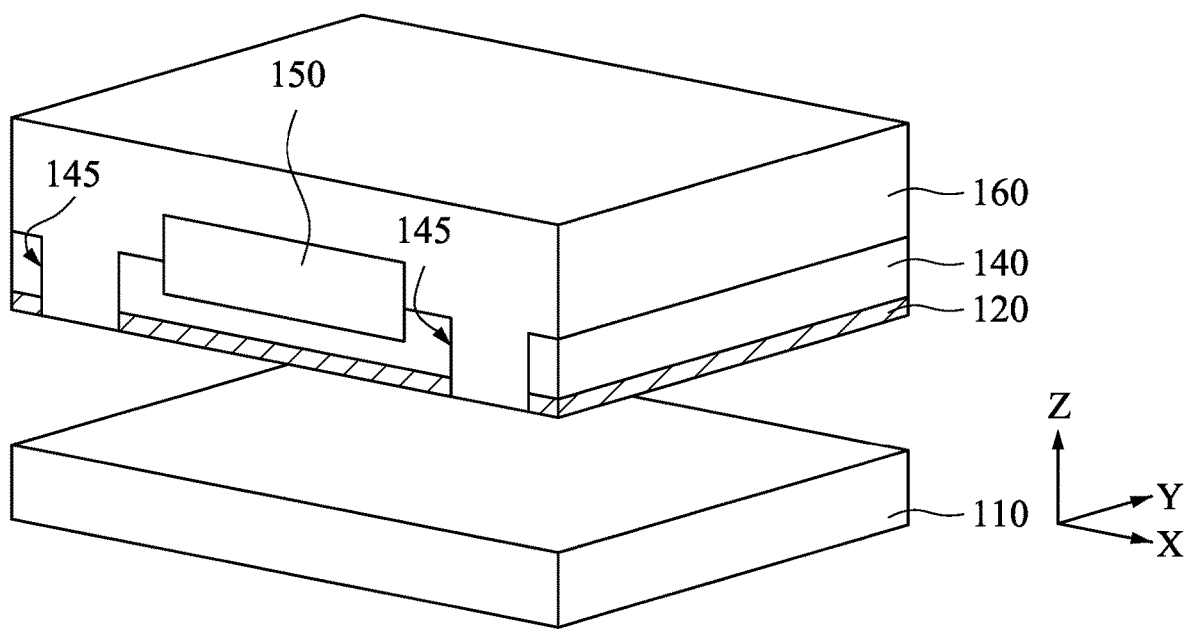

In operation S62 of method M50, the 2D insulating layer 120 and the transfer layer 160 are removed from the carrier 110, as shown in FIG. 6E. Specifically, once the transfer layer 160 is in place over the gate electrodes 150 and the gate dielectric layer 140, the carrier 110 may be removed in order to expose a back side of the 2D insulating layer 120 and back sides of the transfer layer 160. As mentioned above, since the 2D insulating layer 120 is adhered to the carrier 110 through Van der Waals force, the delamination force of the 2D insulating layer 120 is not so strong, and the transfer layer 160 are easier to be removed from the carrier 110, such that the structures formed over the 2D insulating layer 120 is not easy to be damaged.

Figure 6F:
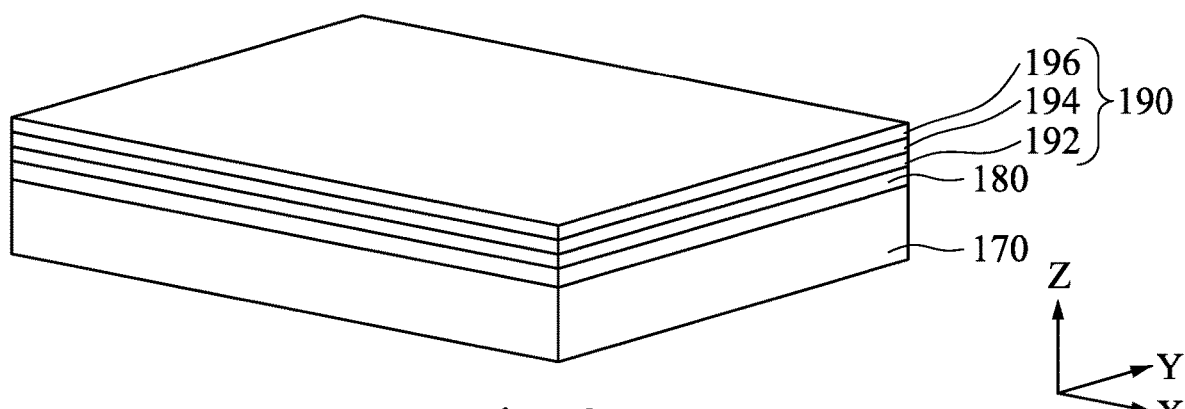

FIG. 6F illustrates a substrate 170 onto which the structure in FIG. 6E may be transferred (the transfer is not illustrated in FIG. 6F but is illustrated and discussed below with respect to FIG. 6G). In operation S64 of method M50, a channel layer 190 is formed over a substrate 170, as shown in FIG. 6F. In some embodiments, a buffer layer 180 may be optionally formed on the substrate 170. The channel layer 190 is then formed on the substrate 170 (or on the buffer layer 180).

Figure 6G:
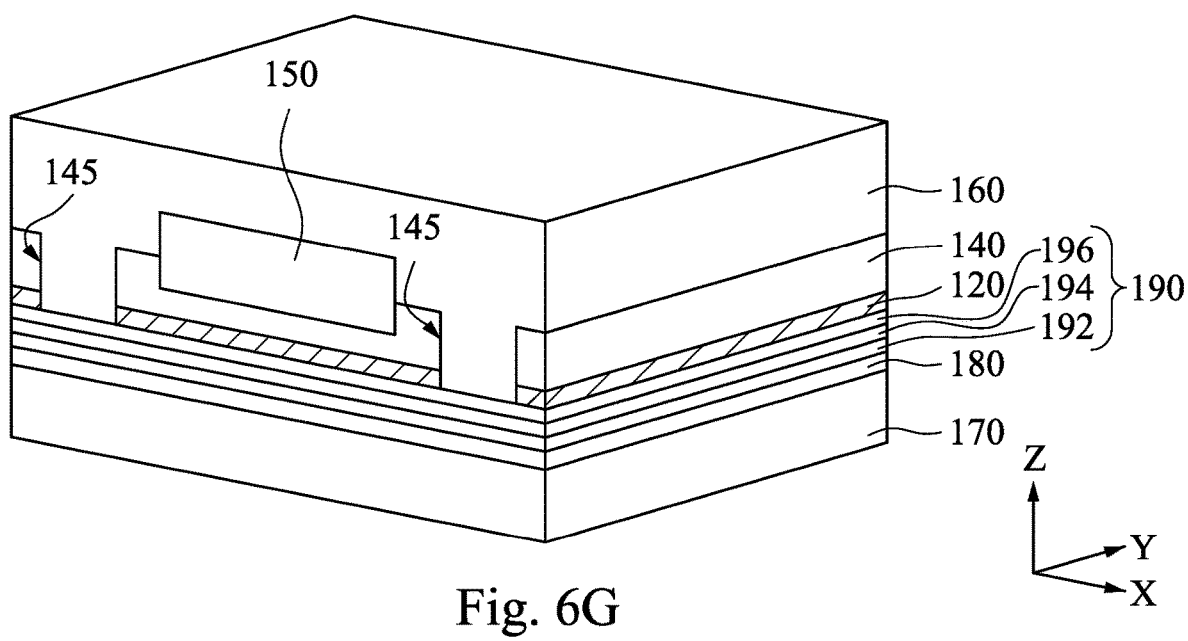

In operation S66 of method M50, the 2D insulating layer 120 is bonded on the channel layer 190, as shown in FIG. 6G. In some embodiment, a heating process is performed to bond the 2D insulating layer 120 on the channel layer 190 at a temperature lower than about 300° C., e.g., about 100° C. to about 200° C. If the temperature is lower than about 100° C., the 2D insulating layer 120 may not be bond on the channel layer 190 successfully; if the temperature is higher than about 300° C., the channel layer 190 may suffer unwanted damage. In some embodiments, the heating process is performed in a vacuum-environment, and a vacuum process may be added before the heating process. The vacuum environment helps reducing the heating temperature of the heating process.

Figure 6H:
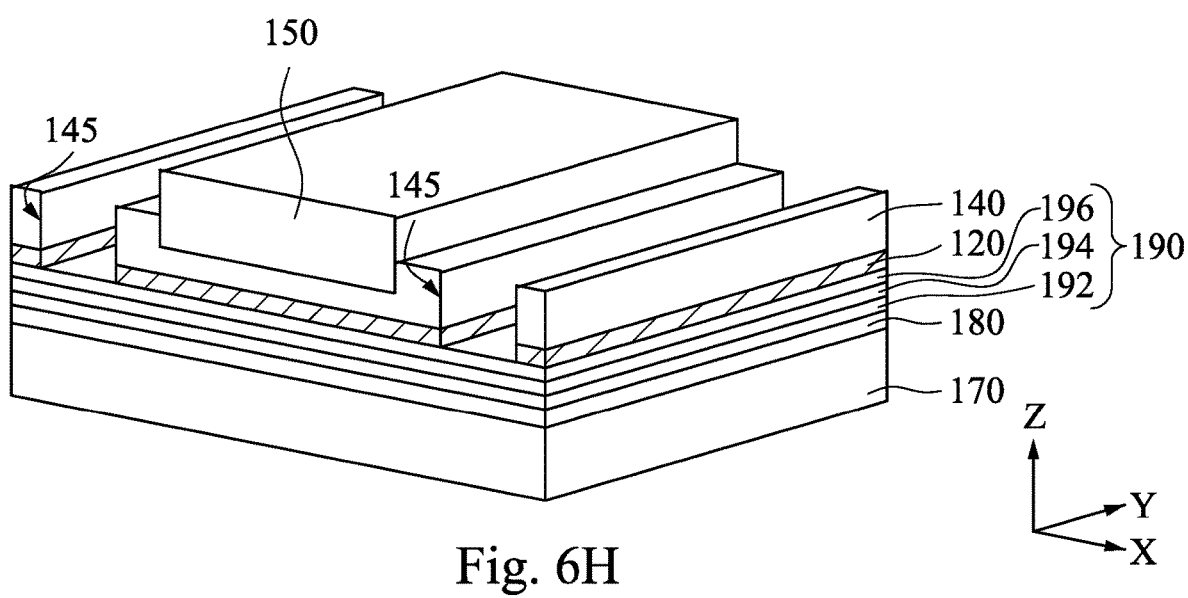

In operation S68 of method M50, the transfer layer 160 is removed to expose the channel layer 190 after the bonding process, as shown in FIG. 6H. The transfer layer 160 may be removed using a stripping or etching process to remove the material of the transfer layer 160 form the gate electrode 150 and the gate dielectric layer 140. In some embodiments, the transfer layer 160 may be removed by applying acetone to the polymer if the transfer layer 160 is made of polymers such as PMMA. In some other embodiments, the transfer layer 160 may be removed by applying HCl, HNO₃, and/or liquid state FeCl₃ to the transfer layer 160 if the transfer layer 160 is made of metal such as Ni, Au, Cu, or other suitable materials.

Figure 6I:
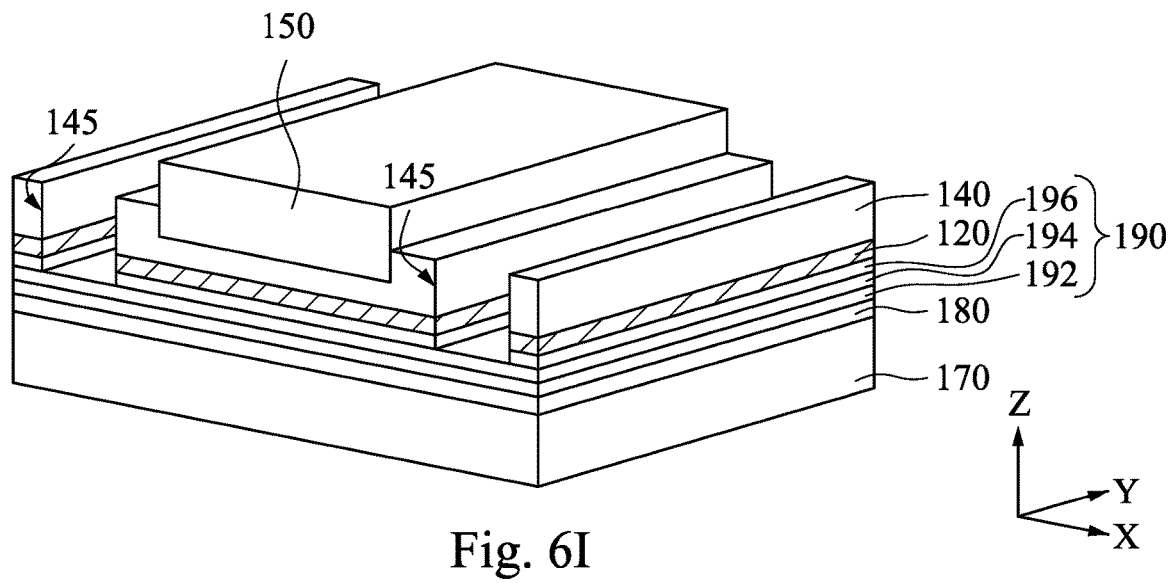

In operation S70 of method M50, portions of the third layer 196 of the channel layer 190 exposed by the source/drain openings 145 are removed, as shown in FIG. 6I. Specifically, as mentioned above, the third layer 196 of the channel layer 190 includes chalcogen atoms X, which may be lower conductivity than the metal atoms M. The portion of the third layer 196 exposed by the source/drain openings 145 may be removed to expose the second layer 194, which includes transition metal M. The removal process of the third layer 196 may be performed by using a H₂ plasma treatment. The H₂ plasma will react with the chalcogen atoms X to remove the exposed third layer 196. The remaining third layer 196 is between the gate dielectric layer 140 and the second layer 194.

Figure 6J:
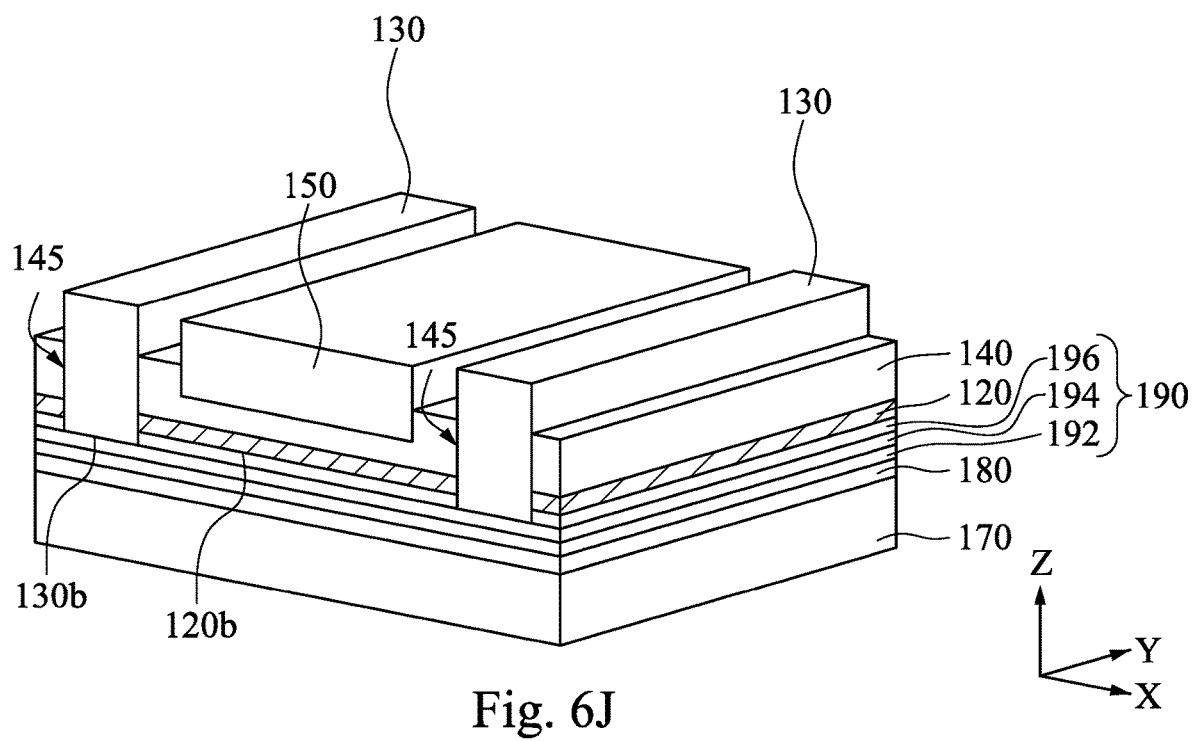

In operation S72 of method M50, source/drain contacts 130 are formed in the source/drain openings 145 and in contact with the second layer 194 of the channel layer 190, as shown in FIG. 6J. Specifically, conductive materials are filled in the openings 145 to form the source/drain contacts 130. Since the second layer 194 is exposed, the second layer 194 may be a seed layer to form the source/drain contacts 130. Further, since the source/drain contacts 130 are in contact with the second layer 194, the electrical conductivity from the source to drain is improved.

In FIG. 6J, the semiconductor device includes the substrate 170, the channel layer 190, the 2D insulating layer 120, the source/drain contacts 130, the gate dielectric layer 140, and the gate electrode 150. The channel layer 190 is formed over the substrate 170 and includes the first layer 192, the second layer 194, and the third layer 196, where the second layer 194 is between the first layer 192 and the third layer 196. The 2D insulating layer 120 is formed over the channel layer 190. The source/drain contacts 130 are formed over the channel layer 190, and the source/drain contacts 130 are in contact with the second layer 194 of the channel layer 190. That is, a bottom surface 130b of the source/drain contacts 130 is lower than a bottom surface 120b of the 2D insulating layer 120. The third layer 196 of the channel layer 190 is between the gate dielectric layer 140 and the second layer 194, but not between the source/drain contacts 130 and the second layer 194. The 2D insulating layer 120 is separated from the second layer 194. The gate dielectric layer 140 is formed over the 2D insulating layer 120 and the source/drain contacts 130. The gate electrode 150 is formed over the gate dielectric layer 140 and between the source/drain contacts 130.

In FIG. 6J, the 2D insulating layer 120 is a good insulator along the lateral direction, such that the 2D insulating layer 120 provides good insulation between the two source/drain contacts 130. With this configuration, the electrons can flow from one of the source/drain contacts 130 to another one of the source/drain contacts 130 through the channel layer 190 but not through the 2D insulating layer 120 in the lateral direction. Moreover, the channel layer 190 is a 2D material which has electrical conductivity in the lateral direction. That is, the channel layer 190 has a lateral electrical conductivity higher than the 2D insulating layer 120 (and the buffer layer 180).

In some embodiments, the buffer layer 180 is formed between the channel layer 190 and the substrate 170. As such, the channel layer 190 is formed between the buffer layer 180 and the 2D insulating layer 120. The buffer layer 180 provides a flat interface for depositing the channel layer 190, and the 2D insulating layer 120 also provides another flat interface for the channel layer 190. Therefore, the channel layer 190 reduces the electron scattering effect therein and makes carrier mobility higher. Furthermore, the buffer layer 180 is also a good insulator in the lateral direction if the buffer layer 180 is made of h-BN.

Figure 7:
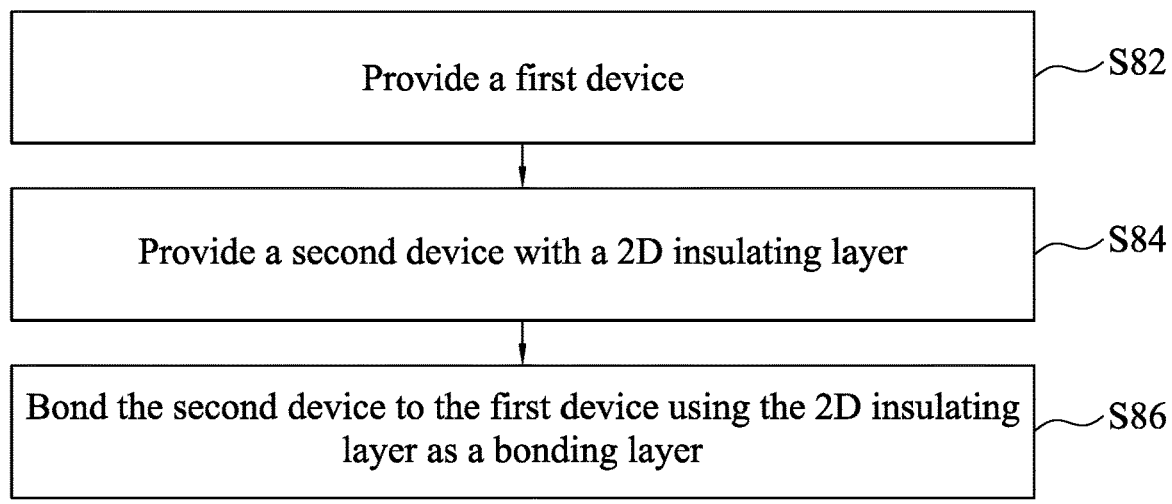
FIG. 7 is a flowchart of a method for making a semiconductor device according to aspects of the present disclosure in various embodiments.
Figure 8A:
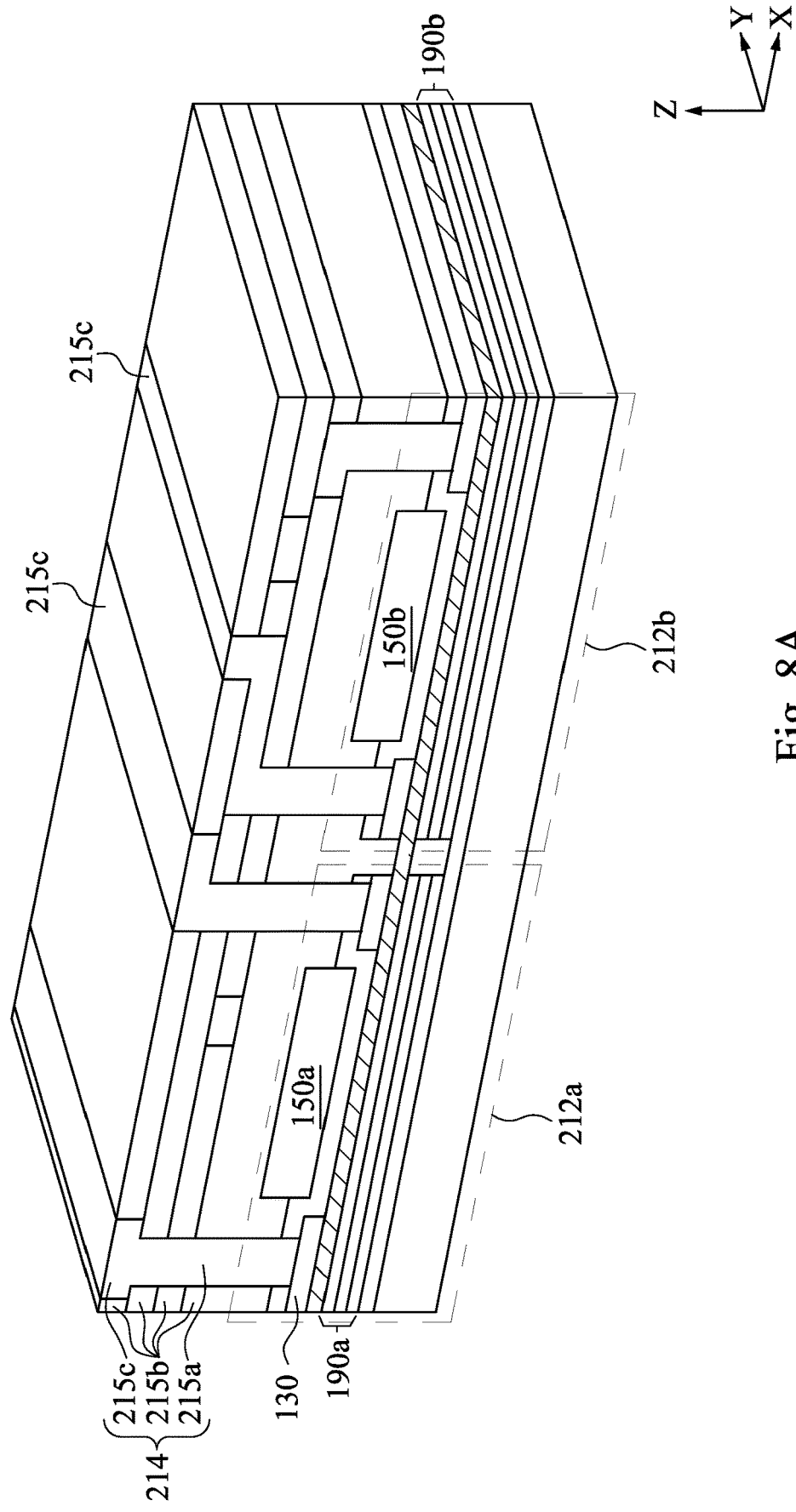
FIGS. 8A-8C illustrate cross-sectional view of a semiconductor device at various stages of the method of FIG. 7 in accordance with some embodiments of the present disclosure.

FIG. 7 is a flowchart of a method M80 for making a semiconductor device according to aspects of the present disclosure in various embodiments. Various operations of the method M80 are discussed in association with perspective diagrams FIGS. 8A-8C. Throughout the various views and illustrative embodiments, like reference numbers are used to designate like elements. In operation S82 of method M80, a first device 210 is provided, as shown in FIG. 8A. In FIG. 8A, the first device 210 is a functional device, e.g., a CMOS or an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, bipolar transistors, high voltage transistors, high frequency transistors, other memory cells, and combinations thereof.

In some embodiments, the first device 210 includes at least one semiconductor device and a first inter-metal dielectric (IMD) structure 214 formed on the semiconductor device. For example, the first device 210 may include two semiconductor device 212a and 212b adjacent to each other. In some embodiments, the semiconductor devices 212a and 212b may be the semiconductor device shown in FIG. 2H (or FIG. 4H or FIG. 6J), and the present disclosure is not limited in this respect. In FIG. 8A, the structures of FIG. 2H are used for illustration purposes only. In some other embodiments, the first device 210 does not include 2D material layers. The semiconductor devices 212a and 212b may be different. For example, the gate electrodes 150a and 150b in the semiconductor devices 212a and 212b may have different work functions and/or different materials. In some other examples, the channel layers 190a and 190b in the semiconductor devices 212a and 212b may have different materials.

The first IMD structure 214 includes conductive lines 215a, dielectric layers 215b, and a plurality of top conductive lines 215c. The dielectric layers 215b are deposited over the semiconductor devices 212a and 212b, and the conductive lines 215a are embedded in the dielectric layers 215b. The top conductive lines 215c are embedded in the topmost dielectric layer 215b. The conductive lines 215a interconnect one of the top conductive lines 215c to one of the source/drain contacts 130. In some embodiments, the top conductive lines 215c are electrically isolated from each other. It is noted that the route of the conductive lines 215a in FIG. 8A are illustrated only, and the present disclosure is not limited in this respect.

Figure 8B:
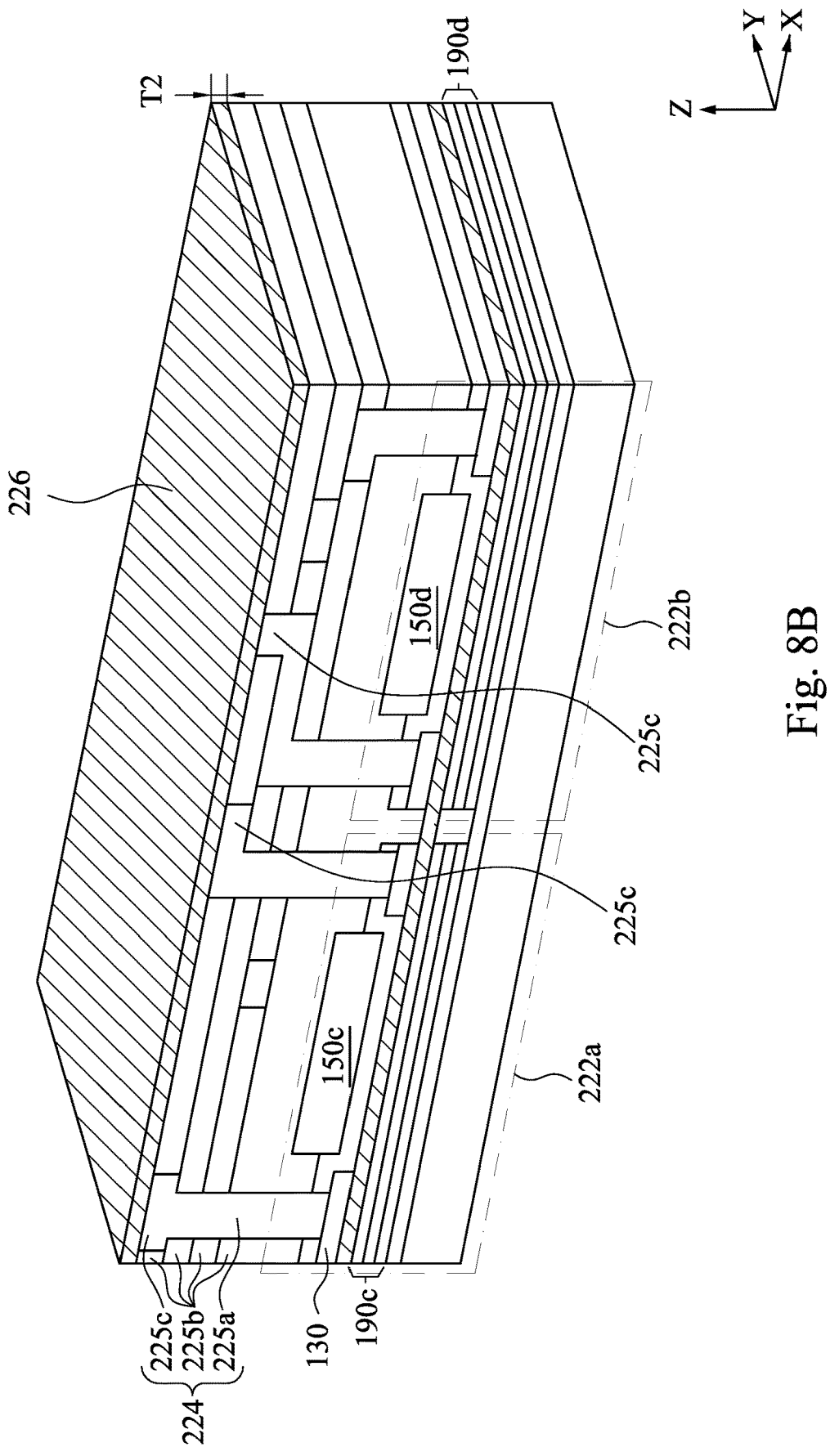

In operation S84 of method M80, a second device 220 is provided, as shown in FIG. 8B. In FIG. 8B, the second device 220 is a functional device, e.g., a CMOS or an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, bipolar transistors, high voltage transistors, high frequency transistors, other memory cells, and combinations thereof.

In some embodiments, the second device 220 includes at least one semiconductor device, a second IMD structure 224 formed on the semiconductor device, and a 2D insulating layer 226 formed on the second IMD structure 224. For example, the second device 220 may include two semiconductor device 222a and 222b adjacent to each other. In some embodiments, the semiconductor devices 222a and 222b may be the semiconductor device shown in FIG. 2H (or FIG. 4H or FIG. 6J), and the present disclosure is not limited in this respect. In FIG. 8B, the structures of FIG. 2H are used for illustration purposes only. In some other embodiments, the second device 220 does not include 2D channel layers. The semiconductor devices 222a and 222b may be different. For example, the gate electrodes 150c and 150d in the semiconductor devices 222a and 222b may have different work functions and/or different materials. In some other examples, the channel layers 190c and 190d in the semiconductor devices 222a and 222b may have different materials. In some embodiments, the 2D insulating layer 226 may have similar (or the same) material to the 2D insulating layer 120 of FIG. 2H.

The second IMD structure 224 includes conductive lines 225a, dielectric layers 225b, and a plurality of top conductive lines 225c. The dielectric layers 225b are deposited over the semiconductor devices 222a and 222b, and the conductive lines 225a are embedded in the dielectric layers 225b. The top conductive lines 225c are embedded in the topmost dielectric layer 225b. The conductive lines 225a interconnect one of the top conductive lines 225c to one of the source/drain contacts 130. In some embodiments, the top conductive lines 225c are electrically isolated from each other. It is noted that the route of the conductive lines 225a in FIG. 8B are illustrated only, and the present disclosure is not limited in this respect.

The 2D insulating layer 226 covers the second IMD structure 224, i.e., the top conductive lines 225c. In some embodiments, the 2D insulating layer 226 has a thickness T2 of about 3.0 angstroms to about 50 angstroms. The lower limit (about 0.3 angstroms) is the thickness of monolayer 2D insulating layer 226, and if the thickness T2 is greater than about 50 angstroms, the electrical conductivity of the 2D insulating layer 226 in the vertical direction (which will be described in detail in the operation S86) is suppressed.

Figure 8C:
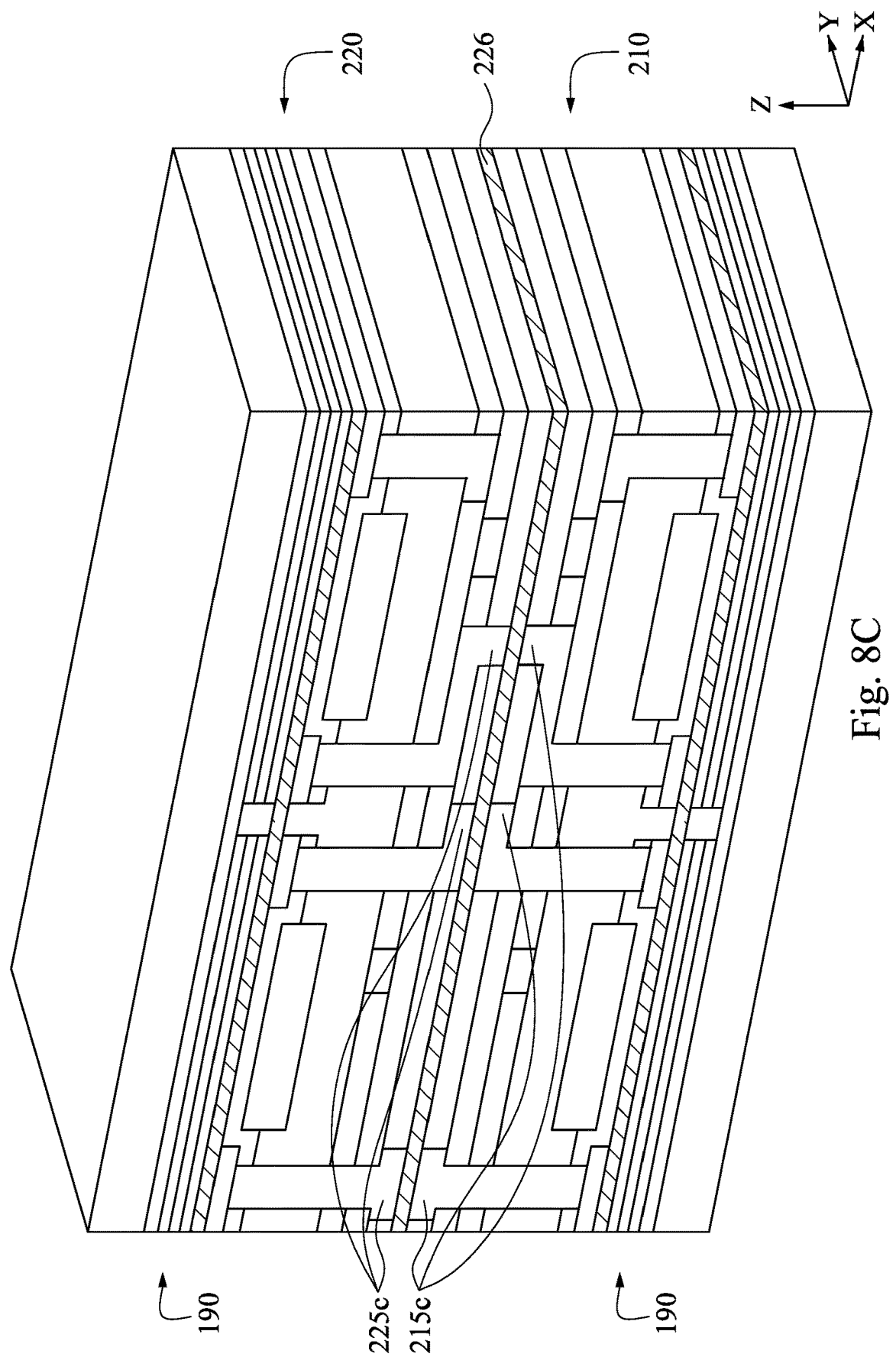

In operation S86 of method M80, the second device 220 is bound to the first device 210 using the 2D insulating layer 226 as a bonding layer, as shown in FIG. 8C. In some embodiments, a heating process is performed to bond the 2D insulating layer 226 on the first device 210 at a temperature lower than about 300° C., e.g., about 100° C. to about 200° C. If the temperature is lower than about 100° C., the 2D insulating layer 226 may not be bond on the first device 210 successfully; if the temperature is higher than about 300° C., the channel layers 190 may suffer unwanted damage. In some embodiments, the heating process is performed in a vacuum-environment, and a vacuum process may be added before the heating process. The vacuum environment helps reduce the heating temperature of the heating process.

In FIG. 8C, the 2D insulating layer 226 is disposed between the top conductive lines 215c of the first device 210 and the top conductive lines 225c of the second device 220. The top conductive lines 215c are aligned with the top conductive lines 225c. As mentioned above, the 2D insulating layer 226 is a good conductor in a vertical direction. The top conductive lines 215c of the first device 210 is able to be electrically connected to the top conductive lines 225c of the second device 220 through the 2D insulating layer 226. Also, since the 2D insulating layer 226 is adhered to other elements (such as a carrier or a substrate) via Van der Waals forces, the 2D insulating layer 226 can be a good debonding layer.

Figure 9A:
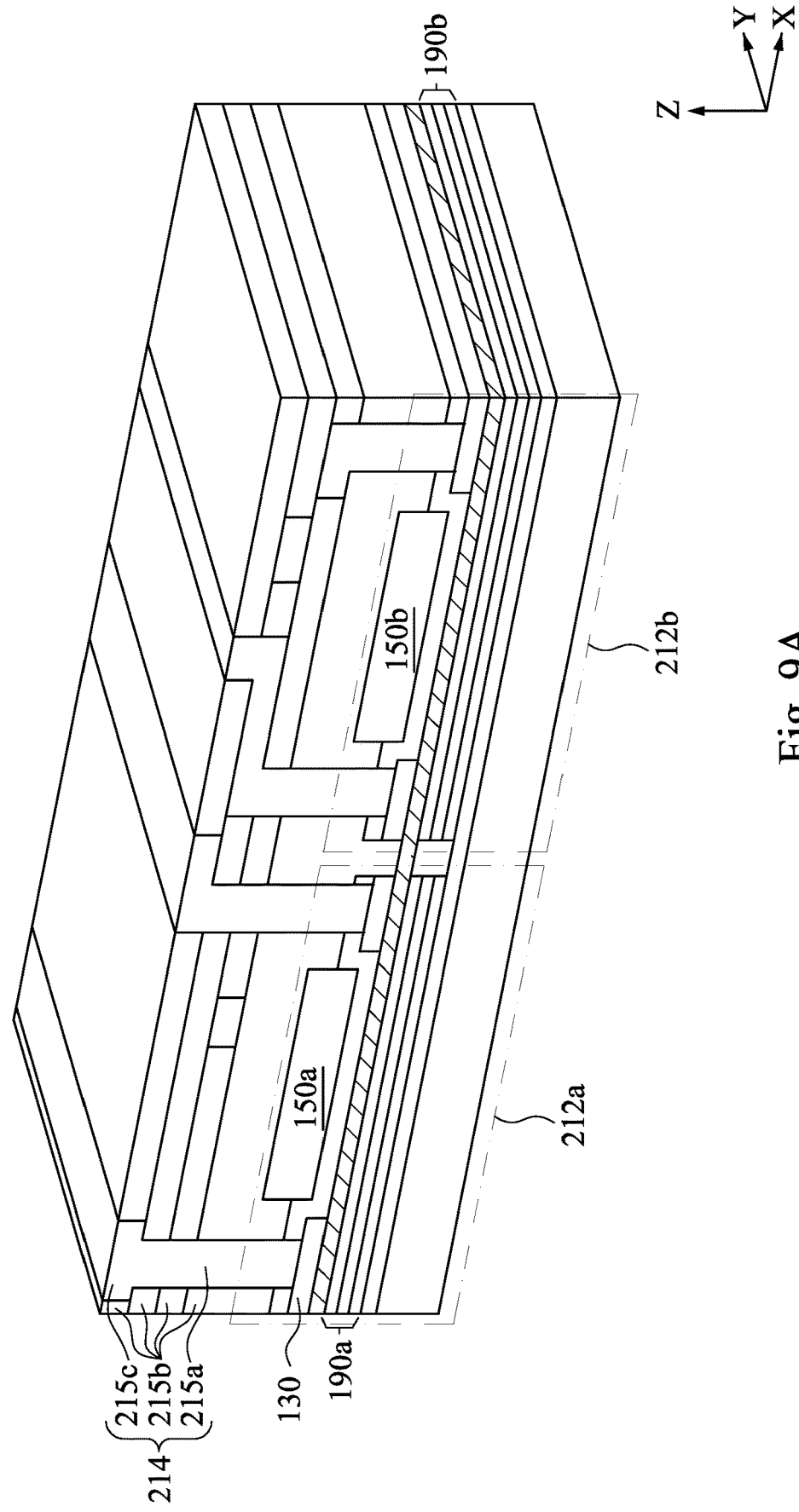
FIGS. 9A-9C illustrate cross-sectional view of a semiconductor device at various stages of the method of FIG. 7 in accordance with some embodiments of the present disclosure.
Figure 9B:
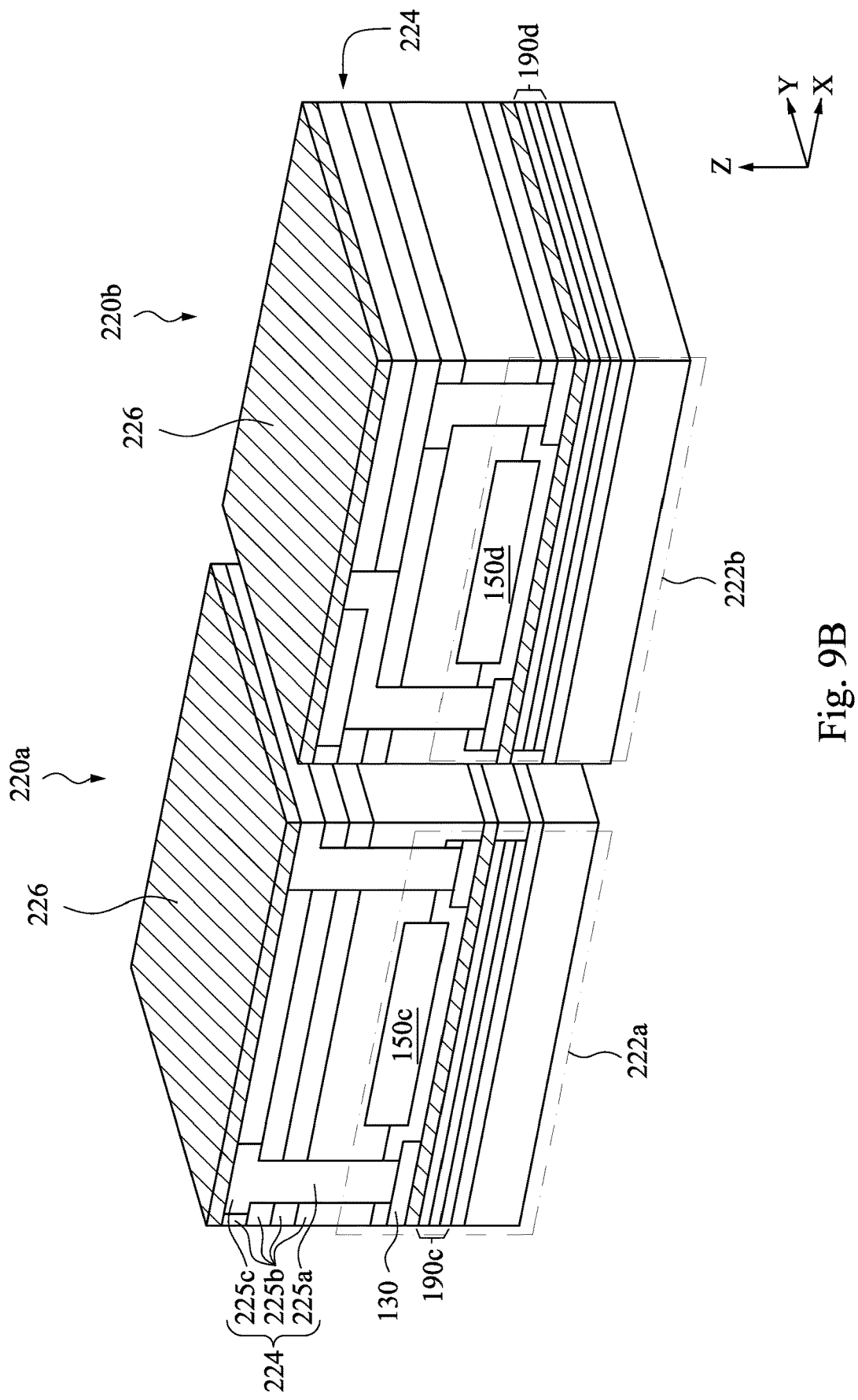
Figure 9C:
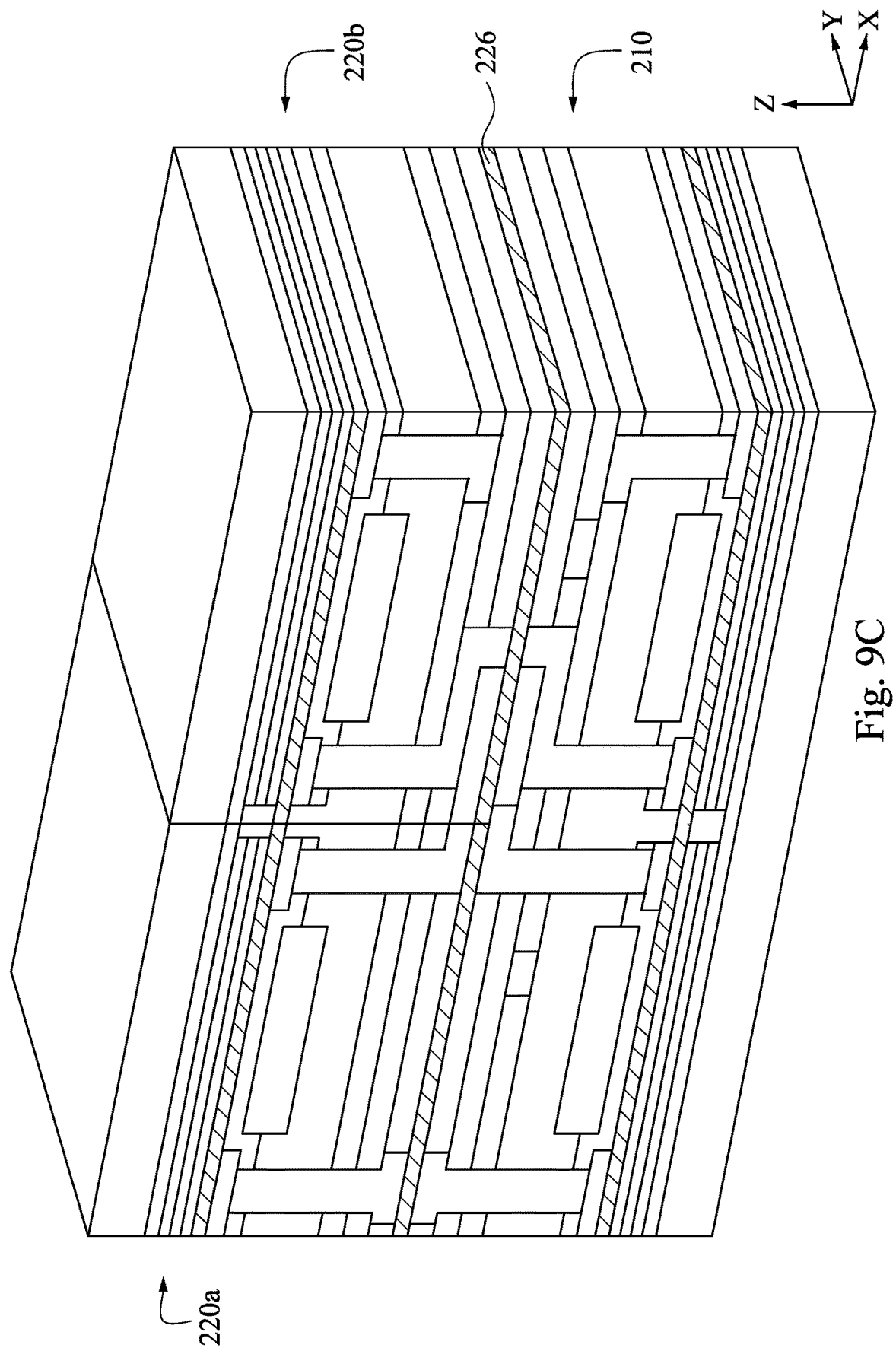

FIGS. 9A-9C are cross-sectional views of the method M80 for manufacturing a semiconductor structure at various stages according to some embodiments. Throughout the various views and illustrative embodiments, like reference numbers are used to designate like elements. Reference is made to FIG. 9A, a first device 210 is provided. The first device 210 of FIG. 9A is the same as the first device 210 of FIG. 8A, and the detailed description is not repeated herein.

Reference is made to FIG. 9B, a plurality of second device 220a and 220b are provided. In FIG. 9B, the second device 220a and 220b are functional devices, e.g., a CMOS or an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, bipolar transistors, high voltage transistors, high frequency transistors, other memory cells, and combinations thereof.

In some embodiments, the second device 220a (220b) includes a semiconductor device 222a (222b), a second IMD structure 224 formed on the semiconductor device 222a (222b), and a 2D insulating layer 226 formed on the second IMD structure 224. In some embodiments, the semiconductor devices 222a and 222b may be the semiconductor device shown in FIG. 2H (or FIG. 4H or FIG. 6J), and the present disclosure is not limited in this respect. In FIG. 9B, the structures of FIG. 2H are used for illustration purposes only. The semiconductor devices 222a and 222b may be different. For example, the gate electrodes 150c and 150d in the semiconductor devices 222a and 222b may have different work functions and/or different materials. In some other examples, the channel layers 190c and 190d in the semiconductor devices 222a and 222b may have different materials. In some embodiments, the 2D insulating layer 226 may have similar (or the same) material to the 2D insulating layer 120 of FIG. 2H.

The second IMD structure 224 includes conductive lines 225a, dielectric layers 225b, and a plurality of top conductive lines 225c. The dielectric layers 225b are deposited over the semiconductor devices 222a and 222b, and the conductive lines 225a are embedded in the dielectric layers 225b. The top conductive lines 225c are embedded in the topmost dielectric layer 225b. The conductive lines 225a interconnect one of the top conductive lines 225c to one of the source/drain contacts 130. It is noted that the route of the conductive lines 225a in FIG. 9B are illustrated only, and the present disclosure is not limited in this respect. The 2D insulating layer 226 covers the second IMD structure 224, i.e., the top conductive lines 225c.

Reference is made to FIG. 9C. The second devices 220a and 220b are bound to the first device 210 using the 2D insulating layers 226 as bonding layers, as shown in FIG. 9C. Since the bonding process is similar to the bonding process of FIG. 8C, the detailed description is not repeated herein.

Figure 10:
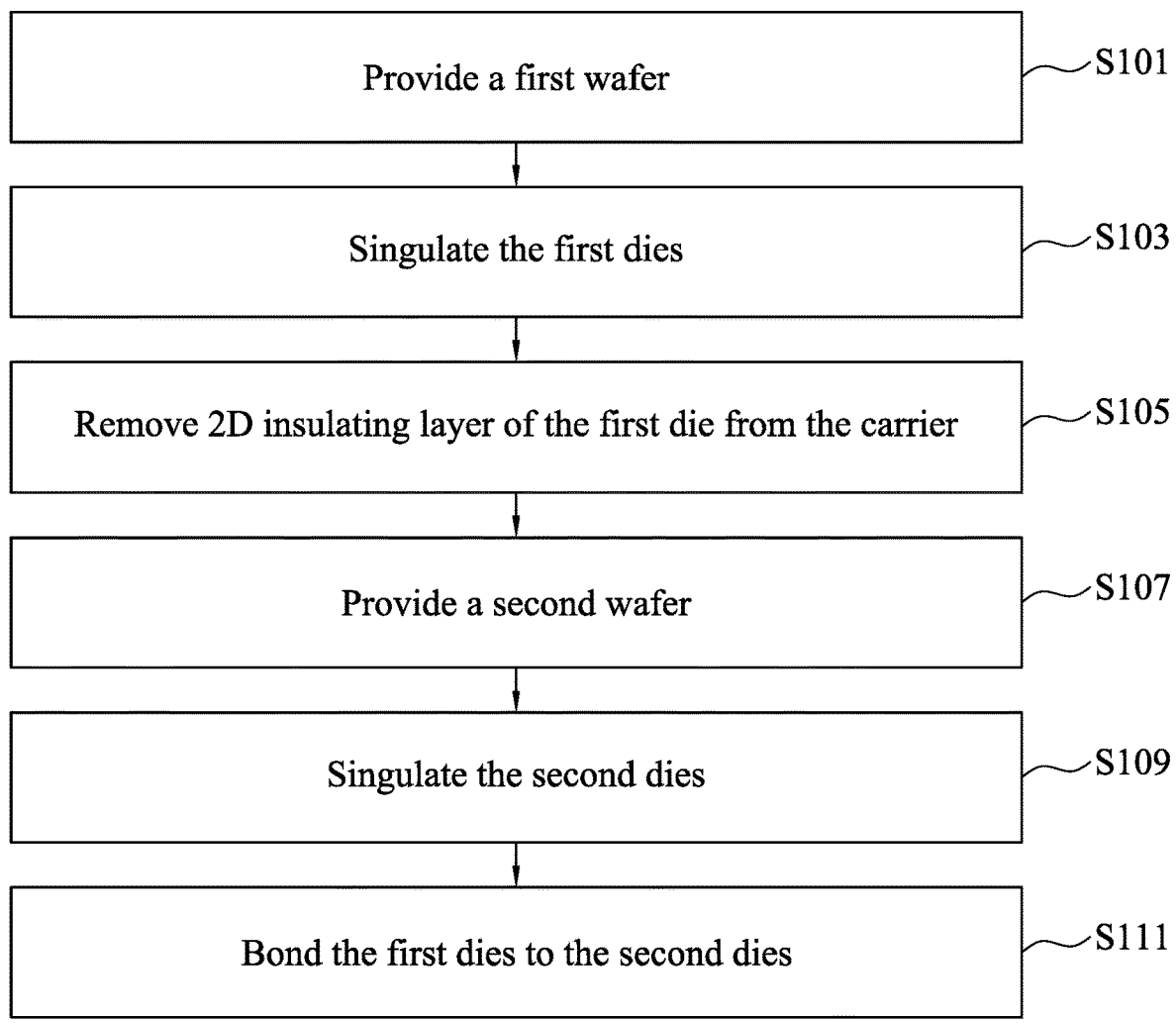
FIG. 10 is a flowchart of a method for making a semiconductor device according to aspects of the present disclosure in various embodiments.
Figure 11A:
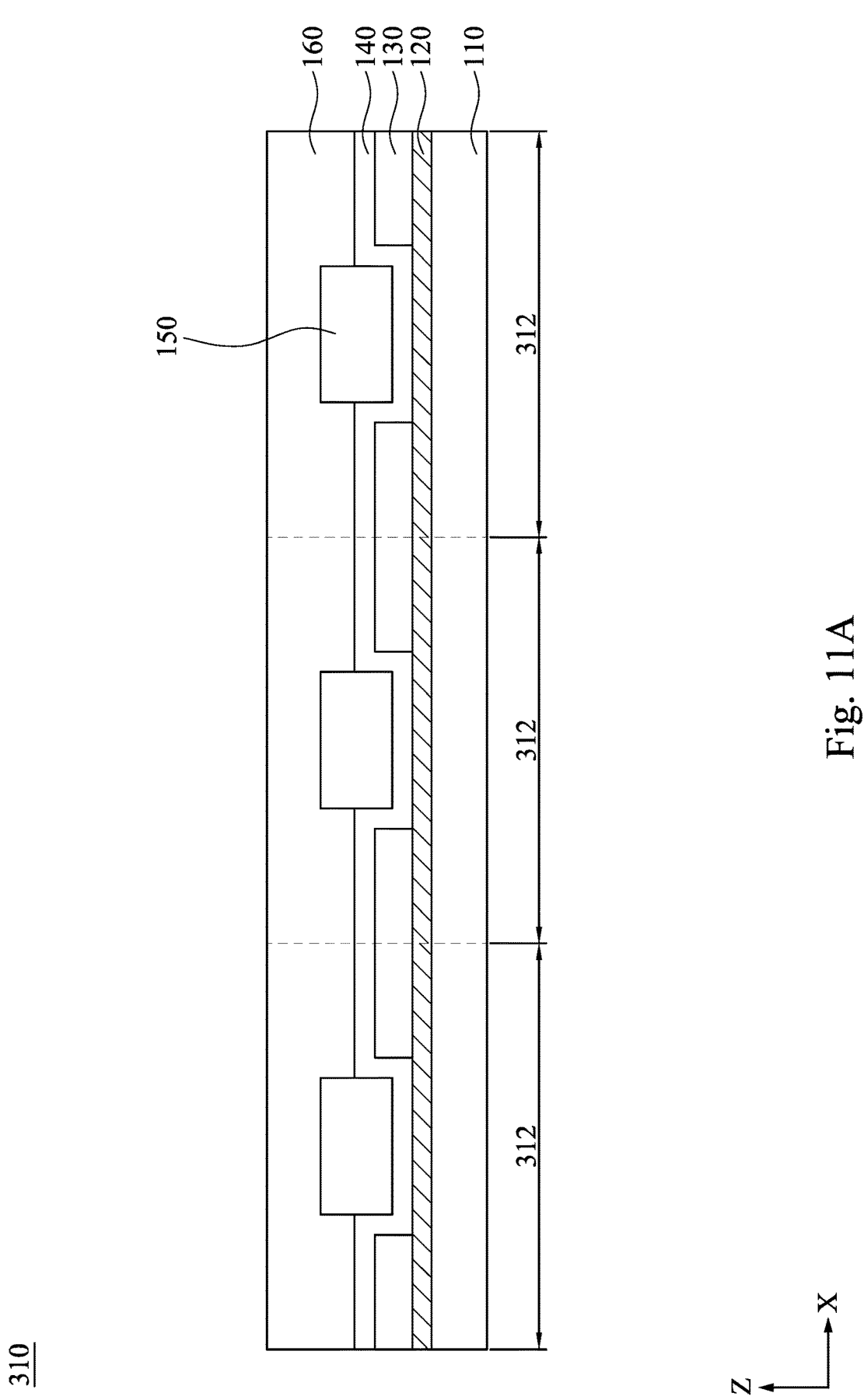
FIGS. 11A-11F illustrate cross-sectional view of a semiconductor device at various stages of the method of FIG. 10 in accordance with some embodiments of the present disclosure.

In some embodiments, one or more singulating process(es) may be performed during the methods M10, M30, M50, and M80. FIG. 10 is a flowchart of a method M100 for making a semiconductor device according to aspects of the present disclosure in various embodiments. Various operations of the method M100 are discussed in association with cross-section diagrams FIGS. 11A-11F. Throughout the various views and illustrative embodiments, like reference numbers are used to designate like elements. In operation S101 of method M100, a first wafer 310 is provided, as shown in FIG. 11A. The first wafer 310 includes a plurality of first dies 312 connected to each other. Each of the first dies 312 includes the structure of FIG. 2D, the structure of FIG. 4D, the structure of FIG. 6D, or the structure of FIG. 8B or 9B. That is, the operation S101 includes the operations S12 to S18 of the method M10, the operations S32 to S40 of the method M30, the operations S52 to S60 of the method M50, or the operation S84 of the method M80. In FIG. 11A, the structures of FIG. 2D are used for illustration purposes only.

Figure 11B:
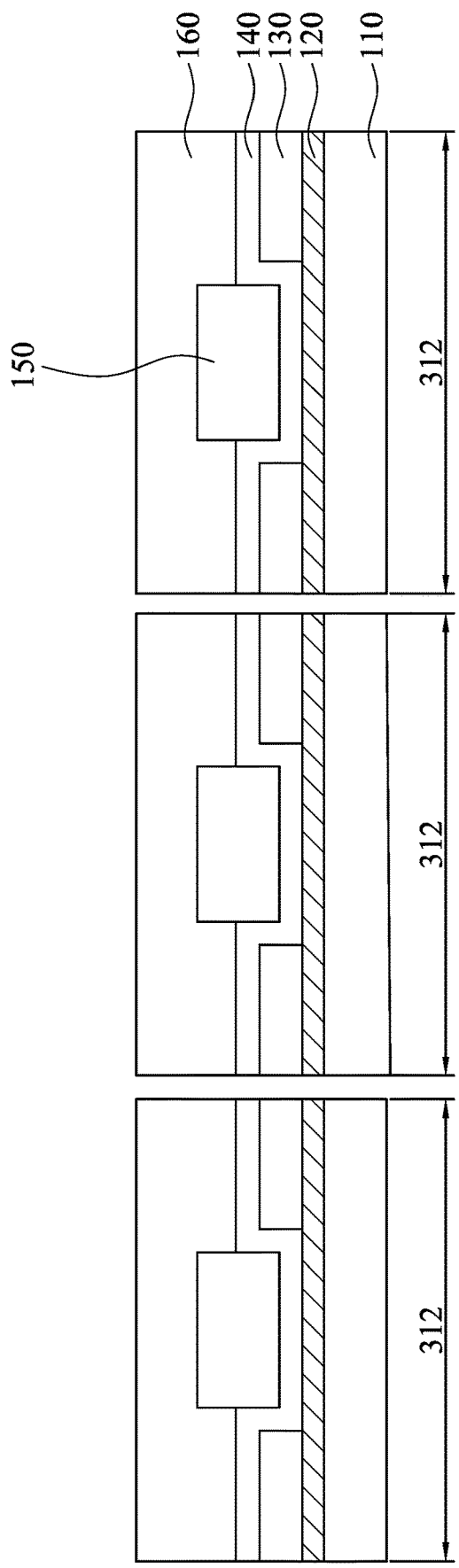

In operation S103 of method M100, the first dies 312 of the first wafer 310 are singulated, as shown in FIG. 11B. To singulate the first die 312 of the first wafer 310 from adjacent first dies 312, tape (not shown) may be applied to the first wafer 310. The tape may include dicing tape that supports the first wafer 310 during the singulation process. The first wafer 310 may be singulated using a laser cutting device, saw blade, or other suitable techniques.

Figure 11C:
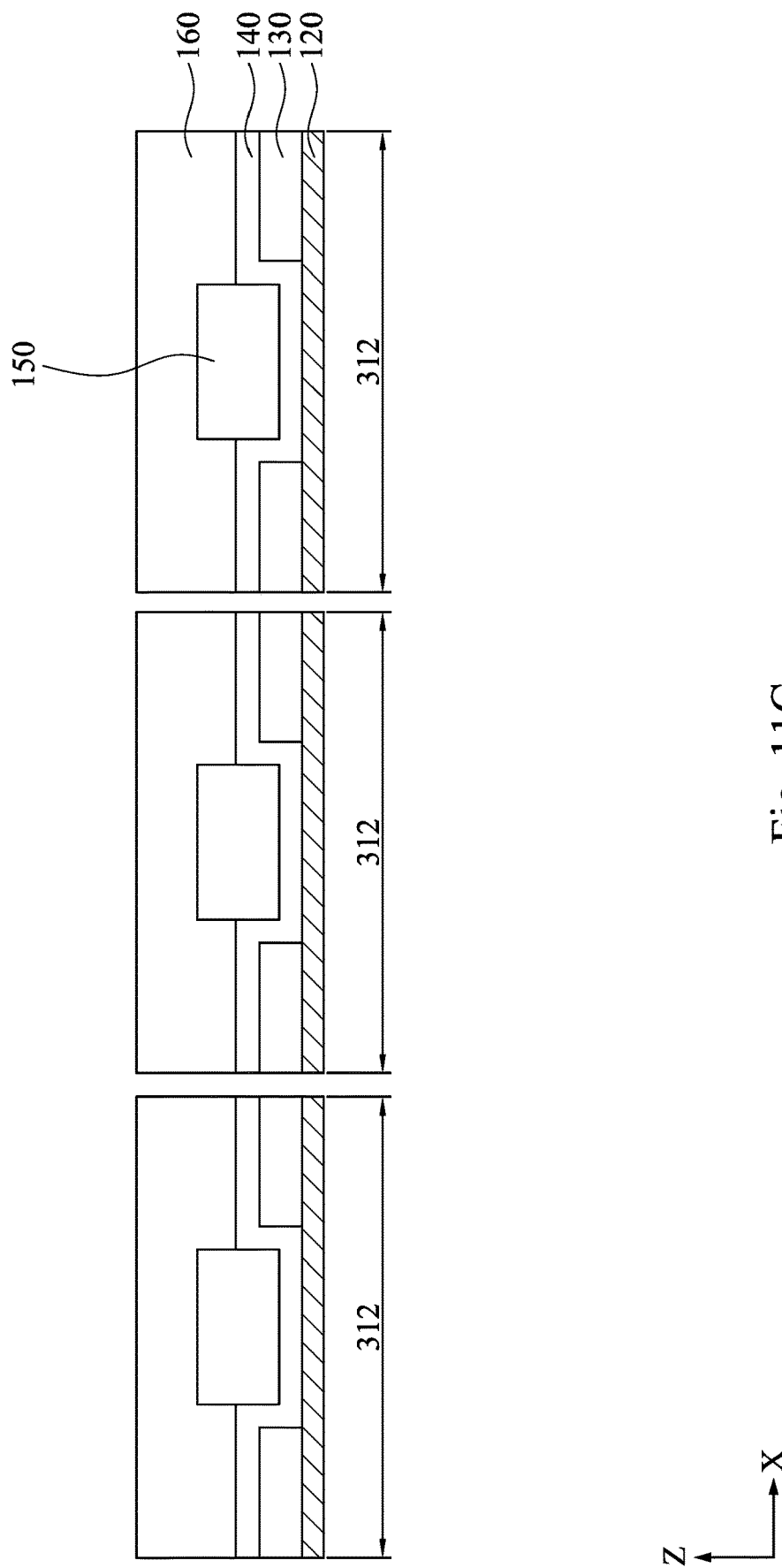

In operation S105 of method M100, the 2D insulating layer 120 of the first die 312 is removed from the carrier 110, as shown in FIG. 11C. Since the details of the removal process is mentioned above (i.e., the operations S20, S42, and S62), the detailed description is not repeated herein.

Figure 11D:
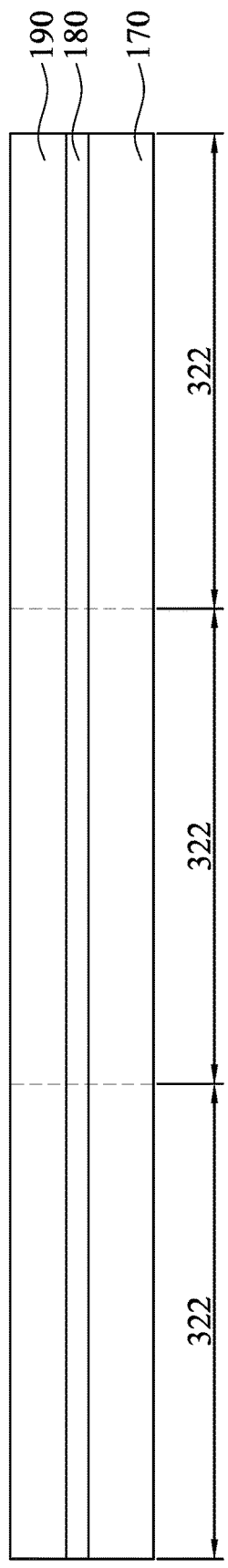

In operation S107 of method M100, a second wafer 320 is provided, as shown in FIG. 11D. The second wafer 320 includes a plurality of second dies 322 connected to each other. Each of the second dies 322 includes the structure of FIG. 2F, the structure of FIG. 4F, the structure of FIG. 6F, or the structure of FIG. 8A or 9A. That is, the operation S101 includes the operation S22 of the method M10, the operation S44 of the method M30, the operation S64 of the method M50, or the operation S82 of the method M80.

Figure 11E:
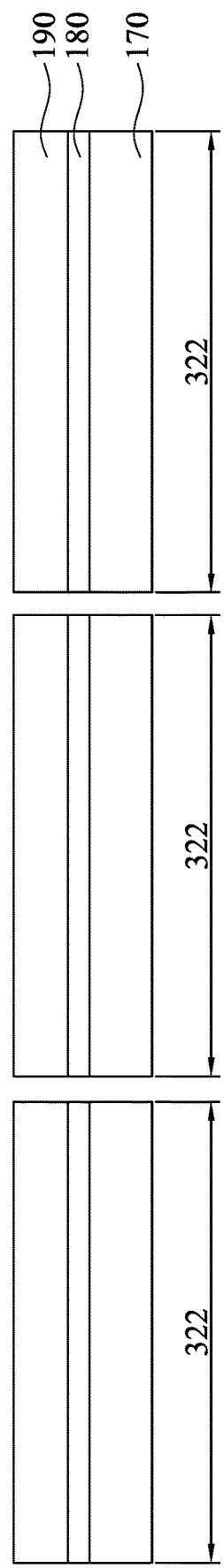

In operation S109 of method M100, the second dies 322 of the second wafer 320 are singulated, as shown in FIG. 11E. To singulate the second die 322 of the second wafer 320 from adjacent second dies 322, tape (not shown) may be applied to the second wafer 320. The tape may include dicing tape that supports the second wafer 320 during the singulation process. The second wafer 320 may be singulated using a laser cutting device, saw blade, or other suitable techniques.

Figure 11F:
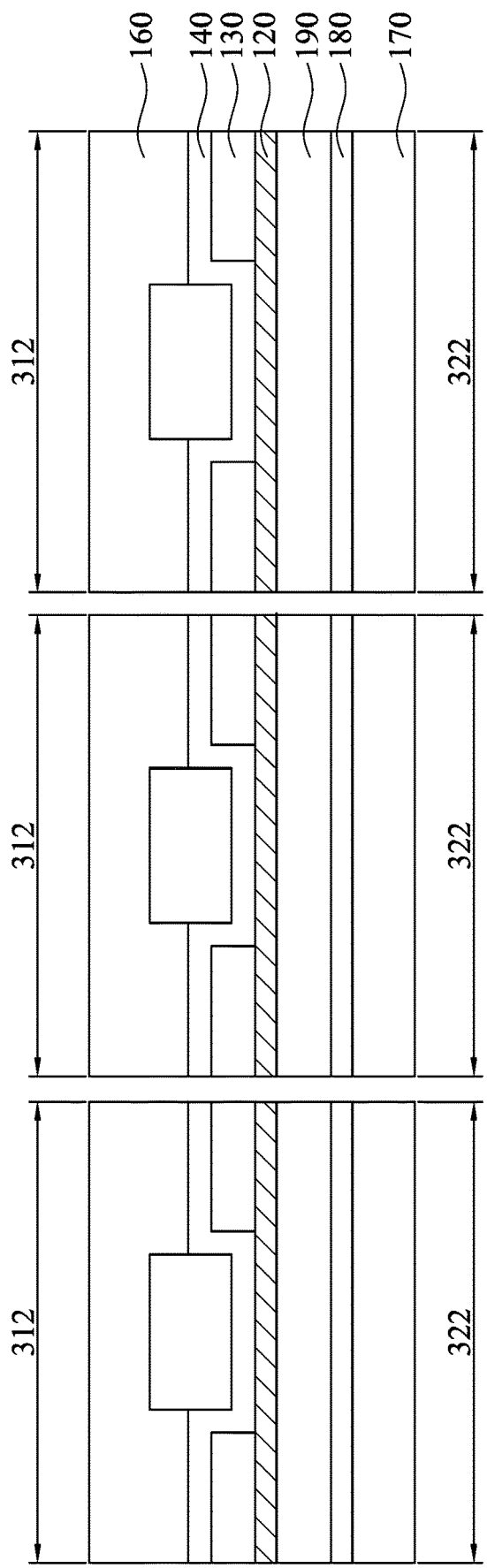

In operation S111 of method M100, the first die 312 is bonded on the second die 322, as shown in FIG. 11F. Since the details of the bonding process is mentioned above (i.e., the operations S24, S46, S66, and S86), the detailed description is not repeated herein.

Figure 12:
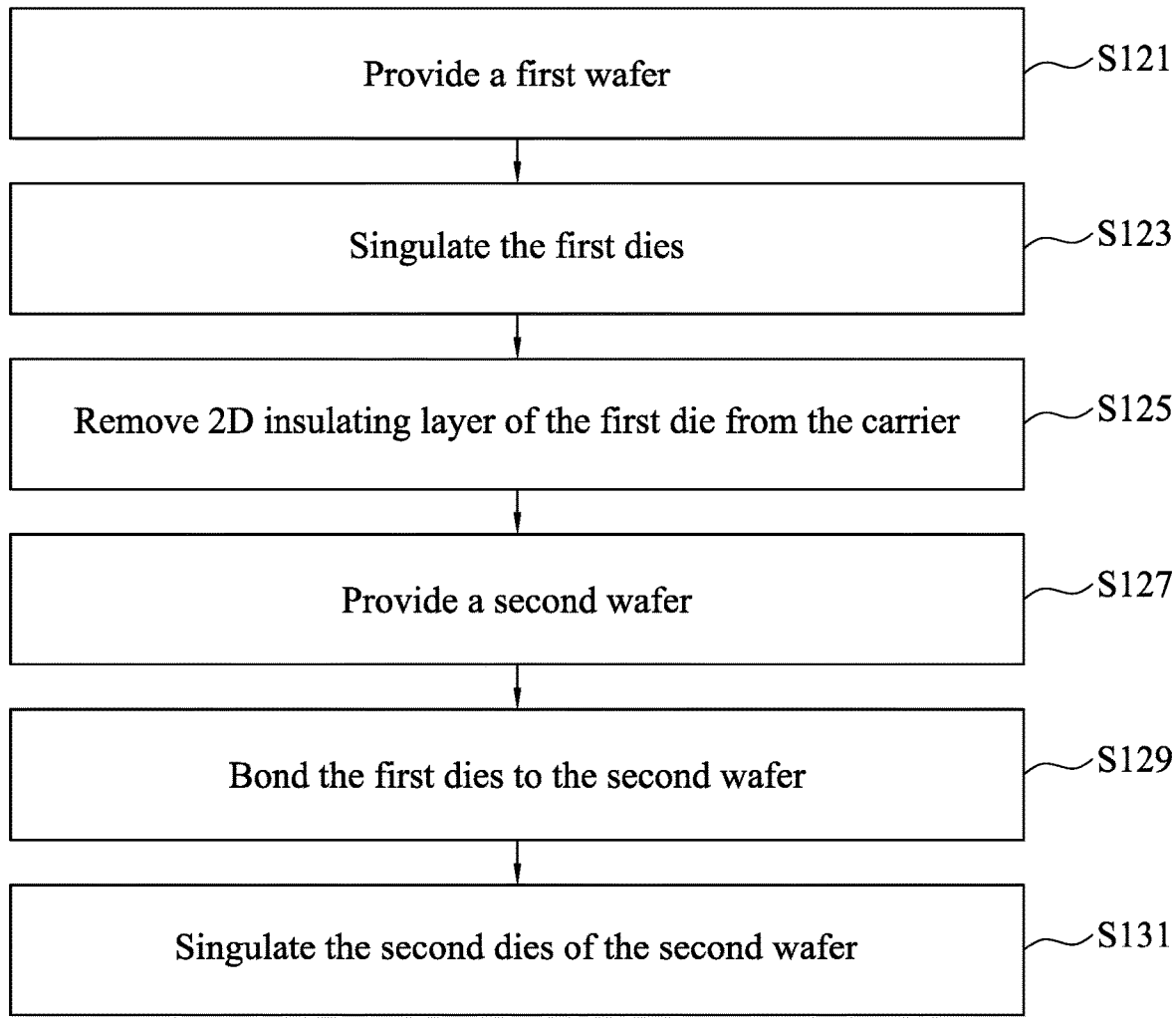
FIG. 12 is a flowchart of a method for making a semiconductor device according to aspects of the present disclosure in various embodiments.
Figure 13A:
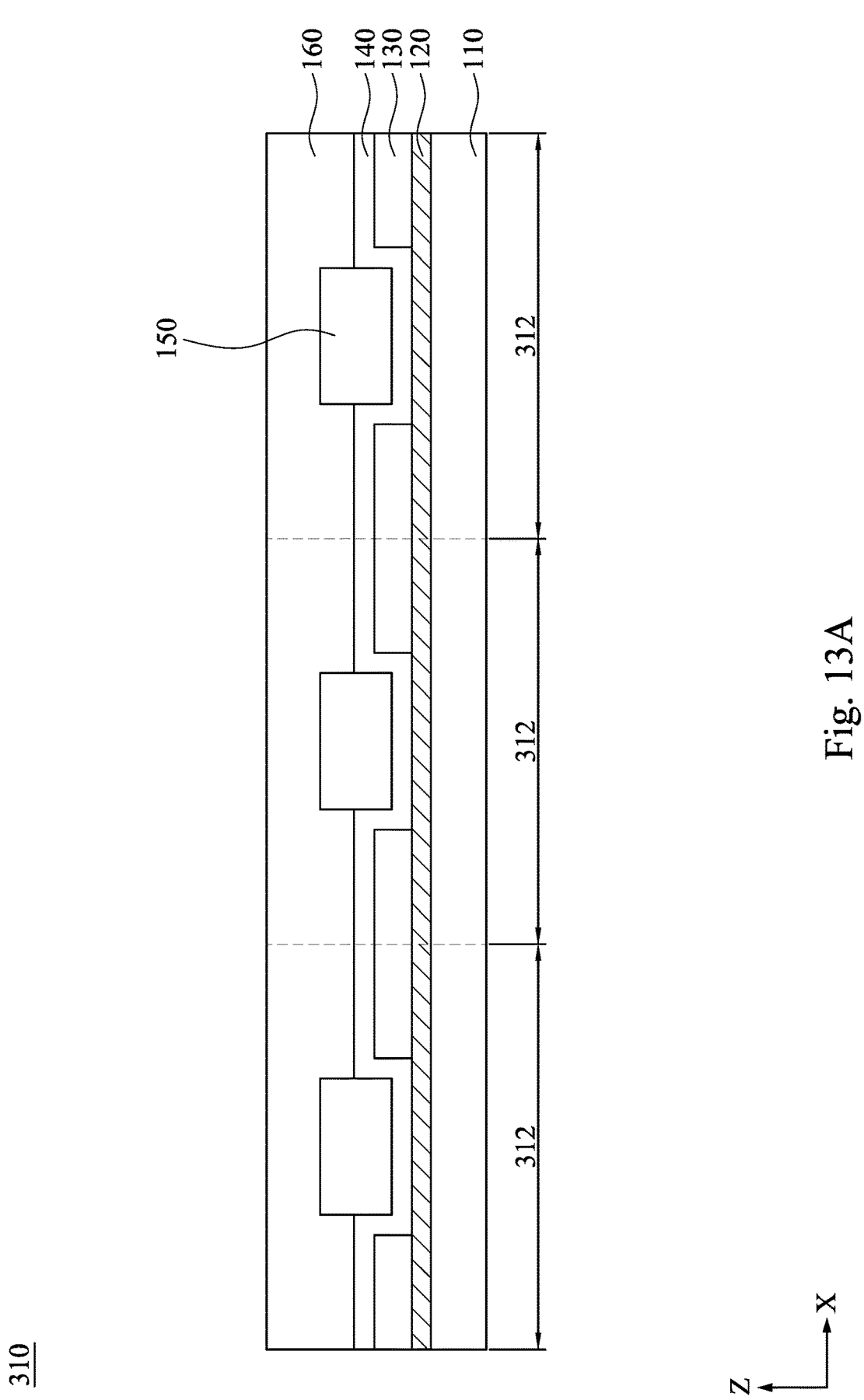
FIGS. 13A-13F illustrate cross-sectional view of a semiconductor device at various stages of the method of FIG. 12 in accordance with some embodiments of the present disclosure.

FIG. 12 is a flowchart of a method M120 for making a semiconductor device according to aspects of the present disclosure in various embodiments. Various operations of the method M120 are discussed in association with cross-section diagrams FIGS. 13A-13F. Throughout the various views and illustrative embodiments, like reference numbers are used to designate like elements. In operation S121 of method M120, a first wafer 310 is provided, as shown in FIG. 13A. The first wafer 310 includes a plurality of first dies 312 connected to each other. Each of the first dies 312 includes the structure of FIG. 2D, the structure of FIG. 4D, the structure of FIG. 6D, or the structure of FIG. 8B or 9B. That is, the operation S101 includes the operations S12 to S18 of the method M10, the operations S32 to S40 of the method M30, the operations S52 to S60 of the method M50, or the operation S84 of the method M80. In FIG. 11A, the structures of FIG. 2D are used for illustration purposes only.

Figure 13B:
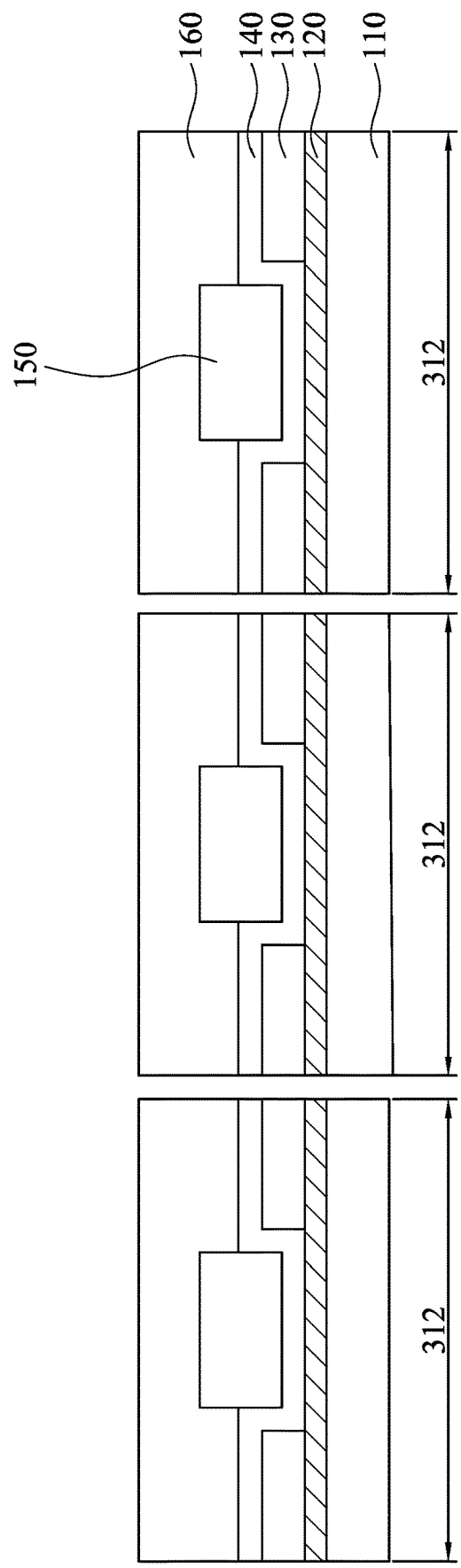

In operation S123 of method M120, the first dies 312 of the first wafer 310 are singulated, as shown in FIG. 13B. To singulate the first die 312 of the first wafer 310 from adjacent first dies 312, tape (not shown) may be applied to the first wafer 310. The tape may include dicing tape that supports the first wafer 310 during the singulation process. The first wafer 310 may be singulated using a laser cutting device, saw blade, or other suitable techniques.

Figure 13C:
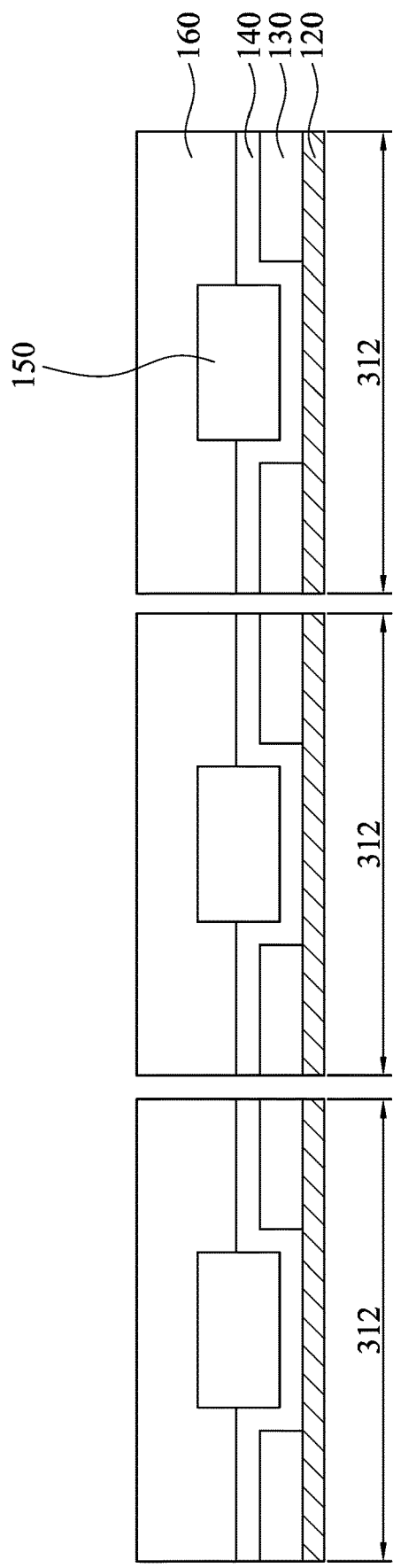

In operation S125 of method M100, the 2D insulating layer 120 of the first die 312 is removed from the carrier 110, as shown in FIG. 13C. Since the details of the removal process is mentioned above (i.e., the operations S20, S42, and S62), the detailed description is not repeated herein.

Figure 13D:
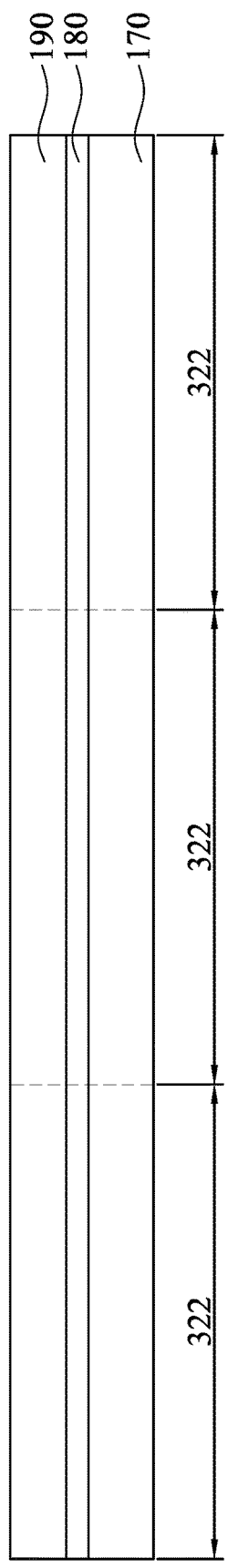

In operation S127 of method M100, a second wafer 220 is provided, as shown in FIG. 13D. The second wafer 320 includes a plurality of second dies 322 connected to each other. Each of the second dies 322 includes the structure of FIG. 2F, the structure of FIG. 4F, the structure of FIG. 6F, or the structure of FIG. 8A or 9A. That is, the operation S101 includes the operation S22 of the method M10, the operation S44 of the method M30, the operation S64 of the method M50, or the operation S82 of the method M80.

Figure 13E:
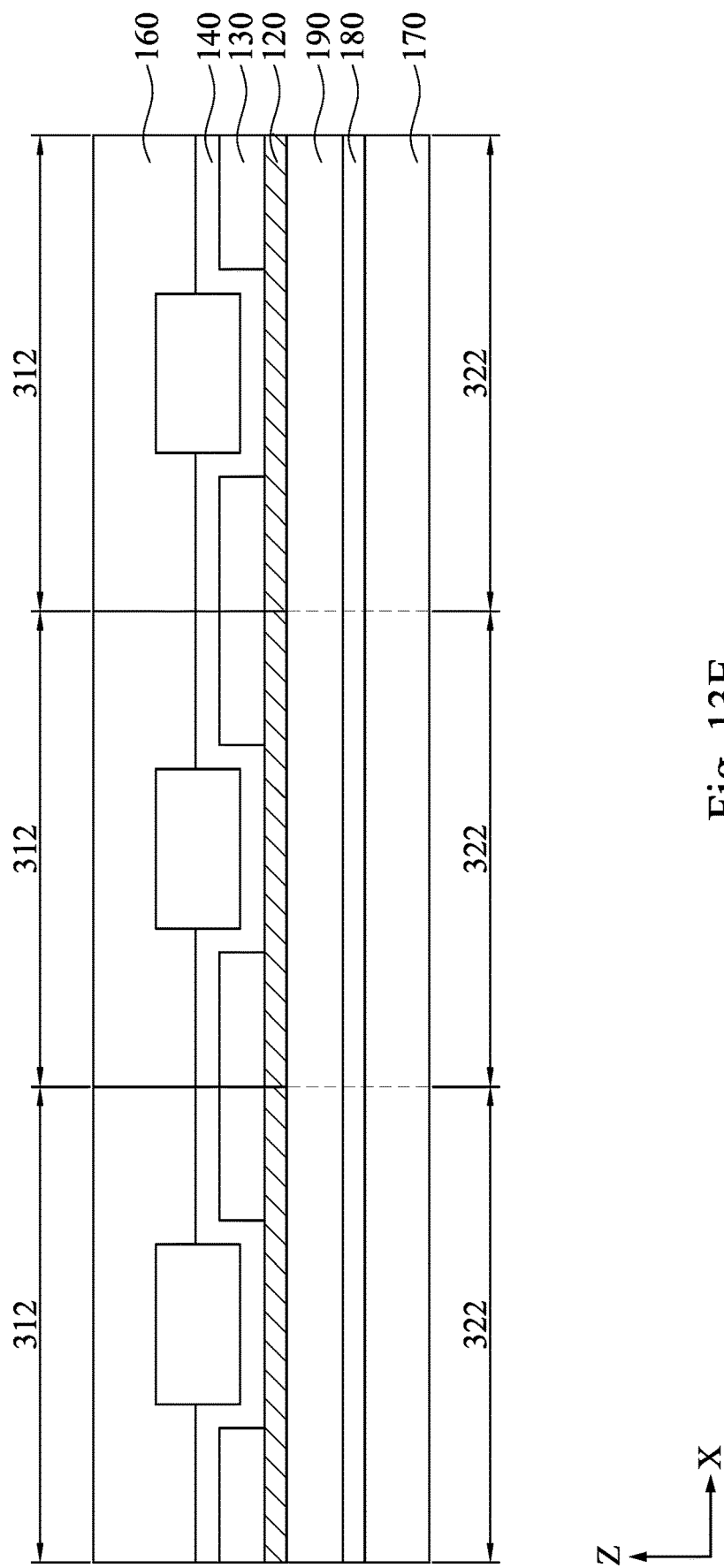

In operation S129 of method M100, the first die 312 is bonded to the second wafer 320, as shown in FIG. 13E. Since the details of the bonding process is mentioned above (i.e., the operations S24, S46, S66, and S86), the detailed description is not repeated herein.

Figure 13F:
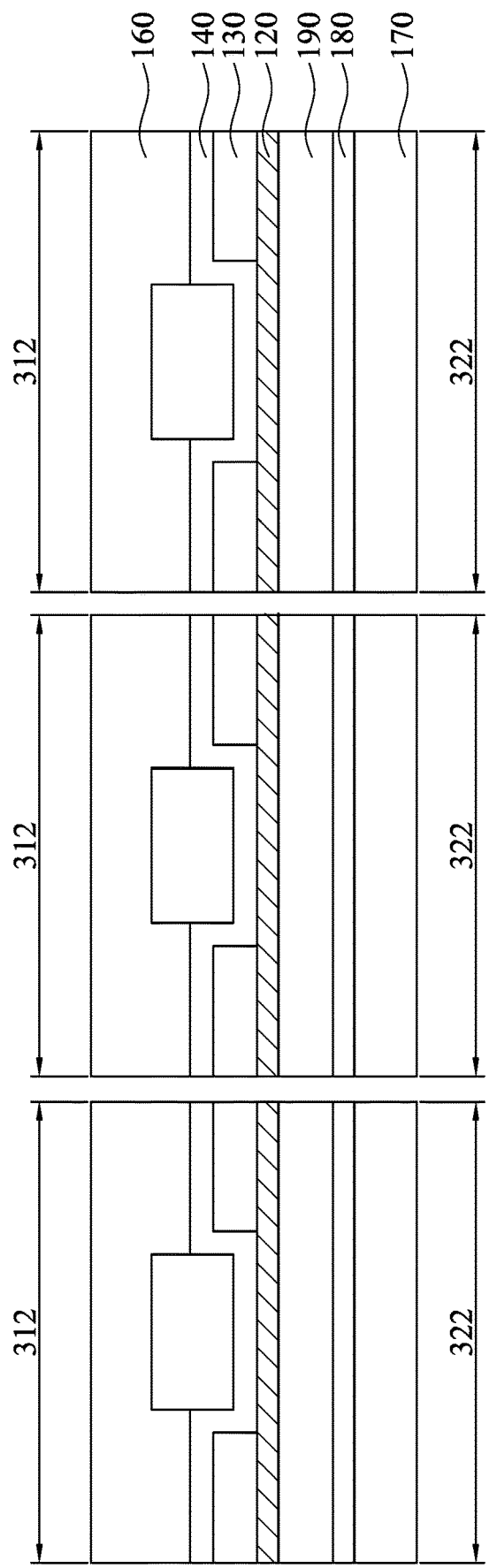

In operation S131 of method M100, the second dies 322 (with the first dies 312 bonded thereon) of the second wafer 320 are singulated, as shown in FIG. 13F. To singulate the second die 322 of the second wafer 320 from adjacent second dies 322, tape (not shown) may be applied to the second wafer 320. The tape may include dicing tape that supports the second wafer 320 during the singulation process. The second wafer 320 may be singulated using a laser cutting device, saw blade, or other suitable techniques.

Figure 14:
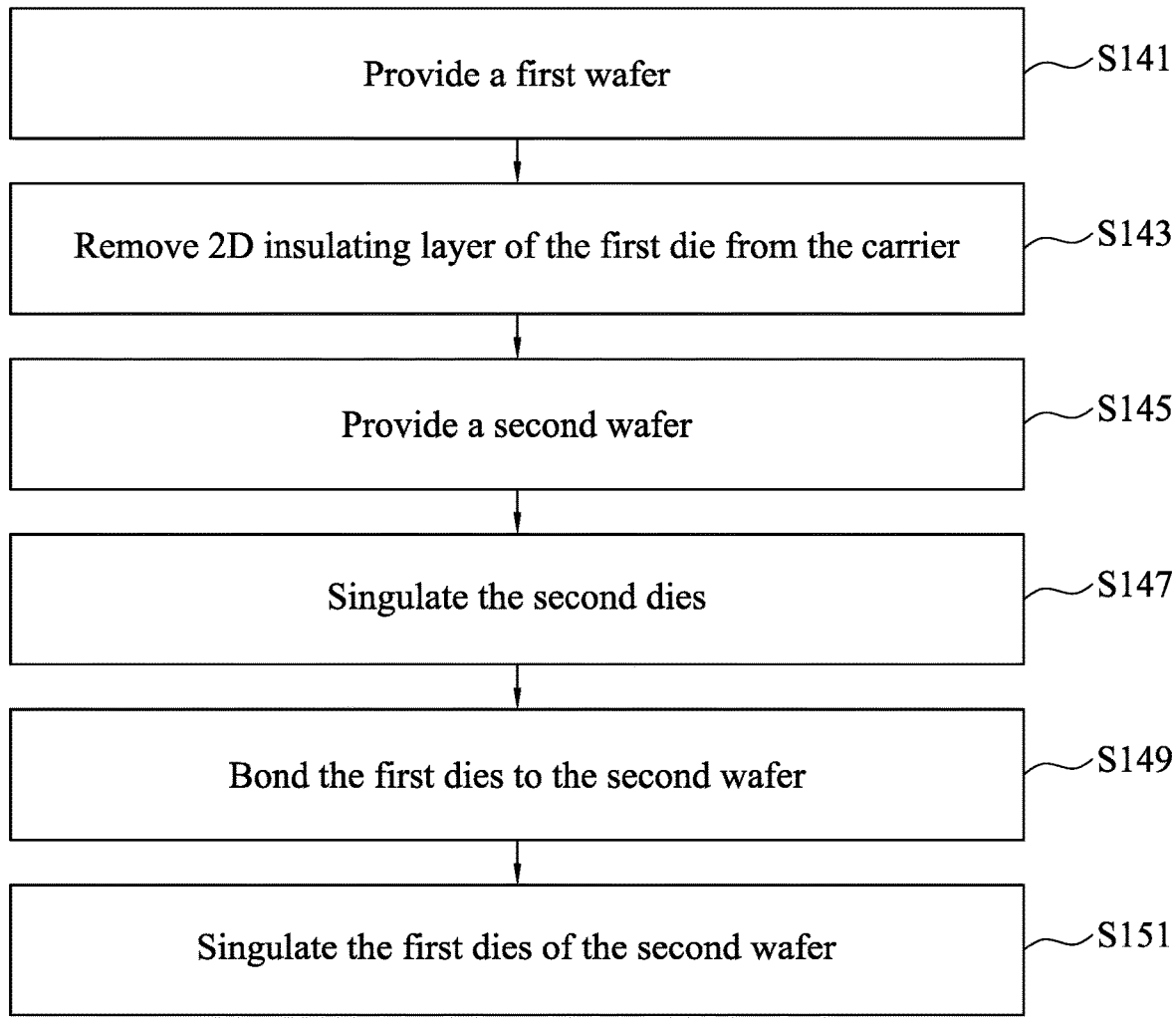
FIG. 14 is a flowchart of a method for making a semiconductor device according to aspects of the present disclosure in various embodiments.
Figure 15A:
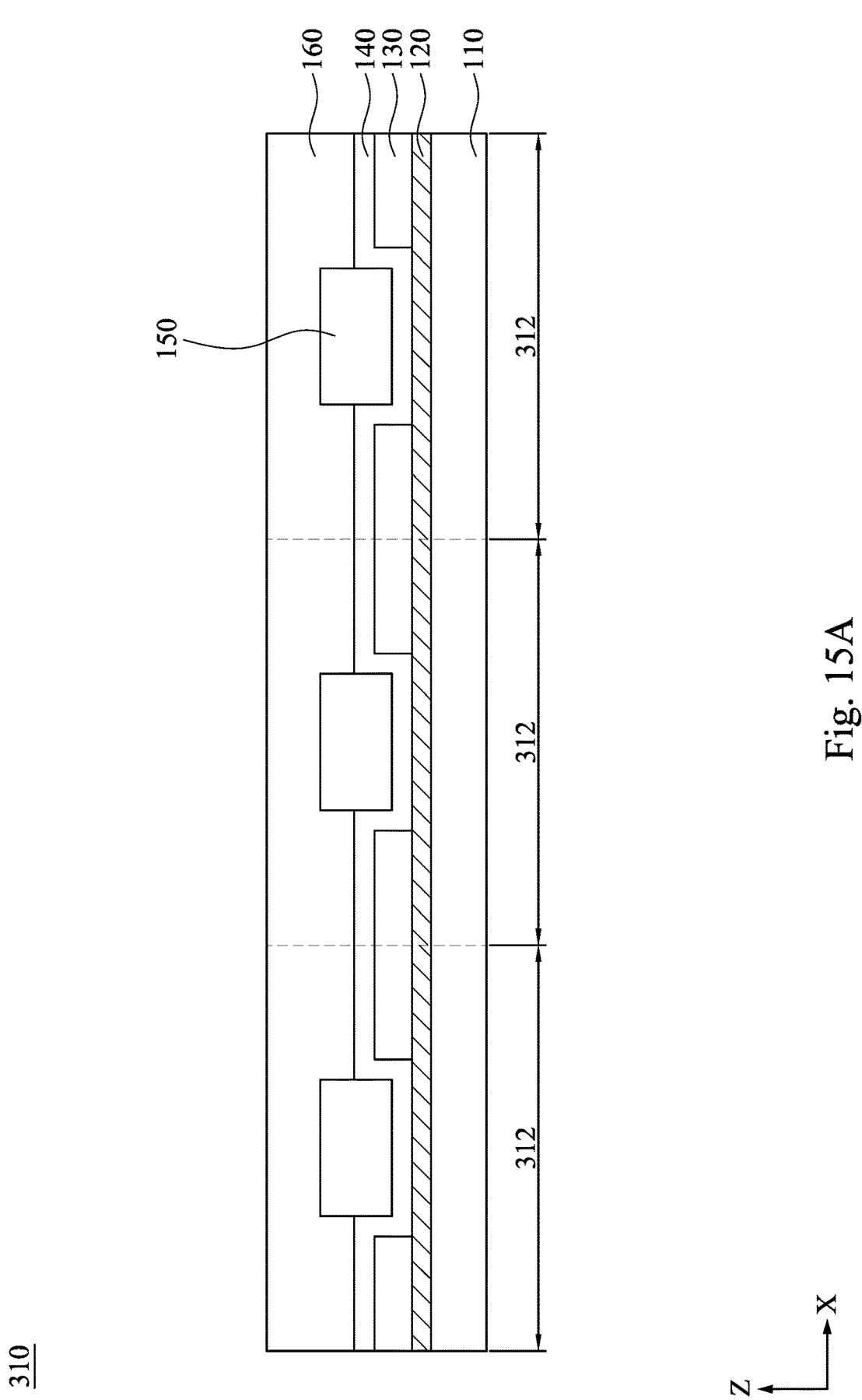
FIGS. 15A-15F illustrate cross-sectional view of a semiconductor device at various stages of the method of FIG. 14 in accordance with some embodiments of the present disclosure.

FIG. 14 is a flowchart of a method M140 for making a semiconductor device according to aspects of the present disclosure in various embodiments. Various operations of the method M140 are discussed in association with cross-section diagrams FIGS. 15A-15F. Throughout the various views and illustrative embodiments, like reference numbers are used to designate like elements. In operation S141 of method M140, a first wafer 310 is provided, as shown in FIG. 15A. The first wafer 310 includes a plurality of first dies 312 connected to each other. Each of the first dies 312 includes the structure of FIG. 2D, the structure of FIG. 4D, the structure of FIG. 6D, or the structure of FIG. 8B or 9B. That is, the operation S101 includes the operations S12 to S18 of the method M10, the operations S32 to S40 of the method M30, the operations S52 to S60 of the method M50, or the operation S84 of the method M80. In FIG. 15A, the structures of FIG. 2D are used for illustration purposes only.

Figure 15B:
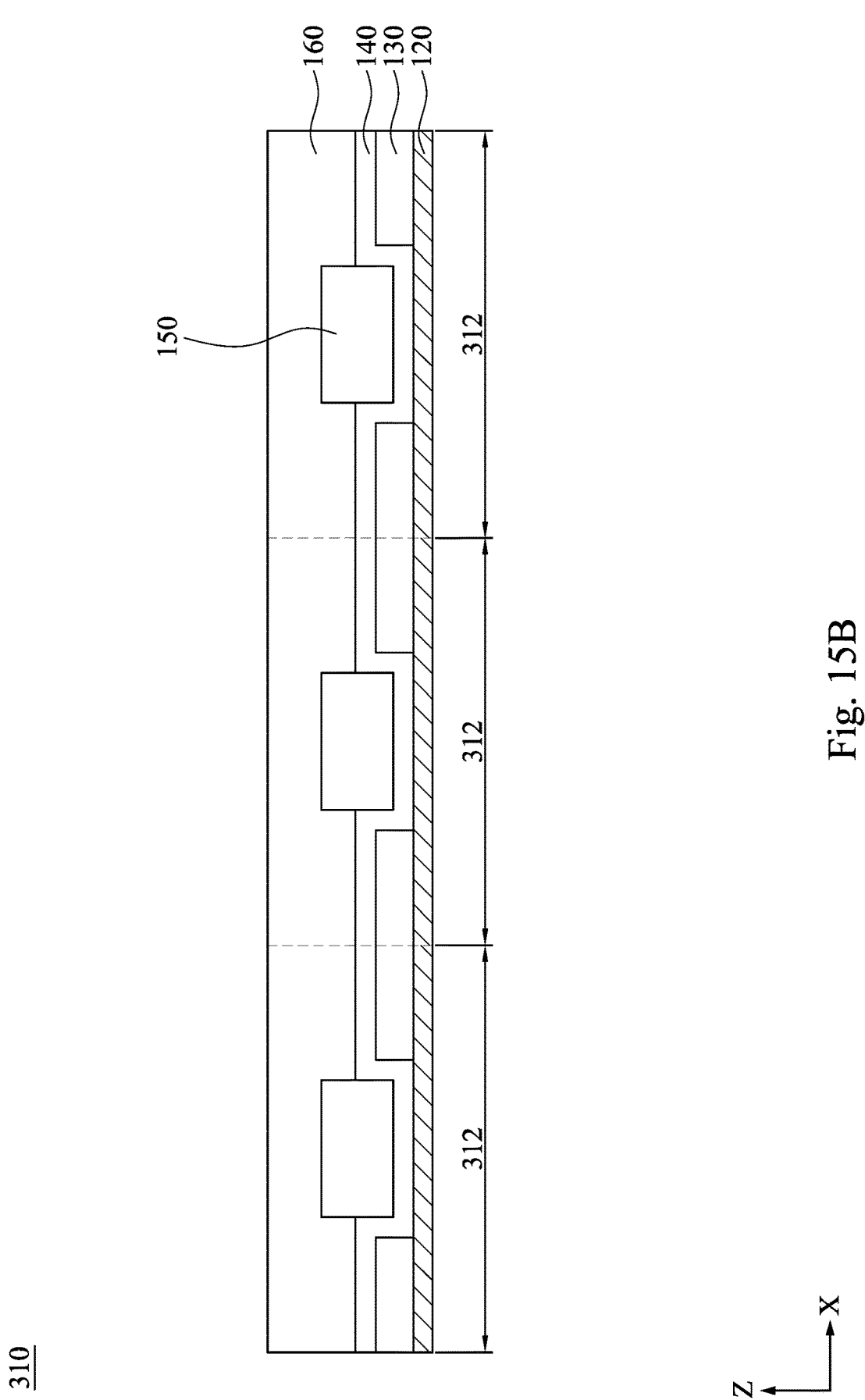

In operation S143 of method M140, the 2D insulating layer 120 of the first dies 312 is removed from the carrier 110, as shown in FIG. 15B. Since the details of the removal process is mentioned above (i.e., the operations S20, S42, and S62), the detailed description is not repeated herein.

Figure 15C:
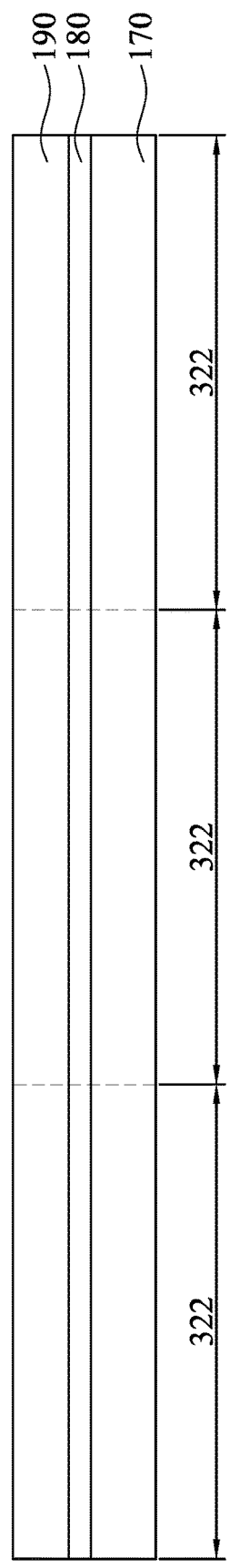

In operation S145 of method M100, a second wafer 320 is provided, as shown in FIG. 15C. The second wafer 320 includes a plurality of second dies 322 connected to each other. Each of the second dies 322 includes the structure of FIG. 2F, the structure of FIG. 4F, the structure of FIG. 6F, or the structure of FIG. 8A or 9A. That is, the operation S101 includes the operation S22 of the method M10, the operation S44 of the method M30, the operation S64 of the method M50, or the operation S82 of the method M80.

Figure 15D:
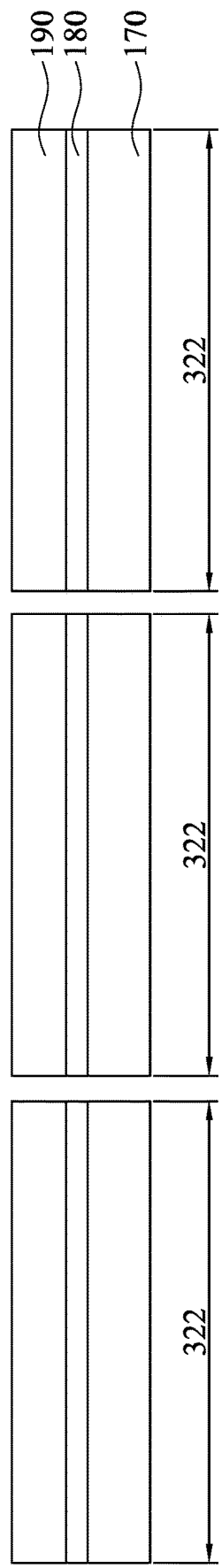

In operation S147 of method M140, the second dies 322 of the second wafer 320 are singulated, as shown in FIG. 15D. To singulate the second die 322 of the second wafer 320 from adjacent second dies 322, tape (not shown) may be applied to the second wafer 320. The tape may include dicing tape that supports the second wafer 320 during the singulation process. The second wafer 320 may be singulated using a laser cutting device, saw blade, or other suitable techniques.

Figure 15E:
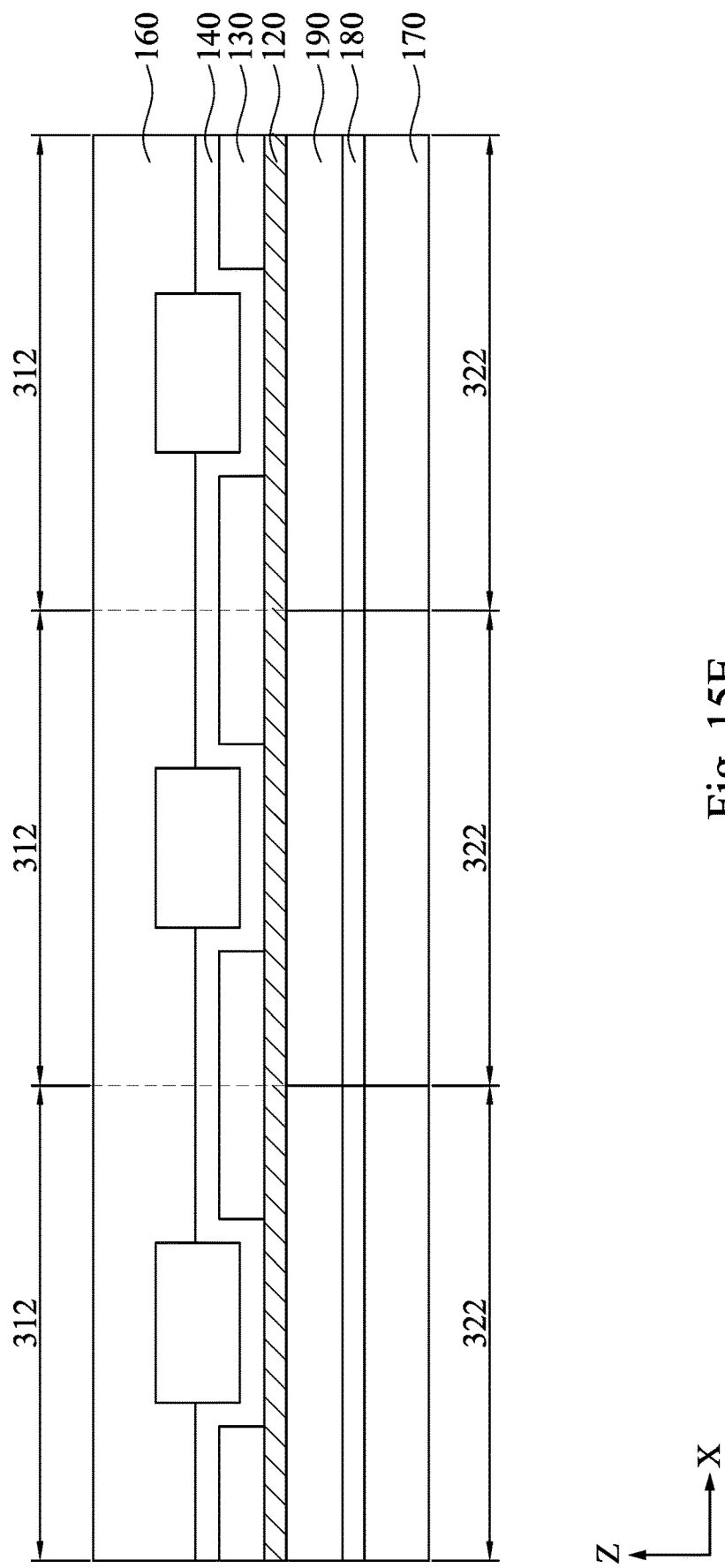

In operation S149 of method M100, the first wafer 310 is bonded to the second dies 322 of the second wafer 320, as shown in FIG. 15E. Since the details of the bonding process is mentioned above (i.e., the operations S24, S46, S66, and S86), the detailed description is not repeated herein.

Figure 15F:
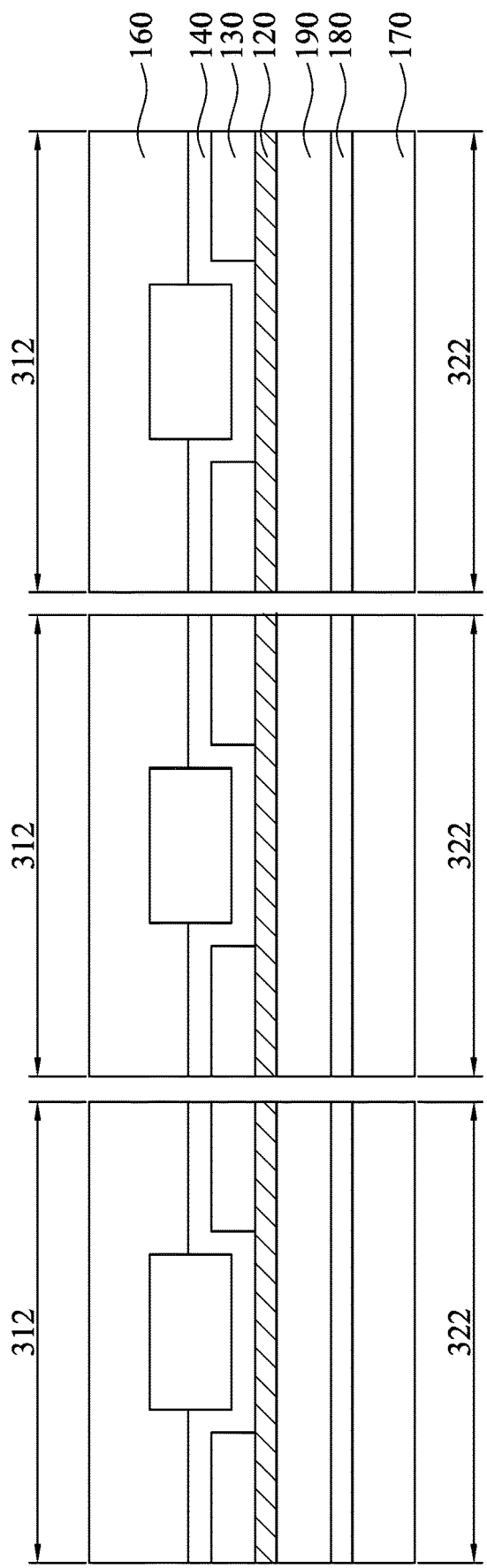

In operation S151 of method M100, the first dies 312 (with the second dies 322 bonded thereon) of the first wafer 310 are singulated, as shown in FIG. 15F. To singulate the first die 312 of the first wafer 310 from adjacent first dies 312, tape (not shown) may be applied to the first wafer 310. The tape may include dicing tape that supports the first wafer 310 during the singulation process. The first wafer 310 may be singulated using a laser cutting device, saw blade, or other suitable techniques.

Figure 16:
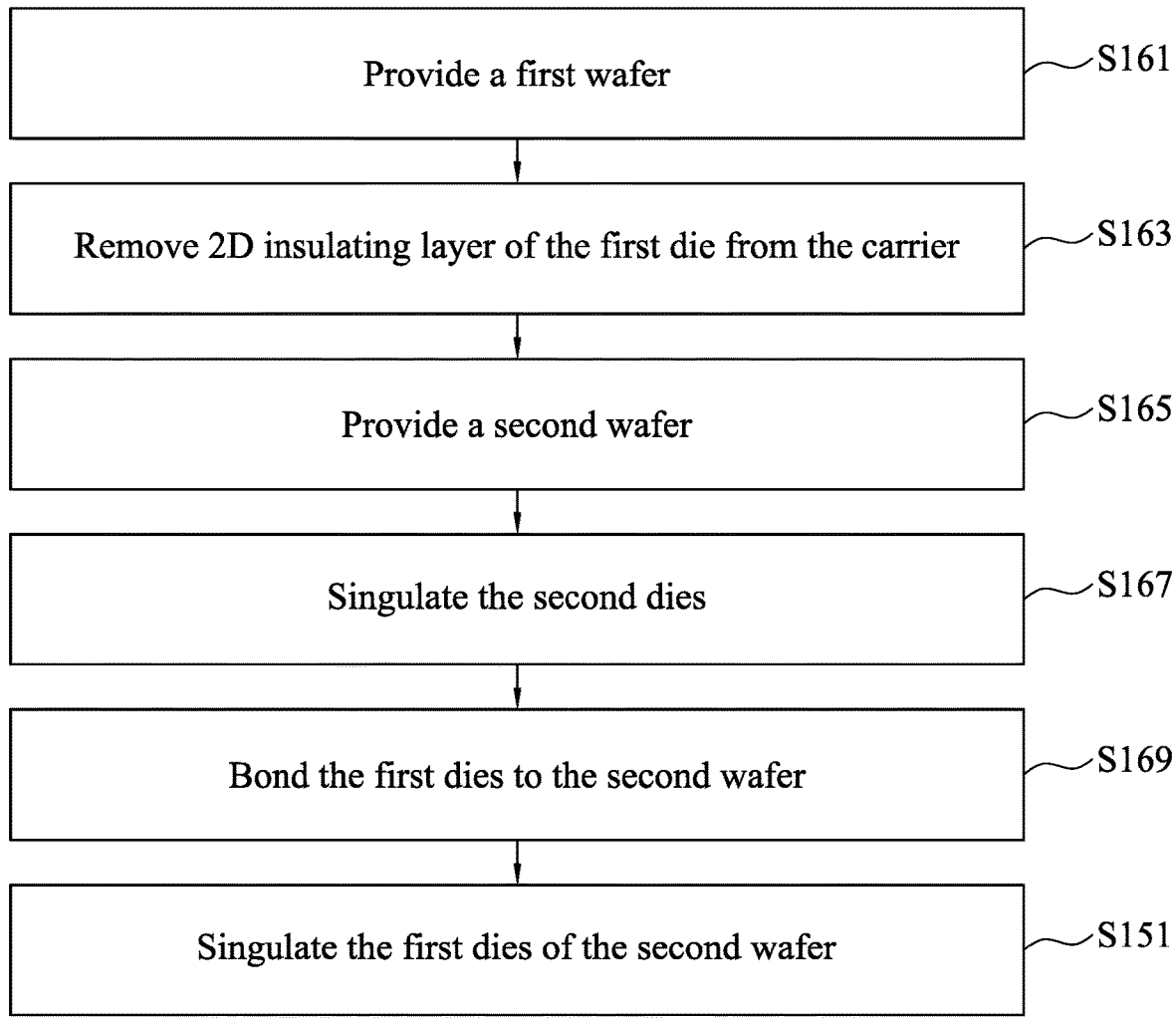
FIG. 16 is a flowchart of a method for making a semiconductor device according to aspects of the present disclosure in various embodiments.
Figure 17A:
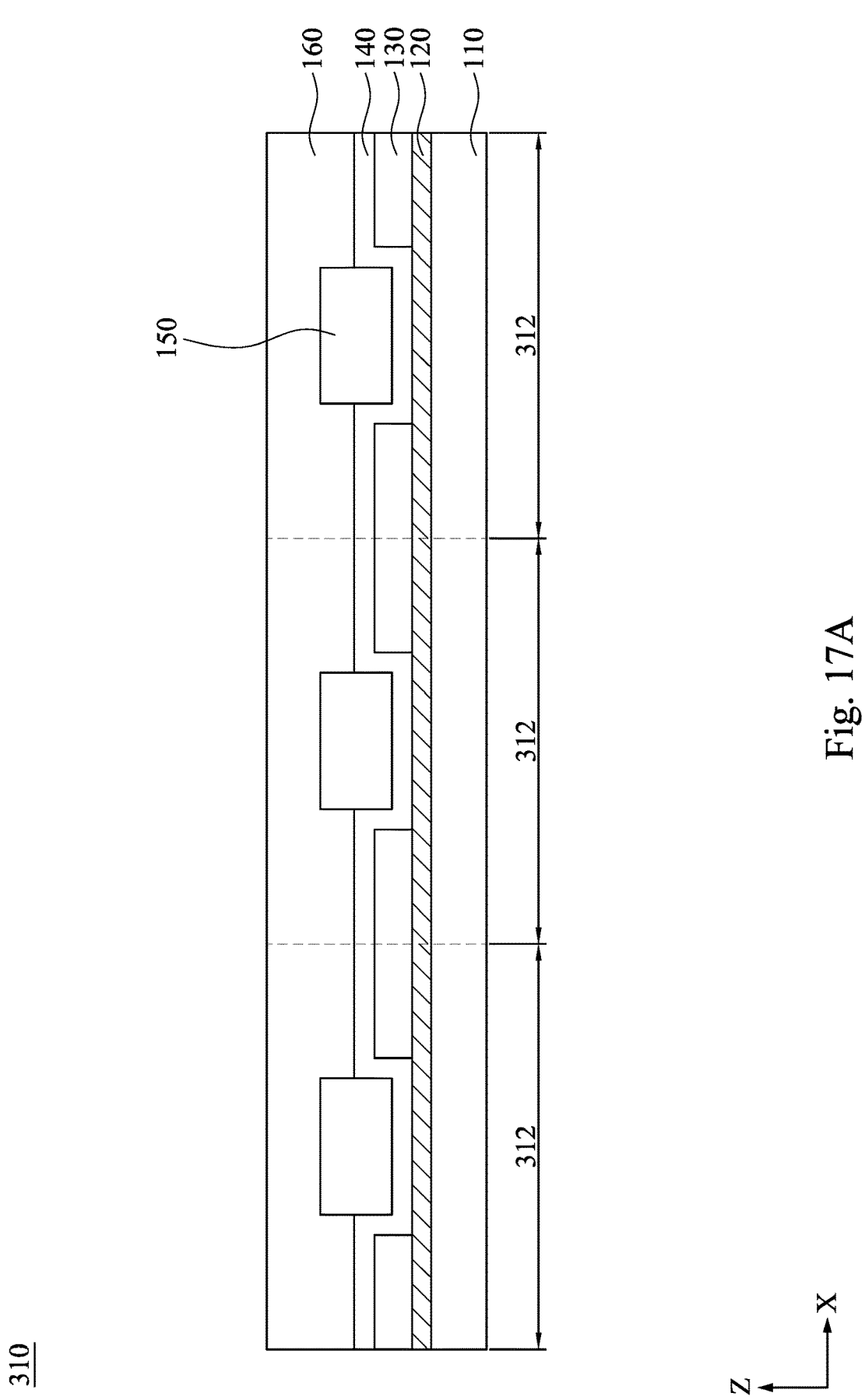
FIGS. 17A-17E illustrate cross-sectional view of a semiconductor device at various stages of the method of FIG. 16 in accordance with some embodiments of the present disclosure.

FIG. 16 is a flowchart of a method M160 for making a semiconductor device according to aspects of the present disclosure in various embodiments. Various operations of the method M160 are discussed in association with cross-section diagrams FIGS. 17A-17E. Throughout the various views and illustrative embodiments, like reference numbers are used to designate like elements. In operation S161 of method M140, a first wafer 310 is provided, as shown in FIG. 17A. The first wafer 310 includes a plurality of first dies 312 connected to each other. Each of the first dies 312 includes the structure of FIG. 2D, the structure of FIG. 4D, the structure of FIG. 6D, or the structure of FIG. 8B or 9B. That is, the operation S101 includes the operations S12 to S18 of the method M10, the operations S32 to S40 of the method M30, the operations S52 to S60 of the method M50, or the operation S84 of the method M80. In FIG. 17A, the structures of FIG. 2D are used for illustration purposes only.

Figure 17B:
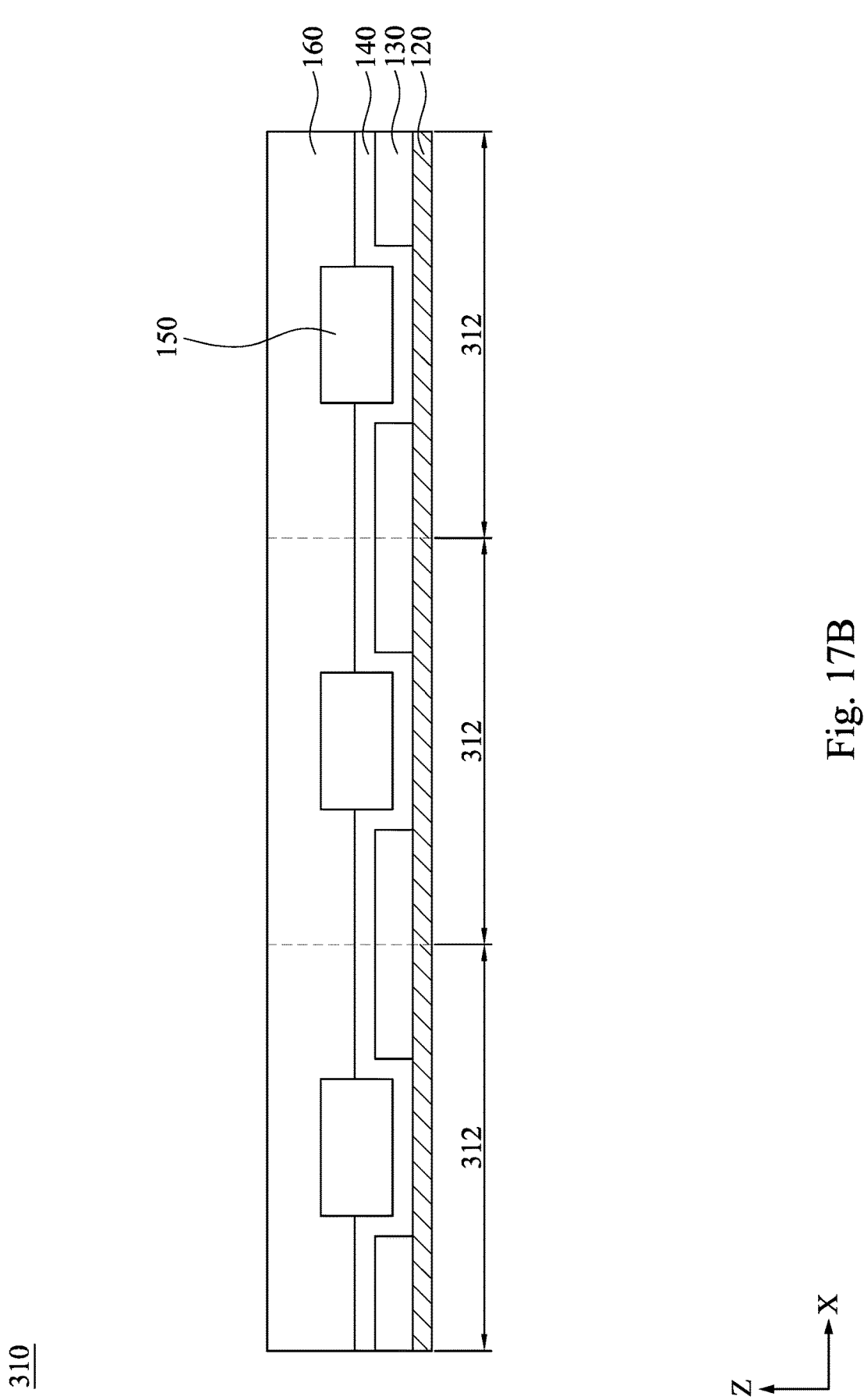

In operation S163 of method M160, the 2D insulating layer 120 of the first die 312 is removed from the carrier 110, as shown in FIG. 17B. Since the details of the removal process is mentioned above (i.e., the operations S20, S42, and S62), the detailed description is not repeated herein.

Figure 17C:
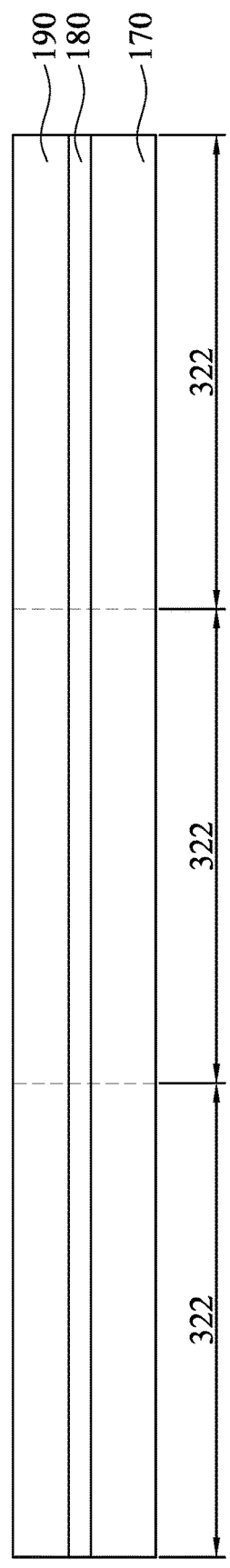

In operation S165 of method M160, a second wafer 320 is provided, as shown in FIG. 17C. The second wafer 320 includes a plurality of second dies 322 connected to each other. Each of the second dies 322 includes the structure of FIG. 2F, the structure of FIG. 4F, the structure of FIG. 6F, or the structure of FIG. 8A or 9A. That is, the operation S101 includes the operation S22 of the method M10, the operation S44 of the method M30, the operation S64 of the method M50, or the operation S82 of the method M80.

Figure 17D:
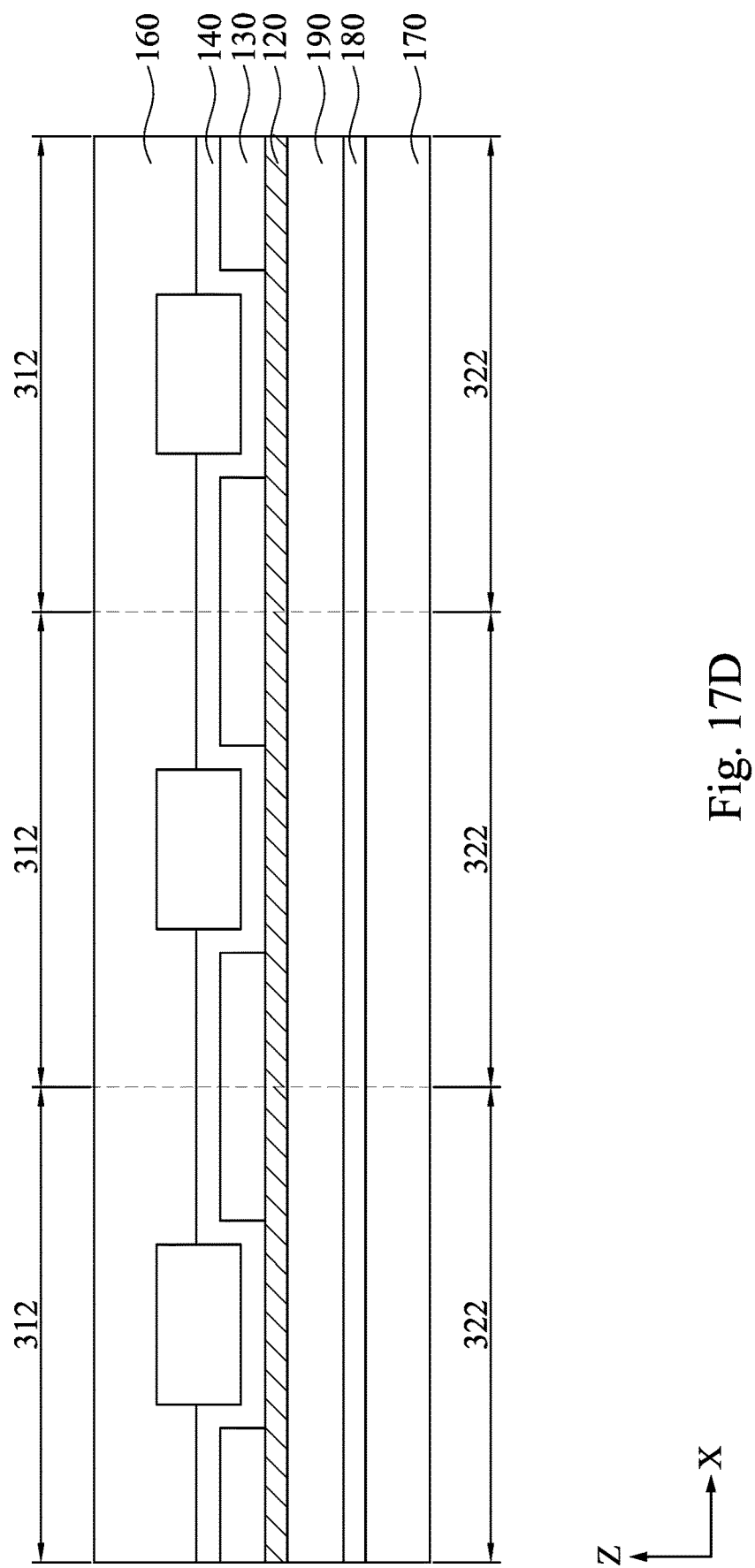

In operation S167 of method M160, the first wafer 310 is bonded to the second wafer 320, as shown in FIG. 17D. Since the details of the bonding process is mentioned above (i.e., the operations S24, S46, S66, and S86), the detailed description is not repeated herein.

Figure 17E:
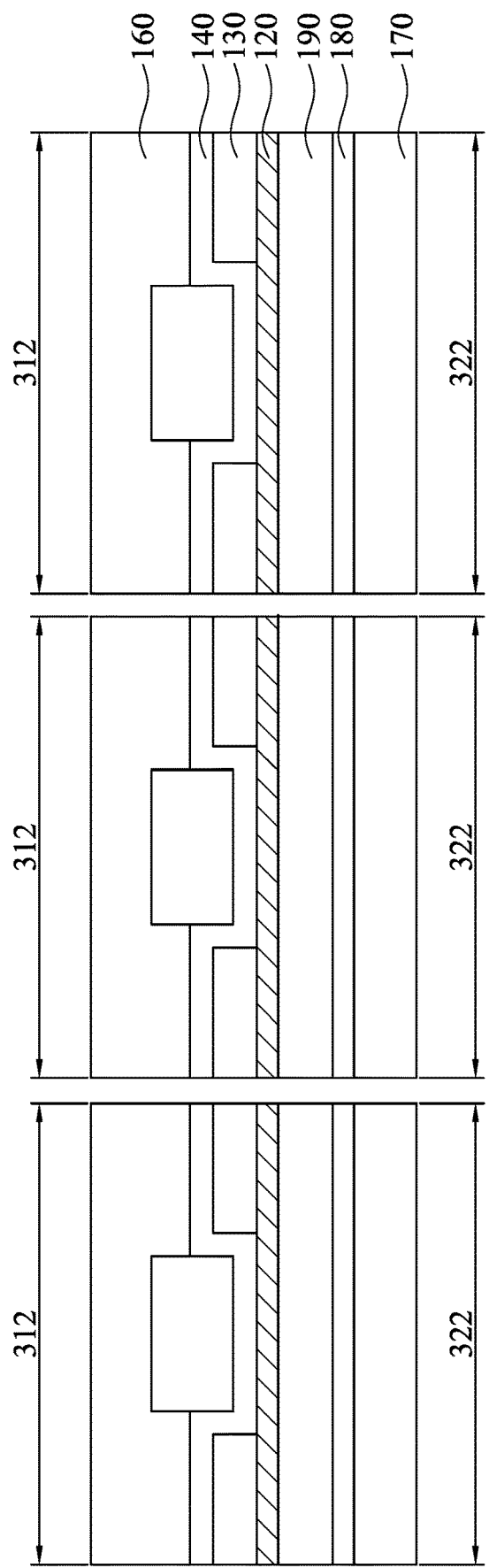

In operation S169 of method M160, the first dies 312 of the first wafer 310 and the second dies 322 of the second wafer 320 are singulated, as shown in FIG. 17E. To singulate the first and second dies 312 and 322 from adjacent first and second dies 312 and 322, tape (not shown) may be applied to the first wafer 310 or the second wafer 320. The tape may include dicing tape that supports the first wafer 310 or the second wafer 320 during the singulation process. The first wafer 310 and the second wafer 320 may be singulated using a laser cutting device, saw blade, or other suitable techniques.

Figure 18:
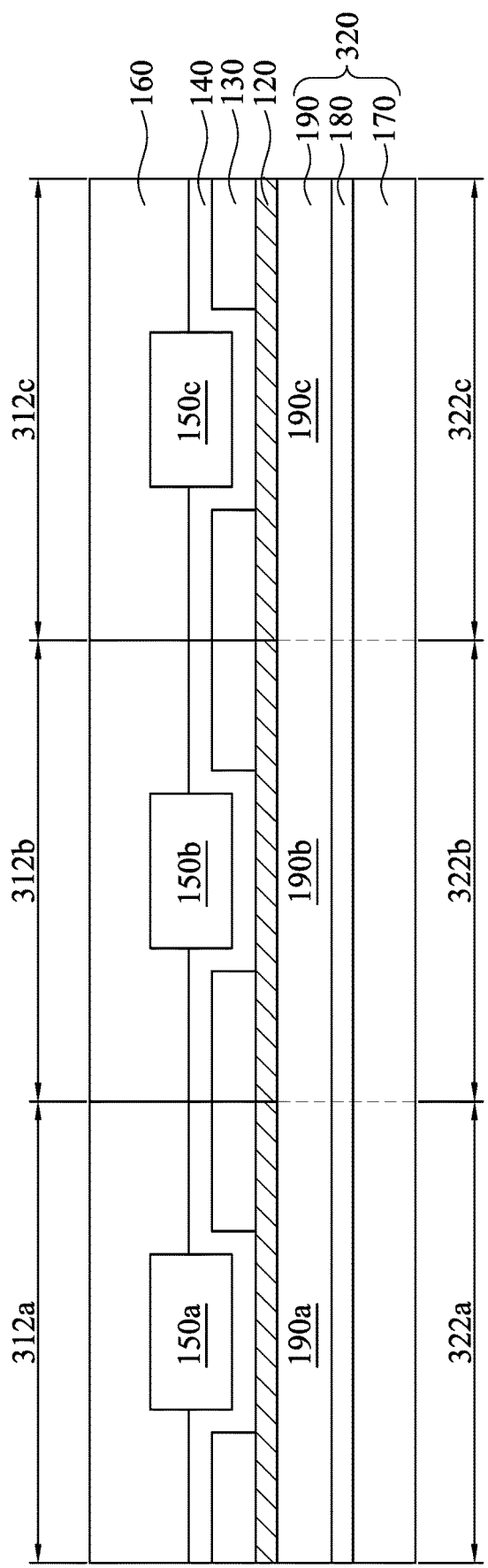
FIG. 18 is a cross-sectional view of a semiconductor structure according to some embodiments.

FIG. 18 is a cross-sectional view of a semiconductor structure according to some embodiments. In FIG. 18, first dies 312a, 312b, and 312c are bound to a second wafer 320 including second dies 322a, 322b, and 322c. Each of the first dies 312a, 312b, and 312c includes the structure of FIG. 2D, the structure of FIG. 4D, the structure of FIG. 6D, or the structure of FIG. 8B or 9B. In FIG. 18, the structures of FIG. 2D are used for illustration purposes only. Each of the second dies 322a, 322b, and 322c includes the structure of FIG. 2F, the structure of FIG. 4F, the structure of FIG. 6F, or the structure of FIG. 8A or 9A. In FIG. 18, the structures of FIG. 2F are used for illustration purposes only.

The first dies 312a, 312b, and 312c may be different. For example, the gate electrodes 150a, 150b, and 150c in the first dies 312a, 312b, and 312c may have different work functions and/or different materials. The first dies 312a, 312b, and 312c may be cut from different wafers in some embodiments. The second dies 312a, 312b, and 312c may be different. For example, the channel layers 190a, 190b, and 190c in the second dies 322a, 322b, and 322c may have different materials. The first dies 312a, 312b, and 312c may be respectively bound to the second dies 322a, 322b, and 322c according to actual requirements, and a singulation process may be performed after the first dies 312a, 312b, and 312c are bound to the second dies 312a, 312b, and 312c. With such process, the integration of the multifunctional devices is more flexible. That is, different multifunctional devices can be formed on the same wafer.

According to some embodiments, the 2D insulating layer is a bonding layer to bond a first structure to a second structure. Since the 2D insulating layer is adhered to a carrier through Van der Waals force, the delamination force of the 2D insulating layer is not so strong, and the structures formed over the 2D insulating layer is not easy to be damaged during the debonding process. Furthermore, the 2D insulating layer provide a good vertical electrical connection path, such that the two bonded structures can be electrically connected to each other through the 2D insulating layer. Moreover, the separated fabrications of the channel layer and the metal contacts improve the performance of the channel layer.

According to some embodiments, a semiconductor device includes a substrate, a channel layer, an insulating layer, source/drain contacts, a gate dielectric layer, and a gate electrode. The channel layer over the substrate and includes two dimensional (2D) material. The insulating layer is on the channel layer. The source/drain contacts are over the channel layer. The gate dielectric layer is over the insulating layer and the channel layer. The gate electrode is over the gate dielectric layer and between the source/drain contacts.

According to some embodiments, a semiconductor device includes a first device, a second device, and a bonding layer. The first device includes a first semiconductor device and a first inter-metal dielectric (IMD) structure electrically connected to the first semiconductor device. The first IMD structure includes a first top conductive line. The second device is over the first device and includes a second semiconductor device and a second IMD structure electrically connected to the second semiconductor device. The second IMD structure includes a second top conductive line aligned with the first top conductive line. The bonding layer is between the first device and the second device. The bonding layer is a 2D material layer and in contact with the first top conductive line and the second top conductive line.

According to some embodiments, a method for manufacturing a semiconductor device forming a 2D insulating layer on a carrier. A first structure is formed over the 2D insulating layer. The 2D insulating layer and the first structure are removed from the carrier. The 2D insulating layer is bonded over a second structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
a channel layer over the substrate and comprising:
a first layer comprising chalcogen atoms;
a second layer over the first layer and comprising transition metal; and
a third layer over the second layer and comprising chalcogen atoms;
a 2D insulating layer on the channel layer;
source/drain contacts over the channel layer and extending into the channel layer, wherein one of the source/drain contacts has opposite sidewalls both in direct contact with the 2D insulating layer and a top surface of the second layer of the channel layer;
a gate dielectric layer over the 2D insulating layer and the channel layer; and
a gate electrode over the gate dielectric layer and between the source/drain contacts, wherein the gate electrode is embedded in the gate dielectric layer.

2. The semiconductor device of claim 1, wherein the 2D insulating layer is hexagonal boron nitride.

3. The semiconductor device of claim 1, wherein the 2D insulating layer is separated from the second layer of the channel layer.

4. The semiconductor device of claim 1, wherein a bottom surface of the source/drain contacts is lower than a bottom surface of the 2D insulating layer.

5. The semiconductor device of claim 1, further comprising a buffer layer between the channel layer and the substrate, wherein the buffer layer is a monolayer.

6. The semiconductor device of claim 1, wherein the opposite sidewalls of said one of the source/drain contacts are further both in contact with the gate dielectric layer.

7. The semiconductor device of claim 1, wherein the gate electrode is surrounded by the gate dielectric layer on vertical sides of the gate electrode.

8. The semiconductor device of claim 1, wherein the opposite sidewalls of said one of the source/drain contacts are further both in direct contact with the third layer of the channel layer.

9. A semiconductor device comprising:
a substrate;
a channel layer over the substrate and comprising:
a first layer comprising chalcogen atoms;
a second layer over the first layer and comprising transition metal; and
a third layer over the second layer and comprising chalcogen atoms;
a two dimensional (2D) insulating layer over the channel layer;
a gate dielectric layer over the 2D insulating layer;
a gate electrode over the gate dielectric layer, wherein the gate electrode is embedded in the gate dielectric layer; and
source/drain contacts on opposite sides of the gate electrode and passing through the gate dielectric layer and the 2D insulating layer to the channel layer, wherein the source/drain contacts are in contact with the gate dielectric layer, one of the source/drain contacts has opposite sidewalls both in direct contact with the 2D insulating layer, a contact area between said one of the source/drain contacts and the second layer of the channel layer is larger than a contact area between said one of the source/drain contacts and the third layer of the channel layer, and a bottom surface of one of the source/drain contacts is in direct contact with the second layer of the channel layer.

10. The semiconductor device of claim 9, wherein the source/drain contacts are spaced apart from the first layer of the channel layer.

11. The semiconductor device of claim 9, wherein bottom surfaces of the source/drain contacts are lower than a top surface of the channel layer and higher than a bottom surface of the channel layer.

12. The semiconductor device of claim 9, wherein the 2D insulating layer comprises hexagonal boron nitride (h-BN).

13. The semiconductor device of claim 9, further comprising a buffer layer between the channel layer and the substrate, wherein the buffer layer and the 2D insulating layer have substantially the same material.

14. The semiconductor device of claim 9, wherein the contact area between said one of the source/drain contacts and the second layer of the channel layer is larger than a contact area between said one of the source/drain contacts and the 2D insulating layer.

15. The semiconductor device of claim 9, wherein the contact area between said one of the source/drain contacts and the second layer of the channel layer is larger than a contact area between said one of the source/drain contacts and the first layer of the channel layer.

16. A semiconductor device comprising:
    a channel layer comprising:
        a first two dimensional (2D) monolayer;
        a second 2D monolayer over the first 2D monolayer; and
        a third 2D monolayer over the second 2D monolayer and has an electrical conductivity lower than an electrical conductivity of the second 2D monolayer;
    a 2D insulating layer over the channel layer, wherein a thickness of the 2D insulating layer is about 3.0 angstroms to about 50 angstroms;
    source/drain contacts over and electrically connected to the channel layer, wherein one of the source/drain contacts has opposite sidewalls both in direct contact with the 2D insulating layer, and a bottom surface of said one of the source/drain contacts is in direct contact with the second 2D monolayer of the channel layer;
    a gate dielectric layer over the 2D insulating layer; and
    a gate electrode over the gate dielectric layer and between the source/drain contacts, wherein a portion of the 2D insulating layer is directly between the gate electrode and the channel layer, and the gate electrode is embedded in the gate dielectric layer.

17. The semiconductor device of claim 16, wherein an energy band gap of the 2D insulating layer is greater than about 5.5 eV.

18. The semiconductor device of claim 16, wherein the bottom surface of the said one of the source/drain contacts is higher than a position of the first 2D monolayer of the channel layer.

19. The semiconductor device of claim 16, wherein an electrical conductivity of the first 2D monolayer is lower than the electrical conductivity of the second 2D monolayer.

20. The semiconductor device of claim 16, wherein said one of the source/drain contacts is laterally surrounded by the third 2D monolayer of the channel layer.

* * * * *